US007057573B2

(12) United States Patent
Ohira

(10) Patent No.: US 7,057,573 B2
(45) Date of Patent: Jun. 6, 2006

(54) METHOD FOR CONTROLLING ARRAY ANTENNA EQUIPPED WITH A PLURALITY OF ANTENNA ELEMENTS, METHOD FOR CALCULATING SIGNAL TO NOISE RATIO OF RECEIVED SIGNAL, AND METHOD FOR ADAPTIVELY CONTROLLING RADIO RECEIVER

(75) Inventor: Takashi Ohira, Kyoto (JP)

(73) Assignee: Advanced Telecommuications Research Institute International, Kyoto (JP)

( * ) Notice: Subject to any disclaimer, the term of this patent is extended or adjusted under 35 U.S.C. 154(b) by 228 days.

(21) Appl. No.: 10/289,450

(22) Filed: Nov. 7, 2002

(65) Prior Publication Data

US 2003/0156061 A1 Aug. 21, 2003

(30) Foreign Application Priority Data

| | | |
|---|---|---|
| Nov. 7, 2001 | (JP) | P2001-341808 |
| Jan. 16, 2002 | (JP) | P2002-007413 |
| Apr. 5, 2002 | (JP) | P2002-103753 |
| Jul. 3, 2002 | (JP) | P2002-194998 |
| Aug. 19, 2002 | (JP) | P2002-238211 |

(51) Int. Cl.
*H03K 7/02* (2006.01)
*H04Q 7/20* (2006.01)

(52) U.S. Cl. ........................ 343/817; 455/522; 375/353

(58) Field of Classification Search ................. 343/817, 343/834, 836, 837; 342/368, 372, 383, 377, 342/373, 367; 455/422
See application file for complete search history.

(56) References Cited

U.S. PATENT DOCUMENTS 6,407,719 B1 6/2002 Ohira et al. ................ 343/893
6,492,942 B1 * 12/2002 Kezys ........................ 342/368
6,600,456 B1 * 7/2003 Gothard et al. ............. 343/834
6,704,557 B1 * 3/2004 Krishnamurthy et al. 455/278.1

FOREIGN PATENT DOCUMENTS

JP 2001-24431 A 1/2001

OTHER PUBLICATIONS

Takashi Ohira et al., "Electronically Steerable Passive Array Radiator Antennas for Low–Cost Analog Adaptive Beamforming", 2000 IEEE International Conference on Phased Array System & Technology pp. 101–104, Dana point, California, May 21–25, 2000.

Todd A. Summers et al., "SNR Mismatch and Online Estimation in Turbo Decoding", IEEE Transaction on Communications, vol. COM–46, No. 4, pp. 421–423, Apr., 1998.

A. Ramesh et al., "SNR Estimation in Generalized Fading Channels and its Application to Turbo Decoding" Proceeding of. IEEE ICC 2001, pp. 1094–1098, Helsinki, Jun., 2001.

Kenichi Takizawa et al., "Efficient Estimation Scheme of Channel State Information for Parallel Combinatorial SS Systems (2)", Proceeding of General National Meeting of The Institute of Electronics, Information and Communication Engineers, in Japan, A–5–6, pp. 188, Mar., 2002 (together with an English translation thereof).

(Continued)

*Primary Examiner*—James Vannucci
(74) *Attorney, Agent, or Firm*—Birch, Stewart, Kolasch, & Birch, LLP

(57) ABSTRACT

Based on a received signal y(t) received by a radiating element of an array antenna including the single radiating element and a plurality of parasitic elements, an adaptive controller calculates and sets a reactance value of a variable reactance element for directing a main beam of the array antenna in a direction of a desired wave and directing nulls in directions of interference waves so that a value of an objective function expressed by only the received signal y(t) becomes either one of the maximum and the minimum by using an iterative numerical solution of a nonlinear programming method.

26 Claims, 35 Drawing Sheets

SIMULATION FLOW OF BLIND ADAPTIVE BEAM FORMATION

OTHER PUBLICATIONS

Takashi Ohira et al., "Electronically Steerable Passive Array Radiator Antennas for Low–Cost Analog Adaptive Beamforming", 2000 IEEE International Conference on Phased Array System & Technology pp. 101–104, Dana point, California, May 21–25, 2000.

Takashi Ohira, "Pseudo In–Phase Combining and Steepest Gradient Iteration for Quick Reactance Optimization in ESPAR Antenna Beam Steering", Technical Report of the Institute of Electronics, Information and Communication Engineers, in Japan, A–P2001–48, pp. 1–6, Jul., 2001 (together with an English Abstract on the first page thereof).

Yukihiro Kamiya et al., "Performance Considerations for the ESPAR Antenna–Statistical Considerations of SINR Characteristics Based on the Random Weight Search", Technical Japan, A–P 2000–175, SANE2000–156, pp. 17–24, Jan., 2001 (together with an English Abstract on the first page thereof).

Todd A. Summers et al., "SNR Mismatch and Online Estimation in Turbo–Decoding", IEEE Transaction on Communications, vol. COM–46, No. 4, pp. 421–423, Apr., 1998.

A. Ramesh et al., "SNR Estimation in Generalized Fading Channels and its Application to turbo Decoding" Proceeding of. IEEE ICC 2001, pp. 1094–1098, Helsinki, Jun., 2001.

Kenichi Takizawa et al., "Efficient Estimation Scheme of Channel State Information for Parallel Combinatorial SS Systems (2)", Proceeding of General National Meeting of The Institute of Electronics, Information and Communication Engineers, in Japan, A–5–6, pp. 188, Mar., 2002 (together with an English translation thereof).

* cited by examiner

FIRST PREFERRED EMBODIMENT

CONTROLLER APPARATUS OF ARRAY ANTENNA

SECOND PREFERRED EMBODIMENT

SIMULATION FLOW OF BLIND ADAPTIVE BEAM FORMATION

INTERFERENCE WAVE DIRECTION 45°

$X_1$=-40Ω, $X_2$=-114Ω, $X_3$=65Ω,
$X_4$=96Ω, $X_5$=180Ω, $X_6$=-65Ω

OUTPUT S/(N+I)=11.0dB

INTERFERENCE WAVE DIRECTION 90°

$X_1$=-126Ω, $X_2$=95Ω, $X_3$=124Ω, $X_4$=72Ω, $X_5$=164Ω, $X_6$=141Ω

OUTPUT S/(N+I)=12.4dB

INTERFERENCE WAVE DIRECTION 135°

$X_1$=-94Ω, $X_2$=-27Ω, $X_3$=163Ω,
$X_4$=11Ω, $X_5$=73Ω, $X_6$=-169Ω

OUTPUT S/(N+I)=10.8dB

INTERFERENCE WAVE DIRECTION 180°

$X_1$=-143Ω, $X_2$=-70Ω, $X_3$=26Ω,
$X_4$=42Ω, $X_5$=123Ω, $X_6$=-184Ω

OUTPUT S/(N+I)=13.1dB

THIRD PREFERRED EMBODIMENT

CONTROLLER APPARATUS OF ARRAY ANTENNA

16-QAM SIGNAL CONSTELLATION ON I/Q PLANE

FOURTH PREFERRED EMBODIMENT

SIMULATION FLOW OF BLIND ADAPTIVE BEAM FORMATION

INTERFERENCE WAVE DIRECTION 45°

$x_1 = -1\Omega$, $x_2 = -93\Omega$, $x_3 = 69\Omega$,
$x_4 = -50\Omega$, $x_5 = 19\Omega$, $x_6 = -58\Omega$ GAIN RATIO OF BEAM TO NULL POINT=22.8dB

INTERFERENCE WAVE DIRECTION 90°

$x_1 = -79\Omega$, $x_2 = -33\Omega$, $x_3 = 125\Omega$,
$x_4 = 58\Omega$, $x_5 = 103\Omega$, $x_6 = -96\Omega$ GAIN RATIO OF BEAM TO NULL POINT=22.1dB

INTERFERENCE WAVE DIRECTION 135°

$x_1=-69\Omega$, $x_2=-49\Omega$, $x_3=65\Omega$,
$x_4=68\Omega$, $x_5=69\Omega$, $x_6=-61\Omega$ GAIN RATIO OF BEAM TO NULL POINT=16.6dB

INTERFERENCE WAVE DIRECTION 180°

$x_1 = -25\Omega$, $x_2 = -20\Omega$, $x_3 = 52\Omega$, $x_4 = 87\Omega$, $x_5 = 147\Omega$, $x_6 = -130\Omega$ GAIN RATIO OF BEAM TO NULL POINT=17.8dB

FIFTH PREFERRED EMBODIMENT

CONTROLLER APPARATUS OF ARRAY ANTENNA

SIXTH PREFERRED EMBODIMENT

SIMULATION FLOW OF BLIND ADAPTIVE BEAM FORMATION

INTERFERENCE WAVE DIRECTION 45°

$X_1$=−131Ω, $X_2$=231Ω, $X_3$=4Ω

$X_4$=−45Ω, $X_5$=16Ω, $X_6$=−130Ω

GAIN RATIO OF BEAM TO NULL=11.0dB

INTERFERENCE WAVE DIRECTION 90°

$X_1$=−93Ω, $X_2$=119Ω, $X_3$=79Ω

$X_4$=69Ω, $X_5$=58Ω, $X_6$=96Ω

GAIN RATIO OF BEAM TO NULL=15.7dB

INTERFERENCE WAVE DIRECTION 135°

$X_1=-82\Omega$, $X_2=-76\Omega$, $X_3=188\Omega$ $X_4=40\Omega$, $X_5=104\Omega$, $X_6=50\Omega$ GAIN RATIO OF BEAM TO NULL=18.0dB

INTERFERENCE WAVE DIRECTION 180°

$X_1=-75\Omega$, $X_2=-87\Omega$, $X_3=199\Omega$ $X_4=31\Omega$, $X_5=96\Omega$, $X_6=35\Omega$ GAIN RATIO OF BEAM TO NULL=22.3dB

EIGHTH PREFERRED EMBODIMENT

CONTROLLER APPARATUS OF ARRAY ANTENNA

NINTH PREFERRED EMBODIMENT

SIMULATION FLOW OF BLIND ADAPTIVE BEAM FORMATION

TENTH PREFERRED EMBODIMENT

CONTROLLER APPARATUS OF ARRAY ANTENNA

METHOD FOR CONTROLLING ARRAY ANTENNA EQUIPPED WITH A PLURALITY OF ANTENNA ELEMENTS, METHOD FOR CALCULATING SIGNAL TO NOISE RATIO OF RECEIVED SIGNAL, AND METHOD FOR ADAPTIVELY CONTROLLING RADIO RECEIVER

This nonprovisional application claims priority under 35 U.S.C. § 119(a) on patent application Ser. No. 2001-341808, 2002-7413, 2002-103753, 2002-194998, 2002-238211 filed in JAPAN on Nov. 7, 2001; Jan. 16, 2002; Apr. 5, 2002; Jul. 3, 2002; and Aug. 19, 2002, respectively, which is herein incorporated by reference.

BACKGROUND OF THE INVENTION

1. Field of the Invention

The present invention relates to a method for controlling an array antenna apparatus, capable of changing a directive characteristic of the array antenna apparatus including a plurality of antenna elements. In particular, the present invention relates to a method for controlling an array antenna apparatus, capable of adaptively changing a directivity characteristic of an electronically controlled radiator array antenna apparatus (Electronically Steerable Passive Array Radiator (ESPAR) Antenna; hereinafter referred to as an ESPAR antenna). Further, the present invention relates to a method for calculating a signal to noise ratio of a radio receiver for calculating the signal to noise ratio of a received signal received by the radio receiver, and also, to a method for adaptively controlling a radio receiver utilizing the method for calculating the same.

2. Description of the Prior Art

An ESPAR antenna of prior art is proposed in, for example, a first prior art document of "T. OHIRA et al., "Electronically steerable passive array radiator antennas for low-cost analog adaptive beamforming", 2000 IEEE International Conference on Phased Array System & Technology pp. 101–104, Dana point, Calif., May 21–25, 2000", and Japanese Patent Laid-Open Publication No. 2001-24431. This ESPAR antenna is provided with an array antenna including a radiating element fed with a radio signal, at least one parasitic element that is provided apart from this radiating element by a predetermined interval and is fed with no radio signal, and a variable reactance element connected to this parasitic element. Further, this ESPAR antenna can change a directivity characteristic of the array antenna by changing the reactance value of the variable reactance element.

As a method for adaptively controlling this ESPAR antenna on the reception side, the following method is generally used. That is, a learning sequence signal is preparatorily included in the head portion of each radio packet data on the transmission side, and the same signal as the learning sequence signal is generated also on the reception side. On the reception side, the reactance value of the variable reactance element is changed to change its directivity characteristic on such a criterion (estimation criterion) that a cross correlation between the received learning sequence signal and the generated learning sequence signal becomes the maximum. By this operation, the directivity of the ESPAR antenna is made to have an optimum pattern, i.e., such a pattern that a main beam is directed in the direction of a desired wave, and nulls are formed in the directions of interference waves.

As a method for adaptively controlling the above-mentioned ESPAR antenna on the reception side, it is widely performed to adaptively control an array antenna by a method of, for example, the constant modulus algorithm for performing adaptive control so that the amplitude of the received radio signal becomes constant when the transmitted radio signal is modulated by a modulation method of a constant amplitude such as frequency modulation. However, there has been such a problem that the method has not been able to be used when the transmitted radio signal is modulated by a modulation method that includes amplitude modulation.

However, the above-mentioned prior art example needs a reference signal such as a learning sequence signal, and is required to make the reference signals coincide with each other on both the transmission side and the reception side, and this leads to such a problem that the circuit for adaptive control has been complicated.

Moreover, in order to adaptively control a signal equalizer and a signal filter in the radio receiver, it is required to estimate and calculate a signal to noise power ratio. However, it has been unable to calculate the ratio in real time for the received signal.

SUMMARY OF THE INVENTION

A first object of the present invention is to solve the above-mentioned problems, and to provide a method capable of adaptively controlling the array antenna so that the main beam of the array antenna is directed in the direction of the desired wave and nulls are directed in the directions of the interference waves without requirement of any reference signal.

Also, a second object of the present invention is to solve the above-mentioned problems, and to provide a method capable of adaptively controlling an array antenna so that the main beam of the array antenna is directed in the direction of the desired wave and nulls are directed in the directions of the interference waves without requirement of any reference signal even if a transmitted radio signal is modulated by a modulation method that includes digital amplitude modulation.

Further, a third object of the present invention is to solve the above-mentioned problems, to provide a method for calculating a signal to noise ratio of a received signal, the method being capable of estimating and calculating the signal to noise ratio of the received signal, for the purpose of adaptively controlling, for example, a signal equalizer and a signal filter in the radio receiver, and to further provide a method for adaptively controlling a radio receiver utilizing the above-mentioned method for calculating the same.

According to a first aspect of the present invention, there is provided a method for controlling an array antenna, the array antenna comprising:

a radiating element for receiving a radio signal;

at least one parasitic element provided apart from the radiating element by a predetermined distance; and a variable reactance element connected to the parasitic element, thereby changing a directivity characteristic of the array antenna by changing a reactance value of the variable reactance element for operation of the variable reactance element as either one of a director and a reflector, wherein the method includes a step of calculating and setting the reactance value of the variable reactance element for directing a main beam of the array antenna in a direction of a desired wave and for directing nulls in directions of interference waves on the basis of a received signal received by the radiating element so that a value of an objective function expressed by only the received signal becomes either one of the maximum and the minimum by using an iterative numerical solution of a nonlinear programming method.

According to a second aspect of the present invention, there is provided a method for controlling an array antenna, the array antenna comprising a plurality of P antenna elements aligned at predetermined intervals, the array antenna shifting phases of a plurality of P received signals received by the array antenna by predetermined quantities of phase shift using respective P phase shift means, respectively, combining phase-shifted received signals, and outputting combined received signal, wherein the method includes a step of calculating and setting quantities of phase shift of the phase shift means for directing a main beam of the array antenna in a direction of a desired wave and for directing nulls in directions of interference waves on the basis of the combined received signal so that a value of an objective function expressed by only the received signal becomes either one of the maximum and the minimum by using an iterative numerical solution of a nonlinear programming method.

According to a third aspect of the present invention, there is provided a method for controlling an array antenna, the array antenna comprising:

a radiating element for receiving a transmitted radio signal as a received signal;

at least one parasitic element provided apart from the radiating element by a predetermined distance; and a variable reactance element connected to the parasitic element, thereby changing a directivity characteristic of the array antenna by changing a reactance value of the variable reactance element for operation of the variable reactance element as either one of a director and a reflector, wherein the transmitted radio signal is modulated by a modulation method including digital amplitude modulation, wherein a power ratio R is defined by a quotient obtained by dividing a larger power value of power values at two mutually different signal points of the radio signal by a smaller power value thereof, wherein the radio signal has predetermined discrete power ratios $R_1, R_2, \ldots, R_{max}$ at a plurality of signal points of the digital amplitude modulation, and wherein the method includes the following steps of:

calculating the power ratio R for the power values at respective two signal points of mutually different combinations of the received signal for a predetermined time interval on the basis of the received signal received by the radiating element;

calculating as an objective function value, a minimum value of the absolute values of the values obtained by subtracting the discrete power ratios $R_1, R_2, \ldots, R_{max}$ from respective calculated power ratios R, respectively; and calculating and setting a reactance value of the variable reactance element for directing a main beam of the array antenna in a direction of a desired wave and for directing nulls in directions of interference waves so that the objective function value becomes substantially either one of the minimum and the maximum.

According to a fourth aspect of the present invention, there is provided a method for controlling an array antenna for receiving a transmitted radio signal, the array antenna comprising a plurality of P antenna elements aligned at predetermined intervals, the array antenna shifting phases of a plurality of P received signals received by the array antenna by predetermined quantities of phase shift using respective P phase shift means, respectively, combining phase-shifted received signals, and outputting combined received signal, wherein the transmitted radio signal is modulated by a modulation method including digital amplitude modulation, wherein a power ratio R is defined by a quotient obtained by dividing a larger power value of power values at two mutually different signal points of the radio signal by a smaller power value thereof, wherein the radio signal has predetermined discrete power ratios $R_1, R_2, \ldots, R_{max}$ at a plurality of signal points of the digital amplitude modulation, and wherein the method includes the following steps of:

calculating the power ratio R for the power values at respective two signal points of mutually different combinations of the received signal for a predetermined time interval on the basis of the received signal received by the array antenna;

calculating as an objective function value, a minimum value of the absolute values of the values obtained by subtracting the discrete power ratios $R_1, R_2, \ldots, R_{max}$ from respective calculated power ratios R, respectively; and calculating and setting quantities of phase shift of the phase shift means for directing a main beam of the array antenna in a direction of a desired wave and for directing nulls in directions of interference waves so that the objective function value becomes substantially either one of the minimum and the maximum.

According to a fifth aspect of the present invention, there is provided a method for controlling an array antenna, the array antenna comprising:

a radiating element for receiving a transmitted radio signal;

at least one parasitic element provided apart from the radiating element by a predetermined distance; and a variable reactance element connected to the parasitic element, thereby changing a directivity characteristic of the array antenna by changing a reactance value of the variable reactance element for operation of the variable reactance element as either one of a director and a reflector, wherein the transmitted radio signal is modulated by an m-PSK modulation (where m is an integer equal to or larger than two); and wherein the method includes a step of calculating and setting the reactance value of the variable reactance element for directing a main beam of the array antenna in a direction of a desired wave and for directing nulls in directions of interference waves on the basis of a received signal received by the radiating element so that a value of a criterion function expressed by an m-th power of the received signal becomes either one of the maximum and the minimum by using an iterative numerical solution of a nonlinear programming method.

According to a sixth aspect of the present invention, there is provided a method for controlling an array antenna comprising a plurality of P antenna elements aligned at predetermined intervals, the array antenna shifting phases of a plurality of P received signals received by the array antenna by predetermined quantities of phase shift using respective P phase shift means, respectively, combining phase-shifted received signals, and outputting combined received signal, wherein the transmitted radio signal is modulated by an m-PSK modulation (where m is an integer equal to or larger than two); and wherein the method includes a step of calculating and setting the quantities of phase shift of the respective P phase shift means for directing a main beam of the array antenna in a direction of a desired wave and for directing nulls in directions of interference waves on the basis of a received signal received by the array antenna so that a value of a criterion function expressed by an m-th power of the received signal becomes either one of the maximum and the minimum by using an iterative numerical solution of a nonlinear programming method.

According to a seventh aspect of the present invention, there is provided a method for calculating a signal to noise ratio of a received signal received by a radio receiver, the radio receiver receiving as a received signal, a radio signal modulated by m-PSK modulation (where m is an integer equal to or larger than two), wherein the method includes the following steps of:

calculating a value of a criterion function obtained by dividing a square value of an absolute value of a mean value of an m-th power value of the received signal for a predetermined time interval by a mean value of the square value of the absolute value of the m-th power value of the received signal; and calculating a signal to noise ratio of the received signal by using an equation, that expresses a relationship between the criterion function and the signal to noise ratio thereof, on the basis of the calculated value of the criterion function.

According to an eighth aspect of the present invention, there is provided a method for adaptively controlling a radio receiver for receiving as a received signal, a radio signal modulated by m-PSK modulation (where m is an integer equal to or larger than two), the radio receiver comprising a signal processing means for processing the received signal, wherein the method includes the following steps of:

calculating a value of a criterion function obtained by dividing a square value of an absolute value of a mean value of an m-th power value of the received signal for a predetermined time interval by a mean value of the square value of the absolute value of the m-th power value of the received signal;

calculating a signal to noise ratio of the received signal by using an equation that expresses a relationship between the criterion function and the signal to noise ratio thereof on the basis of the calculated value of the criterion function; and adaptively controlling the signal processing means so that the calculated signal to noise ratio becomes substantially the maximum.

According to a ninth aspect of the present invention, there is provided a method for controlling an array antenna, the array antenna comprising:

a radiating element for receiving a transmitted radio signal as a received signal;

at least one parasitic element provided apart from the radiating element by a predetermined distance; and a variable reactance element connected to the parasitic element, thereby changing a directivity characteristic of the array antenna by changing a reactance value of the variable reactance element for operation of the variable reactance element as either one of a director and a reflector, wherein the transmitted radio signal is modulated by a m-PSK modulation (where m is an integer equal to or larger than two), wherein the method includes a step of calculating and setting a reactance value of a variable reactance element for directing a main beam of the array antenna in a direction of a desired wave and for directing nulls in directions of interference waves on the basis of a received signal received by the radiating element so that a value of a criterion function, which is a function obtained by dividing a (1/m)-th power value of an absolute value of a mean value of an m-th power value of the received signal for a predetermined time interval, by a (1/2)-th power value of the mean value of the absolute value of a square value of the received signal, becomes substantially the maximum, by using an iterative numerical solution of a nonlinear programming method.

According to a tenth aspect of the present invention, there is provided a method for controlling an array antenna comprising a plurality of P antenna elements aligned at predetermined intervals, the array antenna shifting phases of a plurality of P received signals received by the array antenna by predetermined quantities of phase shift using respective P phase shift means, respectively, combining phase-shifted received signals, and outputting combined received signal, wherein the transmitted radio signal is modulated by an m-PSK modulation (where m is an integer equal to or larger than two); and wherein the method includes a step of calculating and setting the quantities of phase shift of the phase shift means for directing a main beam of the array antenna in a direction of a desired wave and for directing nulls in directions of interference waves on the basis of the combined received signal so that a value of a criterion function, which is a function obtained by dividing a (1/m)-th power value of an absolute value of a mean value of an m-th power value of the received signal for a predetermined time interval by a (1/2)-th power value of the mean value of the absolute value of a square value of the received signal, becomes substantially the maximum by using an iterative numerical solution of a nonlinear programming method.

According to an eleventh aspect of the present invention, there is provided a method for calculating a signal to noise ratio of a received signal received by a radio receiver, the radio receiver receiving as a received signal, a radio signal modulated by m-PSK modulation (where m is an integer equal to or larger than two), wherein the method includes the following steps of:

calculating a value of a criterion function, which is a function obtained by dividing a (1/m)-th power value of an absolute value of a mean value of an m-th power value of the received signal for a predetermined time interval by a (1/2)-th power value of the mean value of the absolute value of a square value of the received signal; and calculating the signal to noise ratio of the received signal by using an equation, that expresses a relationship between the criterion function and the signal to noise ratio thereof, on the basis of the calculated value of the criterion function.

According to a twelfth aspect of the present invention, there is provided a method for adaptively controlling a radio receiver for receiving as a received signal, a radio signal modulated by m-PSK modulation (where m is an integer equal to or larger than two), the radio receiver comprising a signal processing means for processing the received signal, wherein the method includes the following steps of:

calculating a value of a criterion function, which is a function obtained by dividing a (1/m)-th power value of an absolute value of a mean value of an m-th power value of the received signal for a predetermined time interval by a (1/2)-th power value of the mean value of the absolute value of a square value of the received signal;

calculating the signal to noise ratio of the received signal by using an equation, that expresses a relationship between the criterion function and the signal to noise ratio, on the basis of the calculated value of the criterion function; and adaptively controlling the signal processing means so that the calculated signal to noise ratio becomes substantially the maximum.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
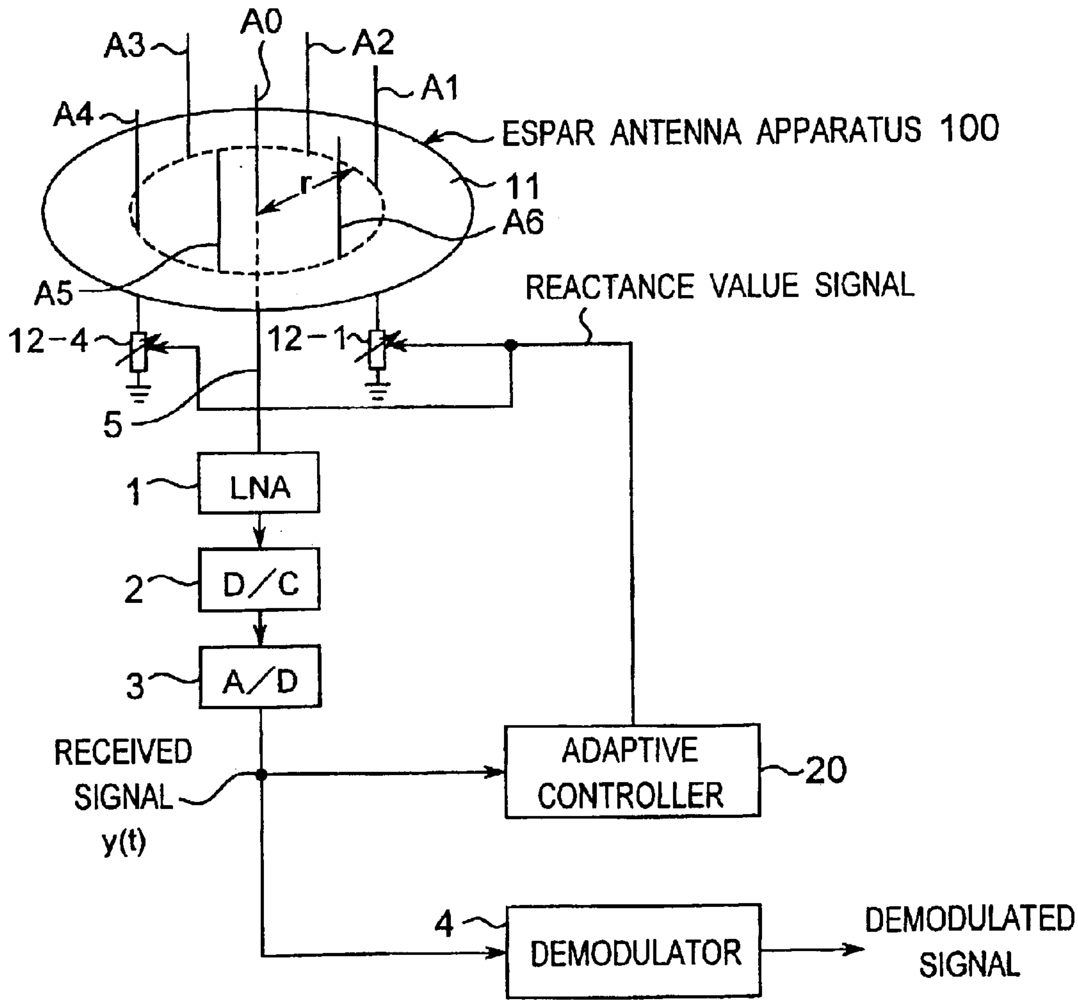
FIG. 1 is a block diagram showing a construction of a controller apparatus of an array antenna according to a first preferred embodiment of the present invention.

Preferred embodiments of the present invention will be described below with reference to the drawings. It is to be noted that same, similar or like components are denoted by the same reference numerals in the drawings.

First Preferred Embodiment

FIG. 1 is a block diagram showing a construction of a controller apparatus of an array antenna according to a first preferred embodiment of the present invention. As shown in FIG. 1, the controller apparatus of the array antenna of the present preferred embodiment is constructed of an ESPAR antenna apparatus 100 provided with one radiating element A0 and six parasitic elements A1 to A6 and an adaptive controller 20.

In this case, the adaptive controller 20 is constructed of a digital calculator of, for example, a computer and is characterized in that the reactance values of variable reactance elements 12-1 to 12-6 for directing the main beam of the ESPAR antenna apparatus 100 in the direction of the desired wave and for directing nulls in the directions of interference waves are calculated and set on the basis of a received signal y(t) received by the radiating element A0 of the ESPAR antenna apparatus 100 so that the value of an objective function (the Equation (12) described later) expressed by only the received signal y(t) becomes the maximum by using, for example, the steepest gradient method, which is an iterative numerical solution of the nonlinear programming method. As described in detail later, a received signal modulated by a modulation system of a constant amplitude or a received signal during a time interval of non-modulation in the case of a modulation system in which the amplitude changes is used as the received signal for adaptive control.

Referring to FIG. 1, the ESPAR antenna apparatus 100 is constructed of the radiating element A0 and the parasitic elements A1 to A6 provided on a grounding conductor 11. The radiating element A0 is arranged so as to be surrounded by the six parasitic elements A1 to A6 provided on the circumference of a circle of a radius r. Preferably, the parasitic elements A1 to A6 are provided apart at predetermined intervals on the circumference of the circle of the radius r. The radiating element A0 and the parasitic elements A1 to A6 are constructed so as to have a length of about, for example, λ/4 (note that λ is the wavelength of the desired wave), and the radius r is constructed so as to be λ/4. The radiating element A0 has a feeding point connected via a coaxial cable 5 to a low-noise amplifier (LNA) 1, and the parasitic elements A1 to A6 are connected to the variable reactance elements 12-1 to 12-6, respectively. The reactance values of these variable reactance elements 12-1 to 12-6 are set according to a reactance value signal from the adaptive controller 20.

Figure 2:
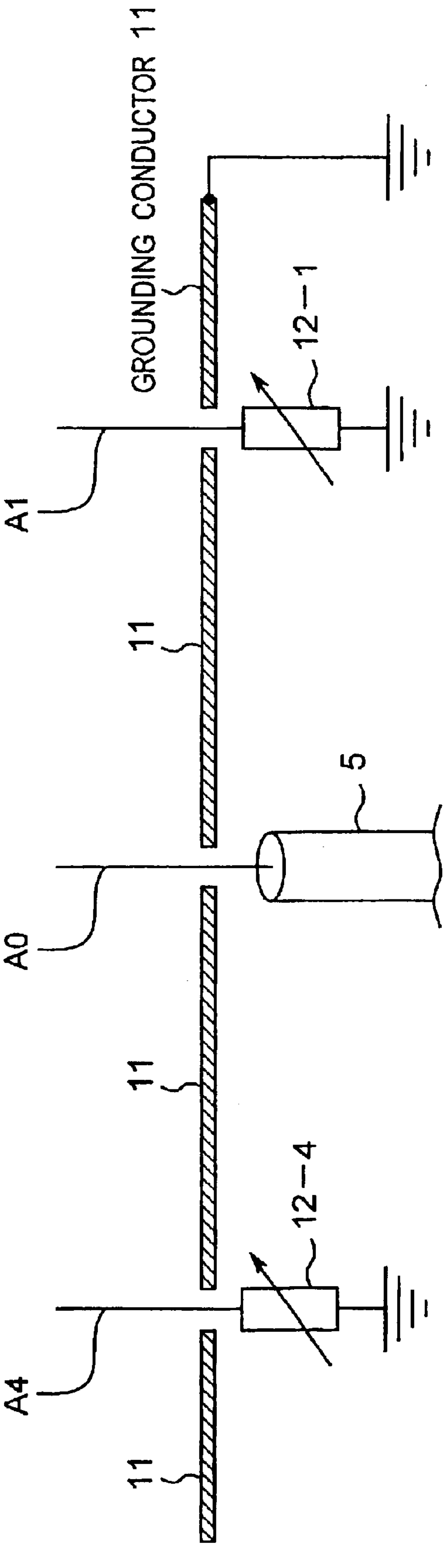
FIG. 2 is a sectional view showing a detailed construction of an ESPAR antenna apparatus 100 of FIG. 1.

FIG. 2 is a longitudinal sectional view of the ESPAR antenna apparatus 100. The radiating element A0 is electrically insulated from the grounding conductor 11, while the parasitic elements A1 to A6 are grounded in high frequency to the grounding conductor 11 via the variable reactance elements 12-1 to 12-6. The operation of the variable reactance elements 12-1 to 12-6 will be now explained. When the radiating element A0 and the parasitic elements A1 to A6 have, for example, substantially the same length in the lengthwise direction. If, for example, the variable reactance element 12-1 has an inductance property (L property), then the variable reactance element 12-1 becomes an extension coil, and the parasitic elements A1 to A6 have an electrical length longer than that of the radiating element A0 to operate as a reflector. Further, if, for example, the variable reactance element 12-1 has a capacitance property (C property), then the variable reactance element 12-1 becomes a contraction capacitor, and the parasitic element A1 has an electrical length shorter than that of the radiating element A0 to operate as a director. The parasitic elements A2 to A6 connected to the other variable reactance elements 12-2 to 12-6 operate similarly.

Accordingly, in the ESPAR antenna apparatus 100 of FIG. 1, the planar directivity characteristic of the ESPAR antenna apparatus 100 can be changed by changing the reactance values of the variable reactance elements 12-1 to 12-6 connected to the parasitic elements A1 to A6.

In the controller apparatus of the array antenna of FIG. 1, the radiating element A0 of the ESPAR antenna apparatus 100 receives a radio signal, and the received signal is inputted via the coaxial cable 5 to the low-noise amplifier (LNA) 1 and amplified. Next, a down converter (D/C) 2 down-coverts the amplified signal into a predetermined intermediate-frequency signal (IF signal). Further, an A/D converter 3 converts the down-converted analog signal into a digital signal, and then, the digital signal is outputted to the adaptive controller 20 and a demodulator 4. Next, the adaptive controller 20 calculates a reactance value $x_k$ (k=1, 2, . . . , 6) of the variable reactance elements 12-1 to 12-6 for directing the main beam of the ESPAR antenna apparatus 100 in the direction of the desired wave and for directing nulls in the directions of the interference waves on the basis of the received signal y(t) received by the radiating element A0 of the ESPAR antenna apparatus 100 so that the value of the objective function (the Equation (12)) expressed by only the received signal y(t) becomes the maximum by, for example, the steepest gradient method and outputs a reactance value signal that is the reactance value to the variable reactance elements 12-1 to 12-6, then this leads to setting the reactance value $x_k$. On the other hand, the demodulator 4 executes demodulation processing of the inputted received signal y(t) and outputs the demodulated signal that is data signal.

Next, the ESPAR antenna apparatus 100 is formulated. For this formulation model, a half-wavelength dipole antenna is used as the radiating element A0, and six dipole antennas arranged in a circular array are used as the parasitic elements A1 to A6. The element intervals are all λ/4, and each dipole is provided by a conductor column of a radius of λ/100. The wavelength contraction ratio in the lengthwise direction of the element is set to 0.926. The parasitic elements A1 to A6 are loaded serially with varactor diodes, which are the variable reactance elements 12-1 to 12-6 located at the center, and the directivity thereof is determined by a combination of their reactance values.

The interconnection between elements is obtained by using an electromagnetic analysis by the moment method from the structural parameters of the antenna, and this is expressed by an impedance matrix Z according to the following Equation (See, for example, a second prior art document of "Takashi OHIRA, "Pseudo In-Phase Combining and Steepest Gradient Iteration for Quick Reactance Optimization in ESPAR Antenna Beam Steering", Technical Report of The Institute of Electronics, Information and Communication Engineers in Japan, A-P2001-48, pp.1–6, July, 2001").

$$Z = \begin{bmatrix} z_{00} & z_{01} & z_{01} & z_{01} & z_{01} & z_{01} & z_{01} \\ z_{01} & z_{11} & z_{12} & z_{13} & z_{14} & z_{13} & z_{12} \\ z_{01} & z_{12} & z_{11} & z_{12} & z_{13} & z_{14} & z_{13} \\ z_{01} & z_{13} & z_{12} & z_{11} & z_{12} & z_{13} & z_{14} \\ z_{01} & z_{14} & z_{13} & z_{12} & z_{11} & z_{12} & z_{13} \\ z_{01} & z_{13} & z_{14} & z_{13} & z_{12} & z_{11} & z_{12} \\ z_{01} & z_{12} & z_{13} & z_{14} & z_{13} & z_{12} & z_{11} \end{bmatrix}. \quad (1)$$

Since the structure of the ESPAR antenna apparatus 100 has a cyclic symmetry, there are six independent elements among the 49 elements of this matrix Z. These are the complex parameters to be called as follows in terms of the physical meaning thereof.

TABLE 1

| |
|---|
| $Z_{00}$: Self-input impedance of radiating element |
| $Z_{01}$: Mutual impedance between radiating element and parasitic element |
| $Z_{11}$: Self-input impedance of parasitic element |
| $Z_{12}$: Mutual impedance between mutually adjacent two parasitic elements |
| $Z_{13}$: Mutual impedance between two parasitic elements located next adjacent (adjacent to each other but one) |
| $Z_{14}$: Mutual impedance between mutually opposed two parasitic elements |

The impedance values used in the implemental examples described later are as follows.

(a) $z_{00}$=+52.0–5.7j (b) $z_{01}$=+23.9–29.2j (c) $z_{11}$=+64.0–3.4j (d) $z_{21}$=+29.7–29.8j (e) $z_{31}$=–13.9–27.6j (f) $z_{41}$=–26.0–16.7j

In this case, the impedance values are all expressed in a unit of Ω. Assuming that the reactance values of the variable reactance elements 12-1 to 12-6, which are varactor diodes, are $x_1, x_2, \ldots, x_6$, then the directivity (array factor) $D_a(\theta, \phi)$ of the ESPAR antenna apparatus 100 is expressed by the following Equation (See, for example, the second prior art document).

$$D_a(\theta, \phi)=a(\theta, \phi)^T i(x_1, x_2, \ldots, x_6) \quad (2),$$

where $a(\theta, \phi)$ is a steering vector when the phase center of the ESPAR antenna apparatus 100 is in the radiating element A0 at the center, and the vector is expressed by the following equation as a function of the angle of elevation θ and the azimuth φ.

$$a(\theta, \phi) = \begin{bmatrix} 1 \\ \exp\{j\beta d\cos\theta\cos\phi\} \\ \exp\left\{j\beta d\cos\theta\cos\left(\phi - \frac{1}{3}\pi\right)\right\} \\ \cdots \\ \exp\left\{j\beta d\cos\theta\cos\left(\phi - \frac{5}{3}\pi\right)\right\} \end{bmatrix}, \quad (3)$$

where d is an element interval equal to the radius r, and β is a propagation constant in a free space. Moreover, $i(x_1, x_2, \ldots, x_6)$ is an equivalent weight vector of the ESPAR antenna and expressed by the following equation:

$$i(x_1, x_2, \ldots, x_6)=Z^{-1}(v_s u_0 - Xi)=v_S(Z+X)^{-1}u_0 \quad (4),$$

where $u_0$ is a unit vector expressed by the following equation:

$$u_0=[1, 0, \ldots, 0]^T \quad (5).$$

Moreover, X is a reactance matrix, which is a diagonal matrix having the input impedance $z_s$ of an RF receiver and the reactance values of the variable reactance elements 12-1 to 12-6 as components, according to the following equation:

$$X=\mathrm{diag}[z_s, jx_1, jx_2, \ldots, jx_6] \quad (6).$$

If a plurality of signal waves come, then there is defined a vector having their signal waveforms as components, and the vector is expressed by the following equation:

$$s(t)=[s_1(t), s_2(t), \ldots, s_m(t)] \quad (7),$$

where m is the number of signals. When they are received at the same time, the output signal of the ESPAR antenna apparatus 100 is expressed by the following equation:

$$y(t)=i(x_1, x_2, \ldots, x_6)^T A(\theta, \Phi)S(t)+n(t) \quad (8).$$

In this equation, A(θ, Φ) is an array manifold expressed by the following equation:

$$A(\Theta,\Phi)=[a(\theta_1, \phi_1), a(\theta_2, \phi_2), \ldots, a(\theta_m, \phi_m)] \quad (9),$$

where $$\Theta=\{\theta_1, \theta_2, \ldots, \theta_m\} \quad (10),$$

$$\Phi=\{\phi_1, \phi_2, \ldots, \phi_m\} \quad (11), \text{and}$$

n(t) is an additive noise.

The "blind adaptive beam formation" used in the present preferred embodiment will be described next. The purpose of adaptive beam formation is to maximize a power ratio SINR of the signal-to-interference noise included in an antenna received output signal y(t) derived by the Equation (8). The blind control is to update the antenna variable parameter (generally a weight vector, which is the reactance values of the variable reactance elements 12-1 to 12-6 in this case) without reference to the signal information included in the desired wave.

The blind control according to the present preferred embodiment utilizes the phenomenon that the amplitude of the transmitted signal becomes a constant value at the sampling point. Among the modulation systems currently used in numbers of radio systems, the transmitted signal has a constant amplitude for time elapse in the case of the analog radio system of frequency modulation FM and the digital radio systems of frequency shift keying (FSK) and phase shift keying (PSK). In the case of a modulation system in which the envelope is not constant, such as multi-valued quadrature amplitude modulation (QAM), similar operation can be performed by providing an unmodulated header interval in the header portion of a transmission packet. Since an interference signal is superimposed on the transmitted signal on the reception side, the amplitude thereof becomes not constant. Accordingly, the antenna directivity is controlled on the criterion that the fluctuation in the amplitude of the received signal becomes the minimum. By this operation, the antenna directivity becomes an optimum beam pattern, i.e., a beam pattern that nulls are formed in the directions of the interference waves. This method corresponds to CMA (Constant Modulus Algorithm) in the DBF (Digital Beam Forming) antenna control. With regard to the received signal expressed by y(t), the conventional CMA has been based on the criterion that the envelope $|y(t)|$ is made to asymptotically approach a certain target value C, i.e., "$E||y(t)|-C|\rightarrow\min\rightarrow 0$". In this case, $E|x|$ represents the ensemble mean of the absolute value of the variable. This criterion cannot be applied to the control of the ESPAR antenna. The above is because the ESPAR antenna has a simple structure and therefore provided with no function for adjusting the absolute amplitude by itself. Accordingly, in the present preferred embodiment, the following equation is used as a criterion in place of this.

$$J=m_1^2/m_2\rightarrow\max\rightarrow 1 \quad (12).$$

That is, adaptive control is performed so that the objective function J expressed by the Equation (12) is maximized to one. In this case, $m_1$ and $m_2$ are the primary and secondary moments, respectively, expressed by the following equation for a predetermined time interval when the received signal sampled in accordance with the timing $t_s$ is regarded as a statistical variable.

$$m_1=E|y(t_s)| \quad (13), \text{ and}$$

$$m_2=E|y(t_s)|^2 \quad (14).$$

In these equations, $E|y(t_s)|$ is, in concrete, the time ensemble mean value (time ensemble average value) in the above-mentioned predetermined time interval. This objective function J of the criterion does not include any target value C and is expressed by only the received signal. In this case, it is such a great advantage that the target value can be controlled in an unknown state. By repetitively updating the reactance value on the basis of this criterion by using, for example, an iterative numerical solution of the nonlinear programming method such as the steepest gradient method, an optimum beam is formed so that the signal-to-interference noise power ratio (SINR) of the antenna output is maximized, i.e., the main beam of the ESPAR antenna apparatus 100 is directed in the direction of the desired wave and nulls are directed in the directions of the interference waves.

The adaptive control of the antenna beam using the steepest gradient method will be described next. A recurrence formula with respect to the set (reactance vector) x of the reactance values of the variable reactance elements 12-1 to 12-6 when the steepest gradient method is used is expressed by the following equations:

$$x(n+1)=X(n)+\mu\nabla Jn, \text{ and} \quad (15)$$

$$\nabla Jn=\frac{\partial Jn}{\partial x}\begin{bmatrix}\frac{\partial Jn}{\partial x_1}\\ \frac{\partial Jn}{\partial x_2}\\ \vdots\\ \frac{\partial Jn}{\partial x_6}\end{bmatrix}, \quad (16)$$

where n is the number of orders of update of x, and the parameter μ is the step size determined by trial and error. In this case, the steepest gradient method is the concept of a method that includes the steepest descent method. The present preferred embodiment utilizes a method for obtaining the optimum solution so that the value of the objective function is maximized.

The concrete procedure for obtaining the optimum solution by the steepest gradient method will be further described. In order to find a satisfactory reactance vector x such that the objective function Jn is increased as far as possible by the steepest gradient method using the Equation (15), the following procedure is used.

(i) First of all, an iterative count parameter n (i.e., n-th iteration) is set to one, and the processing is started by a predetermined initial value x(1) of reactance vector (e.g., reactance vector when the ESPAR antenna apparatus 100 is set as an omni-antenna).

(ii) Next, a gradient vector ∇Jn of the objective function Jn at an iterative count parameter n (i.e., n-th iteration) is calculated by using this initial value (when n=1) or the current estimation value (when n≧2).

(iii) By changing the initial value or the current estimation value in the same direction as the direction of the gradient vector ∇Jn, the next estimation value of the reactance vector x is calculated.

(iv) The iterative count parameter n is incremented by one, and the control flow returns to step (ii) to repeat the processing. This repetitive processing is executed up to the iterative count that the reactance vector x substantially converges.

Figure 3:
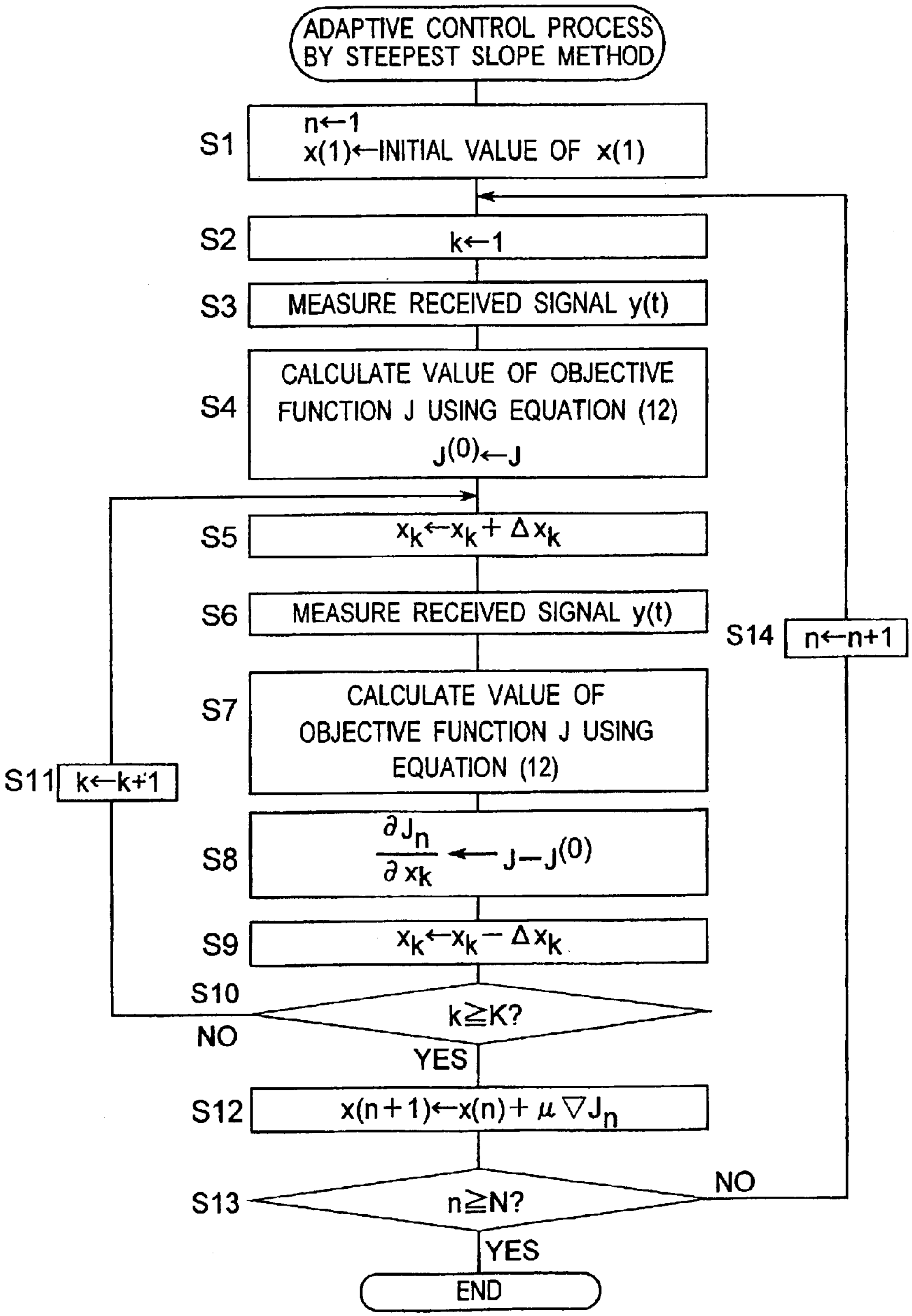
FIG. 3 is a flowchart showing an adaptive control processing executed by an adaptive controller 20 of FIG. 1 according to a steepest gradient method.

FIG. 3 is a flowchart showing more concrete adaptive control processing by the steepest gradient method executed by the adaptive controller 20 of FIG. 1.

In step S1 of FIG. 3, the iterative count parameter n is, first of all, reset to one, and the initial value is set and inserted in the reactance vector x(1). In step S2, an element parameter k is reset to one. Next, the received signal y(t) is measured in step S3, and the value of the objective function J is calculated by using the Equation (12) and set and inserted in $J^{(0)}$ in step S4. Further, in step S5, a predetermined perturbation value Δxk is added to the reactance value $x_k$, and the sum value is set as the reactance value $x_k$. Thereafter, the received signal y(t) is measured in step S6, and the value of the objective function J is calculated by using the Equation (12) in step S7. Then, in step S8, a value of $J-J^{(0)}$ is calculated and substituted into ∂Jn/∂xk. In step S9, the predetermined perturbation value Δxk is subtracted from the reactance value $x_k$, and the subtraction value is set as the reactance value $x_k$, for the recovery of the value before the perturbation. Thereafter, in step S10, the element parameter k is determined whether it is not smaller than K (=6). If the answer is NO in step S10, then the element parameter k is incremented by one in step S11, and the control flow returns to step S5 to repeat the above-mentioned processing. If the answer is YES in step S10, then the next estimation value x(n+1) of the reactance vector x is calculated by using the recurrence formula of the Equation (15) in step S12. Thereafter, it is determined whether or not the iterative count parameter n has reached a predetermined iterative count N in step S13. If the answer is NO, then the iterative count parameter n is incremented by one in step S14, and thereafter, the processing from step S2 is repeated. If the answer is YES in step S13, it is determined that sufficient convergence is achieved, and a reactance value signal that has the calculated value of the reactance vector x is outputted to and set in the variable reactance elements 12-1 to 12-6.

As described above, according to the present preferred embodiment, the adaptive controller 20 calculates and sets the reactance values of the variable reactance elements 12-1 to 12-6 for directing the main beam of the ESPAR antenna apparatus 100 in the direction of the desired wave and for directing nulls in the directions of the interference waves on the basis of the received signal y(t) received by the radiating element A0 of the ESPAR antenna apparatus 100 so that the value of the objective function (the Equation (12)) expressed by only the received signal y(t) becomes the maximum by using, for example, the steepest gradient method, which is the repetitive numerical solution of the nonlinear programming method. Therefore, the directivity of the array antenna can be adaptively controlled so that the main beam is directed in the direction of the desired wave and nulls are directed in the directions of the interference waves without requirement of any reference signal. In this case, since no reference signal is needed, the construction of the same controller apparatus can be simplified. Moreover, since the objective function J is expressed by only the received signal y(t), the calculation processing of the adaptive controller 20 can be executed very simply.

In the above-mentioned preferred embodiment, the six parasitic elements A1 to A6 are employed. However, with at least one parasitic element, the directivity characteristic of the array antenna apparatus can be electronically controlled. Instead of the above, it is acceptable to provide more than six parasitic elements. Moreover, the arrangement configuration of the parasitic elements A1 to A6 is not limited to that of the above-mentioned preferred embodiment, and the elements are only required to be located apart from the radiating element A0 by a predetermined distance. That is, the distance to the parasitic elements A1 to A6 is not required to be any constant.

In the above-mentioned preferred embodiment, the reactance value of each variable reactance element 12 is calculated by the steepest gradient method. However, the present invention is not limited to this, and it is acceptable to use an iterative numerical solution of the nonlinear programming method such as a sequential random method, a random method and a higher dimensional dichotomy method which are described hereinbelow.

The following procedure is used according to the sequential random method.

(i) First of all, the iterative count parameter n (i.e., n-th iteration) is set to one, and the processing is started by the predetermined initial value x(1) of the reactance vector (e.g., the reactance vector when the ESPAR antenna apparatus 100 is set as an omni-antenna).

(ii) Next, by using this initial value (when n=1) or the current estimation value (when $n \geqq 2$), a value to be added to the estimation value at an iterative count parameter n (i.e., n-th iteration) is calculated with a random number generated within a predetermined range of existence.

(iii) By adding the calculated addition value to the estimation value, the next estimation value of the reactance vector is calculated.

(iv) The iterative count parameter n is incremented by one, and the control flow returns to step (ii) to repeat the processing. This repetitive processing is executed until the value of the objective function J becomes greater than a predetermined threshold value (e.g., 0.9).

The following procedure is used according to the random method.

(i) First of all, processing is started by a predetermined initial value x(1) of the reactance vector (e.g., reactance vector when the ESPAR antenna apparatus 100 is set as an omni-antenna).

(ii) Next, a value to be added to the initial value is calculated by using this initial value with a random number generated within a predetermined range of existence.

(iii) By adding the calculated addition value to the initial value, the estimation value of the reactance vector is calculated.

(iv) If the value of the objective function J of the calculated estimation value is not smaller than a predetermined threshold value (e.g., 0.9), then the estimation value is used as the reactance vector to be set. If the answer is NO, the control flow returns to step (ii) to repeat the processing.

The following procedure is used according to the higher dimensional dichotomy method.

(i) First of all, processing is started by setting the iterative count parameter n (i.e., n-th iteration) to one.

(ii) Next, the predetermined range of existence of each reactance value of the reactance vector (the range of existence of the previously selected estimation value for the second and subsequent times) is evenly divided into two ranges, and then, the mean values of the bisected ranges of existence (two mean values for each of the variable reactance elements 12-1 to 12-6) are calculated.

(iii) The values of the objective function J for these two mean values are calculated, and the greater value of the objective function J is used as the next estimation value of the reactance vector.

(iv) The iterative count parameter n is incremented by one, and the control flow returns to step (ii) to repeat the processing. This repetitive processing is executed until the value of the objective function J becomes greater than the predetermined threshold value (e.g., 0.9).

In the above-mentioned preferred embodiment, the objective function J is used as the objective function for obtaining the reactance value for the adaptive control, and the optimum solution of the reactance vector is calculated so that the function becomes the maximum. However, the present invention is not limited to this, and it is acceptable to use the reciprocal of the objective function J as an objective function for obtaining the reactance value for the adaptive control and calculate the optimum solution of the reactance vector so that the function becomes the minimum.

Second Preferred Embodiment

Figure 4:
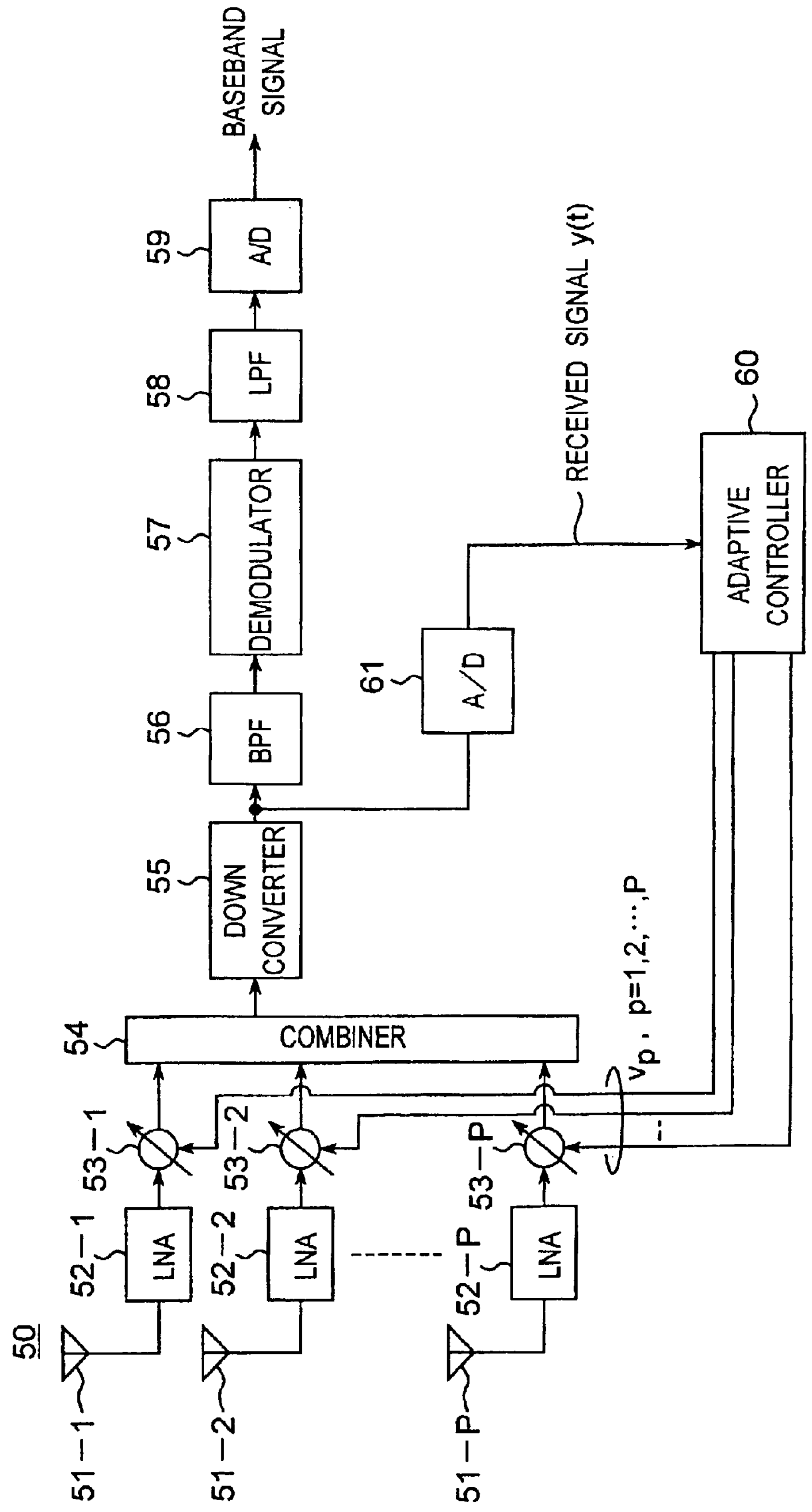
FIG. 4 is a block diagram showing a construction of a controller apparatus of an array antenna according to a second preferred embodiment of the present invention.

FIG. 4 is a block diagram showing a construction of a controller apparatus of an array antenna according to a second preferred embodiment of the present invention.

The present preferred embodiment adopts a construction for combining signals received by antenna elements 51-1 to 51-P of an array antenna 50 by an RF-band BFN (Beam Forming Network) circuit constructed of variable phase shifters 53-1 to 53-P and a combiner 54 that is an adder. The controller apparatus of this array antenna is characterized in that it is an adaptive controller apparatus for controlling the beam of the array antenna 50 where the plurality of P antenna elements 51-1 to 51-P are arranged at predetermined intervals (e.g., a linear array, which may be arranged in a two-dimensional or three-dimensional configuration), and it is provided with an adaptive controller 60. In this case, the adaptive controller 60 is characterized in that a phase shift control voltage $v_p$ (p=1, 2, . . . , P) corresponding to the quantity of phase shift of the variable phase shifters 53-1 to 53-P for directing the main beam of the array antenna 50 in the direction of the desired wave and for directing nulls in the directions of the interference waves are calculated and set on the basis of the received signal after being combined so that the value of the objective function (the Equation (12)) expressed by only the received signal y(t) becomes the maximum by using, for example, the steepest gradient method, which is an iterative numerical solution of the nonlinear programming method.

The construction of the controller apparatus of the array antenna shown in FIG. 4 will be described below. Referring to FIG. 4, a radio signal is received by the array antenna 50 where the plurality of P antenna elements 51-1 to 51-P are arranged at predetermined intervals, and the radio signals received by the antenna elements 51-1 to 51-P are inputted to the variable phase shifters 53-1 to 53-P via low-noise amplifiers (LPAs) 52-1 to 52-P, respectively. Each of the variable phase shifters 53-1 to 53-P shifts the phase of the inputted radio signal by an quantity of phase shift corresponding to the phase shift control voltage $v_p$ (p=1, 2, . . . , P) outputted from the adaptive controller 60, and thereafter, outputs the resulting radio signal to the combiner 54. The combiner 54 combines in power the inputted P radio signals, and then, outputs the combined radio signal to a demodulator 57 via a down converter 55 for converting the frequency of the signal into a predetermined intermediate-frequency signal (IF signal) and a band-pass filter (BPF) 56 for band-pass-filtering only the intermediate-frequency signal band components. The demodulator 57 demodulates the inputted radio signal into a baseband signal by a demodulation method corresponding to the modulation method (e.g., QPSK, PSK, FSK or the like) on the transmitter side, and then, outputs the resulting signal to an A/D converter 9 via a low-pass filter (LPF) 58 for extracting only the desired baseband signal. The A/D converter 59 converts the inputted analog baseband signal into a digital baseband signal in an analog-to-digital conversion manner, and then, outputs the baseband signal obtained after the conversion to an external unit. On the other hand, the intermediate-frequency signal outputted from the down converter 55 is inputted as a received signal y(t) to the adaptive controller 60 via an A/D converter 61. In this case, this received signal y(t) has a signal level proportional to the power level of the radio signal combined in the combiner 54.

The adaptive controller 60 calculates the phase shift control voltage $v_p$ (p=1, 2, . . . , P) corresponding to the quantity of phase shift of the variable phase shifters 53-1 to 53-P for directing the main beam of the array antenna 50 in the direction of the desired wave and for directing nulls in the directions of the interference waves on the basis of the received signal y(t) so that the value of the objective function (the Equation (12)) expressed by only the received signal y(t) becomes the maximum by executing the same processing as that of the adaptive control processing of FIG. 3 by using, for example, the steepest gradient method, which is an iterative numerical solution of the nonlinear programming method, and applies the voltage to the variable phase shifters 53-1 to 53-P, then this leads to setting the corresponding quantity of phase shift.

Also, the present preferred embodiment utilizes the received signal modulated by the modulation system in which the amplitude is constant or the received signal for a time interval of non-modulation in the case of the modulation system in which the amplitude changes as the received signal used for the adaptive control in a manner similar to that of the first preferred embodiment.

Also, the adaptive controller 60 of the present preferred embodiment can adaptively control the directivity of the array antenna so that the main beam is directed in the direction of the desired wave and nulls are directed in the directions of the interference waves without requirement of any reference signal in a manner similar to that of the first preferred embodiment. In this case, since no reference signal is needed, the construction of the same controller apparatus can be simplified. Moreover, since the objective function J is expressed by only the received signal y(t), the calculation processing of the adaptive controller 60 can be executed very simply.

In the above-mentioned preferred embodiment, the phase shift control voltage $v_p$ corresponding to the quantity of phase shift of the variable phase shifters 53-1 to 53-P is calculated by using the steepest gradient method. However, the present invention is not limited to this, and it is acceptable to use an iterative numerical solution of the nonlinear programming method such as a sequential random method, a random method and a higher dimensional dichotomy method described hereinabove. Moreover, it is acceptable to use the reciprocal of the objective function J.

Implemental Example of First Preferred Embodiment

Figure 5:
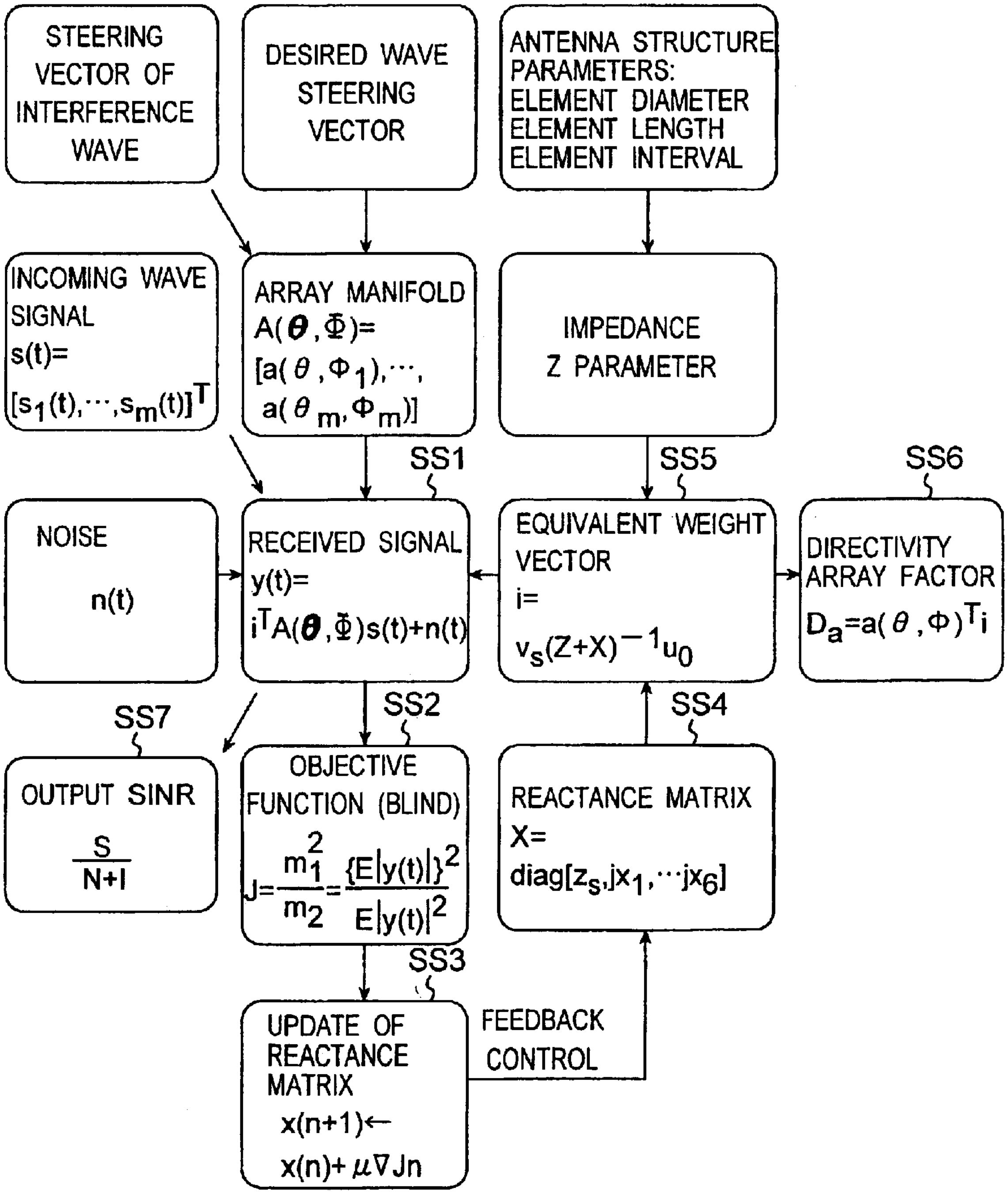
FIG. 5 is a diagram showing a simulation flow of blind adaptive beam formation executed by the ESPAR antenna apparatus 100 of FIG. 1.
Figure 6:
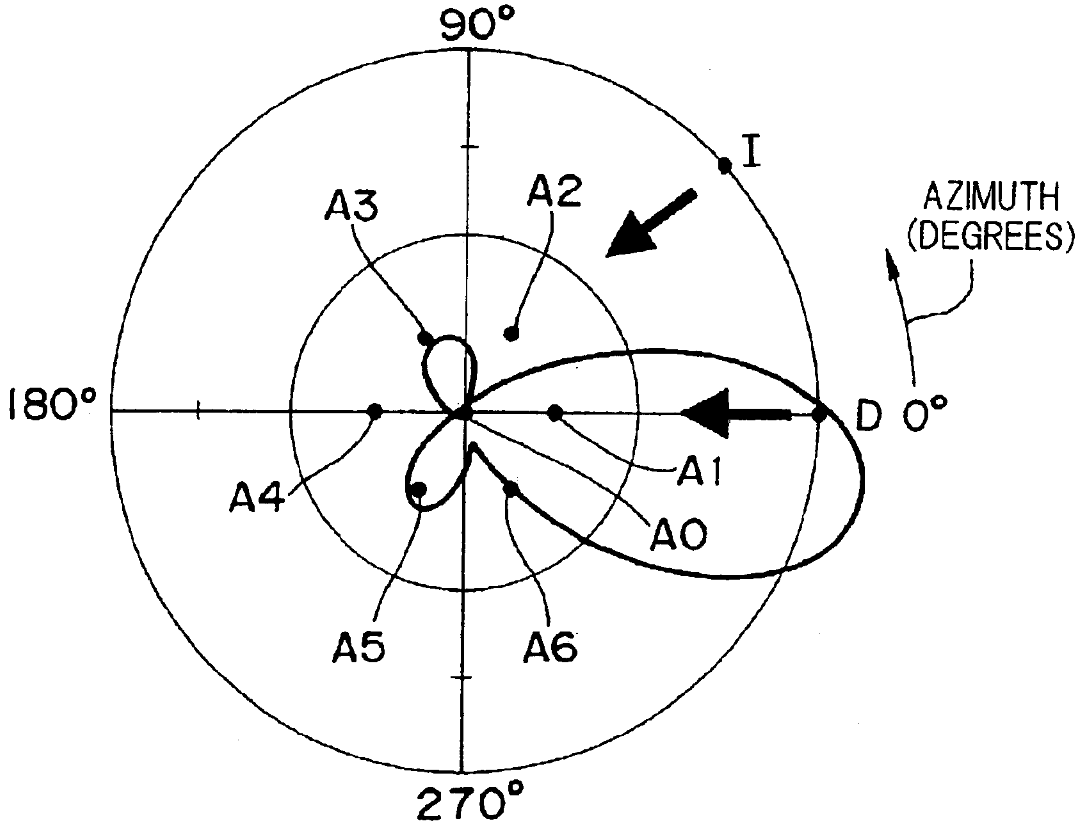
FIG. 6 is a directivity characteristic chart showing a radiation power pattern when an interference wave is directed in a direction of an angle of 45 degrees according to simulation results of FIG. 5.
Figure 7:
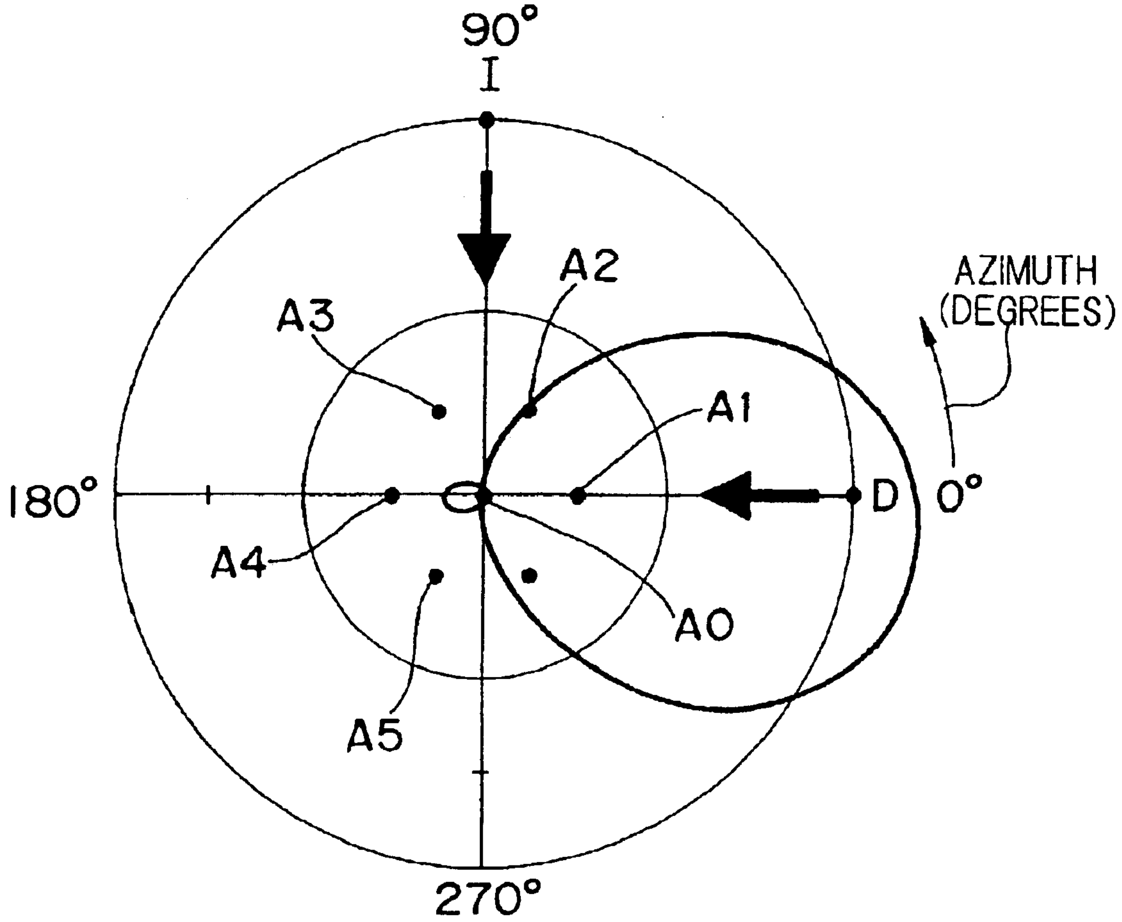
FIG. 7 is a directivity characteristic chart showing a radiation power pattern when the interference wave is directed in a direction of an angle of 90 degrees according to the simulation results of FIG. 5.
Figure 8:
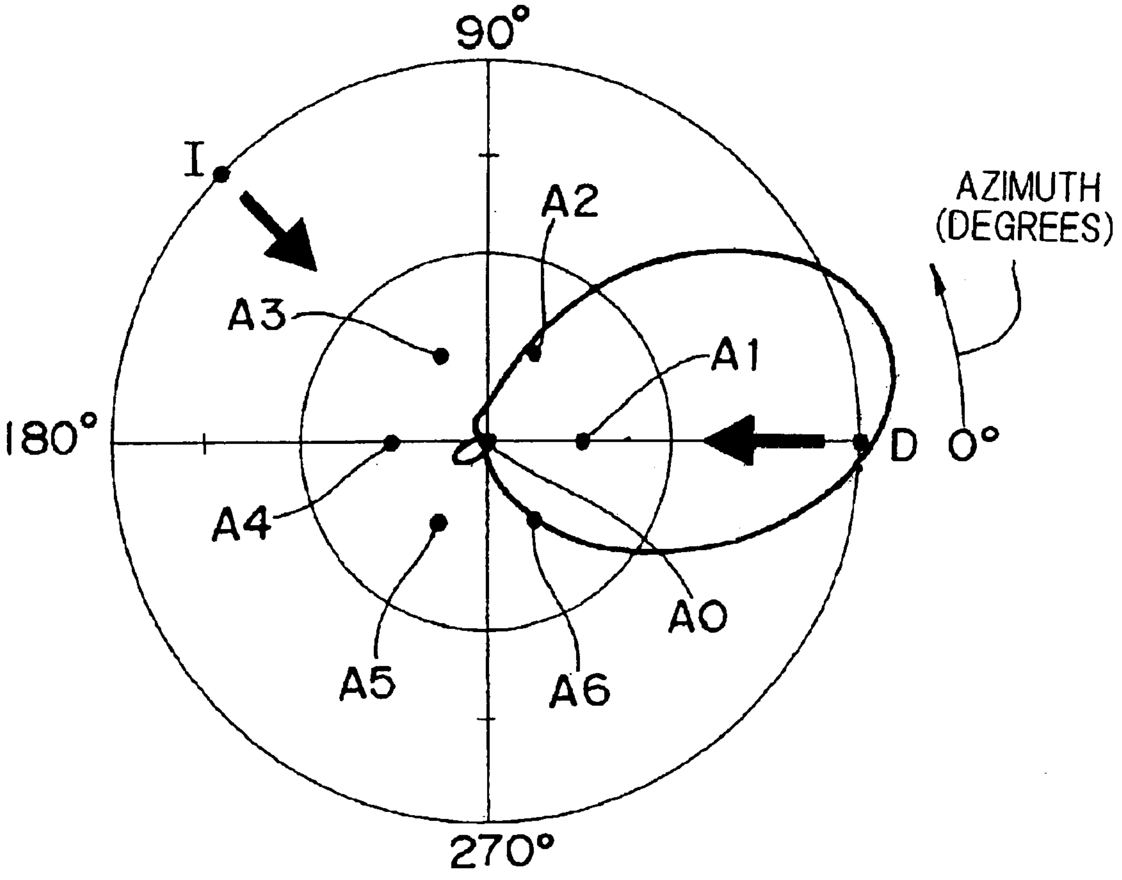
FIG. 8 is a directivity characteristic chart showing a radiation power pattern when the interference wave is directed in a direction of an angle of 135 degrees according to the simulation results of FIG. 5.
Figure 9:
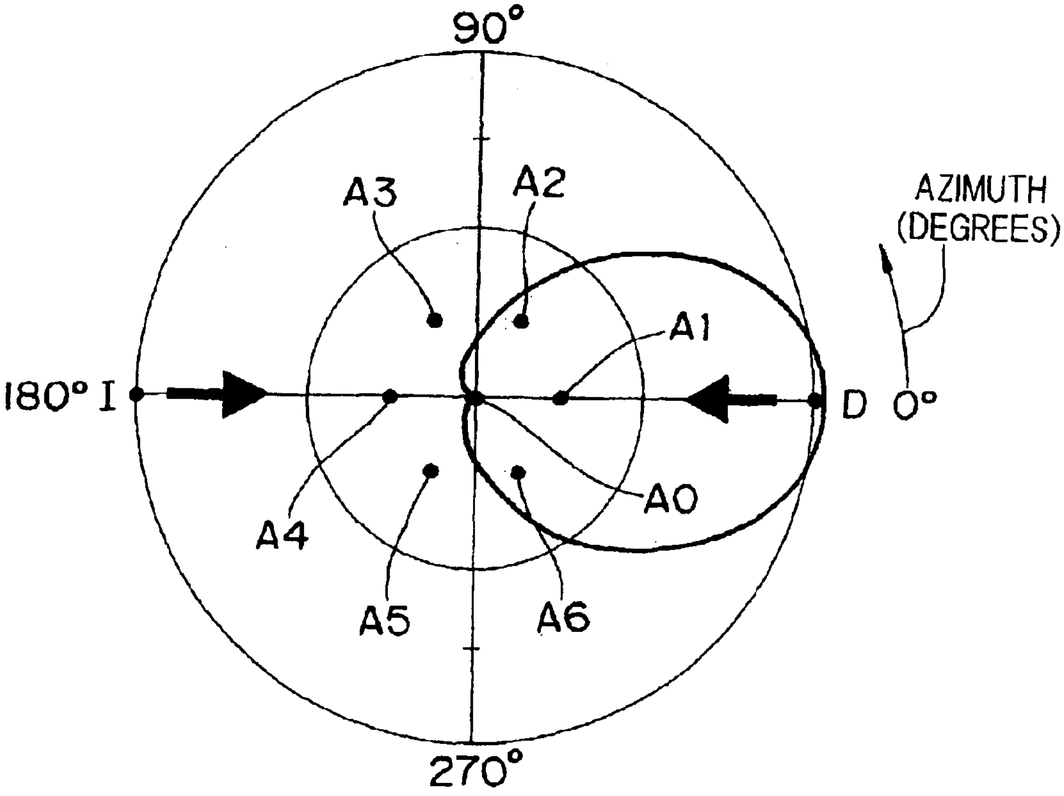
FIG. 9 is a directivity characteristic chart showing a radiation power pattern when the interference wave is directed in a direction of an angle of 180 degrees according to the simulation results of FIG. 5.

FIG. 5 is a diagram showing a simulation flow of a blind adaptive beam formation executed by the ESPAR antenna apparatus 100 of FIG. 1. In a manner similar to that of the above-mentioned formulation model, this simulation utilizes a half-wavelength dipole antenna as the radiating element A0, and utilizes six dipole antennas arranged in a circular array as the parasitic elements A1 to A6. Moreover, it is assumed that the directions in which the desired wave and the interference wave arrive at the ESPAR antenna apparatus 100 are unknown (adaptive control) and no training signal is used (blind processing). It is assumed that the desired wave and the interference wave are QPSK-modulated signals, and the noise is an additive Gaussian noise. It is assumed that these desired wave, interference wave and the noise all have the same power and no cross correlation on each other. For the sake of simplicity, the band-limiting filter, delay diffusion or widening, angular diffusion or widening, fading, Doppler effect and synchronization errors in the transmission path are all ignored. Under these conditions, the reactance values $x_k$ of the six variable reactance elements 12-1 to 12-6 are controlled on the criterion expressed by the Equation (12). The variable range is as follows.

$$-200 < x_k < +200\ \Omega (k=1, 2, \ldots, 6) \quad (17)$$

It is herein assumed that the RF receiver connected to ESPAR antenna apparatus 100 has an input impedance $z_s$=50 Ω.

In the simulation flow of FIG. 5, the adaptive control of the antenna beam is performed by executing the processing of steps SS1 to SS5 on the basis of the steering vector of the interference wave, the steering vector of the desired wave, the parameters of the antenna structure, the incoming wave signal and the noise, and then, finally the directivity array factor and an output SINR are calculated and outputted (in steps SS6 and SS7). The processing in these steps SS1 to SS7 calculates the objective function J on the basis of the received signal y(t), calculates a reactance matrix by updating the reactance matrix, and thereafter, calculates an equivalent weight vector. Then, the directivity array factor is calculated from the equivalent weight vector, while the output SINR is calculated from the received signal y(t) and the noise n(t).

This simulation is performed in an environment in which the interference wave also comes at the same time in addition to the desired wave. It is assumed that both the desired wave and the interference wave have an incoming power level being ten times that of the thermal noise level of the receiver, i.e., there is a ratio of signal:interference:noise=S:I:N=10:10:1. FIGS. 6 to 9 show reactance control results and the directivity patterns (power patterns) when the arrival direction of the desired wave is fixed at an angle of zero degree and the arrival direction of the interference wave is assumed to be set to angles of 45 degrees, 90 degrees, 135 degrees and 180 degrees, respectively. In these figures, the symbols D and I on the circumference indicate the arrival bearings of the desired wave and the interference wave, respectively. From the four patterns of FIGS. 6 to 9, it can be understood that the main beam is formed almost in the arrival direction of the desired wave and deep null points are concurrently formed in the directions of the interference waves.

Third Preferred Embodiment

Figure 10:
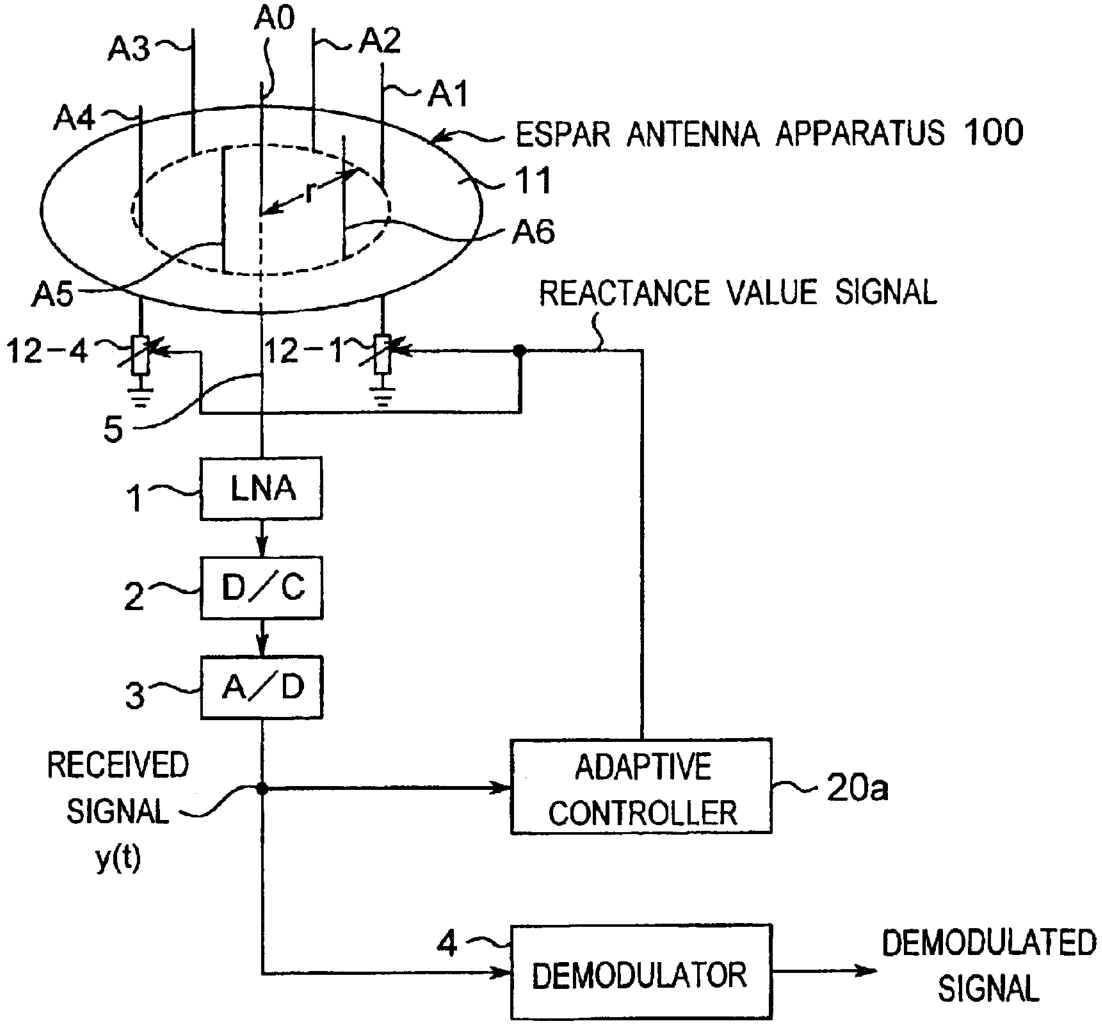
FIG. 10 is a block diagram showing a construction of an controller apparatus of an array antenna according to a third preferred embodiment of the present invention.

FIG. 10 is a block diagram showing a construction of a controller apparatus of an array antenna according to a third preferred embodiment of the present invention. As shown in FIG. 10, the controller apparatus of the array antenna of the present preferred embodiment is constructed of an ESPAR antenna apparatus 100 provided with one radiating element A0 and six parasitic elements A1 to A6 and an adaptive controller 20*a* and is particularly characterized in that the adaptive controller 20*a* is provided in place of the adaptive controller 20 of the first preferred embodiment.

In this case, as a radio signal which is transmitted from the transmission side and used for the adaptive control on the reception side, as described in detail later, there is used, for example, a radio signal modulated by the modulation method that includes digital amplitude modulation such as multi-valued quadrature amplitude modulation (QAM: Quadrature Amplitude Modulation) such as 16QAM, 64QAM and 256QAM and ASK (Amplitude Shift Keying). Therefore, since the radio signal is modulated by the digital amplitude modulation, the amplitude changes discretely at each sampled signal point. The present preferred embodiment is based on the criterion that the amplitude value of the received signal is observed by sampling in a time series and an objective function is defined paying attention to the phenomenon that the squares (instantaneous power values) of the sampled values come to have a simple integral ratio series, and the objective function is minimized. This concretely takes advantage of the phenomenon that, when a quotient value obtained by dividing the larger power value by the smaller power value out of the power values of mutually different two signal points of the radio signal is assumed to be a power ratio R, then the radio signal has predetermined discrete power ratios $R_1, R_2, \ldots, R_{max}$ at a plurality of signal points of the digital amplitude modulation.

In the present preferred embodiment, the adaptive controller 20*a* is constructed of, for example, a digital calculator such as a computer and operates as follows. On the basis of the received signal y(t) received by the radiating element A0 of the ESPAR antenna apparatus 100, the power ratio R is calculated for the power values of two signal points of mutually different combinations of the received signal during a predetermined time interval of, for example, a time interval of one frame, and the time mean value or the ensemble mean value of the minimum value of the absolute values of the values obtained by subtracting the discrete power ratios $R_1, R_2, \ldots, R_{max}$ from the respective calculated power ratios R is calculated as an objective function. The reactance values of the variable reactance elements 12-1 to 12-6 for directing the main beam of the ESPAR antenna apparatus 100 in the direction of the desired wave and for directing nulls in the directions of the interference waves are calculated so that the objective function value capable of being calculated from only the received signal y(t) becomes substantially minimized by using, for example, the steepest gradient method, which is an iterative numerical solution of the nonlinear programming method. A reactance value signal that represents the above-mentioned value is outputted to each of the variable reactance elements 12-1 to 12-6, for the setting of the reactance values $x_k$.

The "blind adaptive beam formation" used in the present preferred embodiment will be described next. The purpose of the adaptive beam formation is to maximize the signal-to-interference noise power ratio SINR=S/(N+I) included in the antenna received output signal y(t) derived by the Equation (8). The blind control is to update the antenna variable parameter (in general, weight vector: the reactance values of the variable reactance elements 12-1 to 12-6 in this case) without reference to the signal information included in the desired wave.

Figure 11:
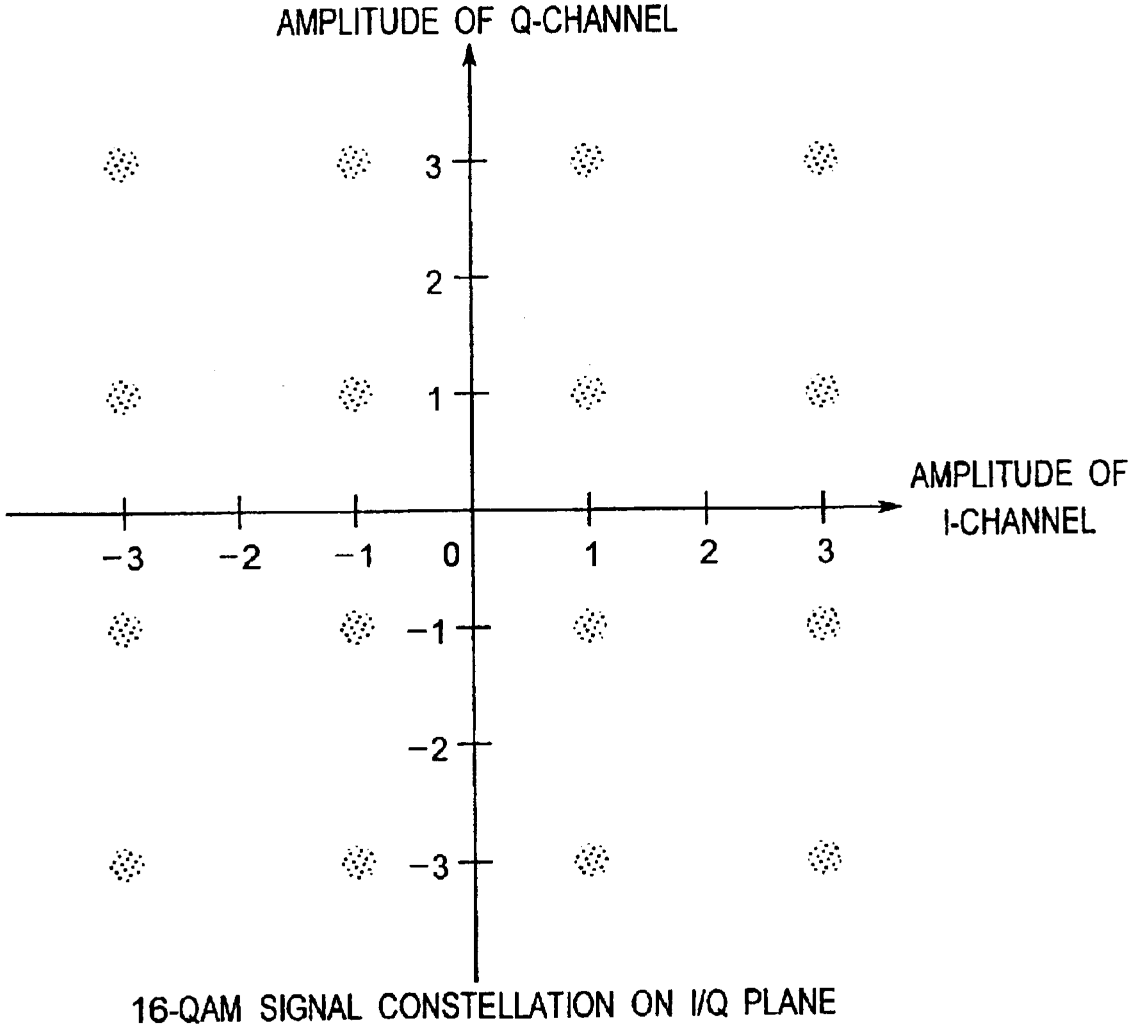
FIG. 11 is a graph showing a signal constellation of a 16 QAM signal received by an ESPAR antenna apparatus 100 of FIG. 10.

The blind control of the present preferred embodiment takes advantage of the fact that the square (instantaneous power value) of the amplitude of the transmitted signal becomes a value of a simple integral ratio at the sampling point. Among the digital modulation systems currently used in numbers of radio systems, the value of this ratio becomes one in every case according to, in particular, PSK. In the case of 16QAM, as is apparent from the signal constellation on an I/Q plane shown in FIG. 11, if only the first quadrant is herein taken into consideration, then the instantaneous power value P based on the amplitude value m=1, 3 of an I-channel and the amplitude value n=1, 3 of a Q-channel is expressed by the following equation of the sampled signal points.

$$P=(2m-1)^2+(2n-1)^2 \quad (18).$$

Therefore, the instantaneous power value P that can assume in the case of 16QAM becomes as shown in the following Table 2.

TABLE 2

Instantaneous Power Value P in the case of 16QAM

| | n | |
|---|---|---|
| m | 1 | 3 |
| 1 | 2 | 10 |
| 3 | 10 | 18 |

According to this Table 2, the instantaneous power ratio at mutually different two signal points becomes 1:5:9. The ratio of an instantaneous power value $P_1$ at a certain sampled signal point to an instantaneous power value $P_2$ at the next sampled signal point assumes any one of 1:1, 1:5, 1:9, 5:1, 5:5, 5:9, 9:1, 9:5 and 9:9. If calculation is performed according to the following equation by comparing these two values $P_1$ and $P_2$ and setting the value of the quotient obtained by dividing the larger one by the smaller one as R, then the results thereof are as shown in the following Table 3.

$$R=\max(P_1,P_2)/\min(P_1,P_2) \quad (19).$$

In this case, the function max(•) is a function that represents the maximum value of a plurality of values included in an argument, and the function min(•) is a function that represents the minimum value of a plurality of values included in an argument.

TABLE 3

Power Ratio R at Sampled Signal Points in the case of 16QAM

| | $P_1$ | | |
|---|---|---|---|
| $P_2$ | 2 | 10 | 18 |
| 2 | 1 | 5 | 9 |
| 10 | 5 | 1 | 1.8 |
| 18 | 9 | 1.8 | 1 |

As is apparent from this Table 3, the power ratio R in the case of 16QAM can assume only the four discrete values expressed by the following equation:

$$R=1.0,\ 1.8,\ 5.0,\ 9.0 \quad (20).$$

Since the interference signal and the noise are superimposed on the transmitted signal on the reception side, the value of this quotient fluctuates from the above-mentioned discrete value. An estimation function Q that represents the degree of this fluctuation is defined by the following equation:

$$Q=\min\{|R-1.0|,\ |R-1.8|,\ |R-5.0|,\ |R-9.0|\} \quad (21).$$

Figure 12:
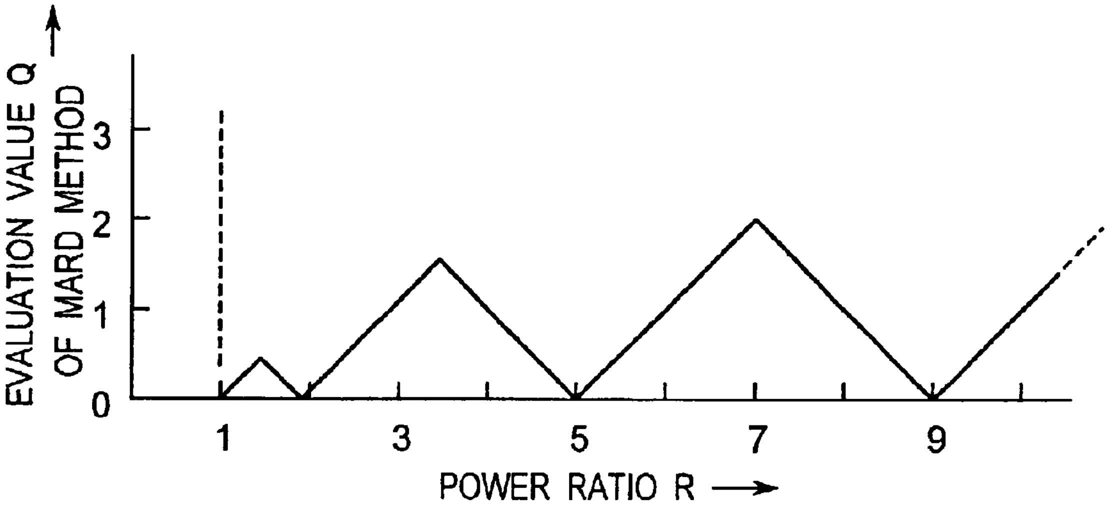
FIG. 12 is a graph showing an estimation value Q with respect to a power ratio R according to a MARD method used in the adaptive control processing executed by an adaptive controller 20*a* of FIG. 10.

As shown in FIG. 12, this estimation function becomes a line chart that has a domain of $1 \leqq r < \infty$. The interference signal and the noise, which are not synchronized with the transmitted signal, are random, and therefore, the estimation function value Q also changes for time elapse. Then, the present preferred embodiment is based on the criterion of the objective function J of the following equation by taking a time mean value or an ensemble mean value (expected value) E(Q) of the estimation function values Q of numbers of sampled signal points during a predetermined time interval of, for example, one frame and minimizing the value.

$$J=E(Q)\rightarrow \min \rightarrow 0 \quad (22).$$

That is, the adaptive control is performed so that the objective function expressed by the Equation (22) becomes the substantially minimum value. Since this criterion is determined by only the relative value of the amplitude of the received signal, there is also a merit that fluctuations in the reception level and fluctuations in the receiver gain exert no influence. By repetitively updating the reactance values on this criterion using an iterative numerical solution of the nonlinear programming of, for example, the steepest gradient method, the optimum beam is formed so that the signal-to-interference noise power ratio (SINR) of the antenna output becomes the maximum, i.e., so that the main beam of the ESPAR antenna apparatus 100 is directed in the direction of the desired wave and nulls are directed in the directions of the interference waves.

Moreover, the instantaneous power value P in the case of 64QAM becomes as shown in the following Table 4, and the power ratio R at the sampled signal points becomes as shown in the following Table 5. The ESPAR antenna apparatus 100 can be adaptively controlled in a manner similar to that of the case of 16QAM. In Table 5, the calculated values of the power ratio R are each expressed to the fourth decimal place by rounding off the fifth decimal place, for the sake of convenience.

TABLE 4

Instantaneous Power Value P in the case of 64QAM

| n m | 1 | 3 | 5 | 7 |
|---|---|---|---|---|
| 1 | 2 | 10 | 26 | 50 |
| 3 | 10 | 18 | 34 | 58 |
| 5 | 26 | 34 | 50 | 74 |
| 7 | 50 | 58 | 74 | 98 |

TABLE 5

Power Ratio R at Sampled Signal Points in the case of 64QAM

| | $P_1$ | | | | | | | | |
|---|---|---|---|---|---|---|---|---|---|
| $P_2$ | 2 | 10 | 18 | 26 | 34 | 50 | 58 | 74 | 98 |
| 2 | 1 | 5 | 9 | 13 | 17 | 25 | 29 | 37 | 49 |
| 10 | 5 | 1 | 1.8 | 2.6 | 3.4 | 5 | 5.8 | 7.4 | 9.8 |
| 18 | 9 | 1.8 | 1 | 1.44 | 1.888 | 2.777 | 3.222 | 4.111 | 5.444 |
| 26 | 13 | 2.6 | 1.444 | 1 | 1.308 | 1.923 | 2.231 | 2.846 | 3.769 |
| 34 | 17 | 3.4 | 1.888 | 1.308 | 1 | 1.471 | 1.706 | 2.176 | 2.882 |
| 50 | 25 | 5 | 2.777 | 1.923 | 1.471 | 1 | 1.16 | 1.48 | 1.96 |
| 58 | 29 | 5.8 | 3.222 | 2.231 | 1.706 | 1.16 | 1 | 1.276 | 1.690 |
| 74 | 37 | 7.4 | 4.111 | 2.846 | 2.176 | 1.48 | 1.276 | 1 | 1.324 |
| 98 | 49 | 9.8 | 5.444 | 3.769 | 2.882 | 1.96 | 1.690 | 1.324 | 1 |

In the above-mentioned preferred embodiment, it is noted that the objective function expressed by the Equation (22) is used. However, the present invention is not limited to this, and the estimation function expressed by the Equation (21) may be used as an objective function. Moreover, the adaptive control processing executed by the adaptive controller 20*a* of FIG. 10 according to the steepest gradient method is executed in a manner similar to that of FIG. 3 except for the objective function.

As described above, according to the present preferred embodiment, the adaptive controller 20*a* calculates the power ratio R for the power values at respective two signal points of mutually different combinations of the received signal in the predetermined time interval of, for example, the time interval of one frame on the basis of the received signal y(t) received by the radiating element A0 of the ESPAR antenna apparatus 100, calculates the time mean value or the ensemble mean value of the minimum value of the absolute values of the values obtained by subtracting the discrete power ratio $R_1$, $R_2$, . . . , $R_{max}$ from respective calculated power ratios R as the objective function and calculates and sets the reactance values of the variable reactance elements 12-1 to 12-6 for directing the main beam of the ESPAR antenna apparatus 100 in the direction of the desired wave and for directing nulls in the directions of the interference waves so that the objective function value (the Equation (22)) capable of being calculated from only the received signal y(t) becomes substantially minimized by using, for example, the steepest gradient method, which is an iterative numerical solution of the nonlinear programming method. Therefore, the directivity of the array antenna can be adaptively controlled so that the main beam is directed in the direction of the desired wave and nulls are directed in the directions of the interference waves without requirement of any reference signal even if the transmitted radio signal is modulated by the modulation method that includes digital amplitude modulation. In this case, since no reference signal is needed, the construction of the same controller apparatus can be simplified. Moreover, since the objective function J is expressed by only the received signal y(t), the calculation processing of the adaptive controller 20*a* can be executed very simply.

In the above-mentioned preferred embodiment, the six parasitic elements A1 to A6 are employed. However, with at least one parasitic element, the directivity characteristic of the array antenna apparatus can be electronically controlled. Instead of the above, it is acceptable to provide more than six parasitic elements. Moreover, the arrangement configuration of the parasitic elements A1 to A6 is not limited to that of the above-mentioned preferred embodiment, and the elements are only required to be located apart from the radiating element A0 by a predetermined distance. That is, the distance to the parasitic elements A1 to A6 is not required to be constant.

In the above-mentioned preferred embodiment, the reactance value of each variable reactance element 12 is calculated by the steepest gradient method. However, the present invention is not limited to this, and it is acceptable to use an iterative numerical solution of the nonlinear programming method such as the sequential random method, the random method and the higher dimensional dichotomy method which are described hereinabove.

In the above-mentioned preferred embodiment, the objective function J is used as the objective function for obtaining the reactance values for the adaptive control, and the optimum solution of the reactance vector is calculated so that the objective function becomes the minimum. However, the present invention is not limited to this, and it is acceptable to use the reciprocal of the objective function J as an objective function for obtaining the reactance values for the adaptive control and calculate the optimum solution of the reactance vector so that the objective function becomes the maximum.

Fourth Preferred Embodiment

Figure 13:
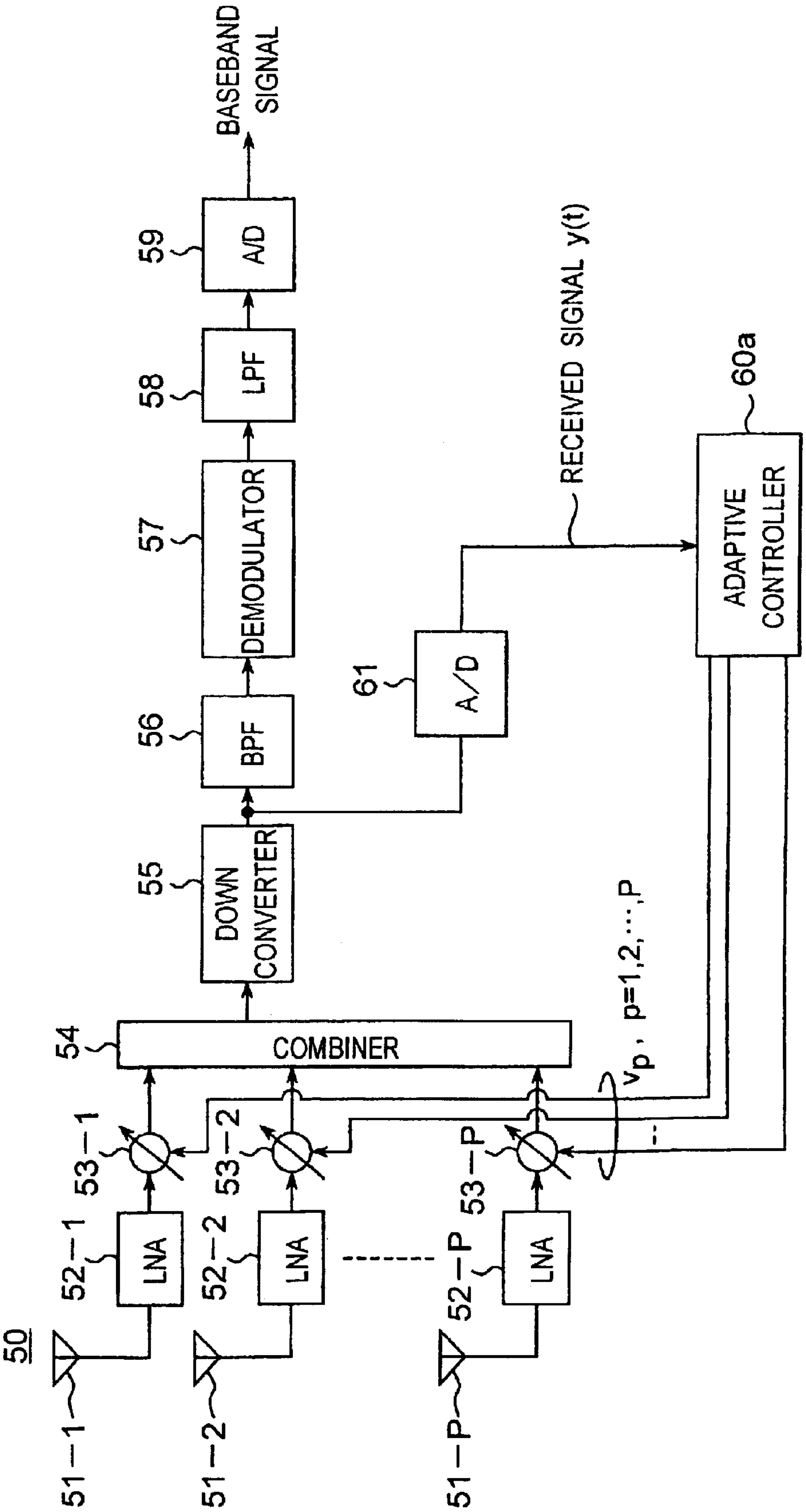
FIG. 13 is a block diagram showing a construction of a controller apparatus of an array antenna according to a fourth preferred embodiment of the present invention.

FIG. 13 is a block diagram showing a construction of a controller apparatus of an array antenna according to a fourth preferred embodiment of the present invention. This fourth preferred embodiment is characterized in that an adaptive controller 60*a* is provided in place of the adaptive controller 60 of the second preferred embodiment.

In the present preferred embodiment, the adaptive controller 60*a* calculates phase shift control voltages $v_p$ (p=1, 2, . . . , P) corresponding to the amounts of phase shift of variable phase shifters 53-1 to 53-P for directing the main beam of the array antenna 50 in the direction of the desired wave and directing nulls in the directions of the interference waves on the basis of the received signal y(t) so that the value of the above-mentioned objective function (the Equation (22)) becomes the minimum by executing processing similar to that of the adaptive control processing of FIG. 3 by using, for example, the steepest gradient method, which is an iterative numerical solution of the nonlinear programming method, and applies the voltages to the variable phase shifters 53-1 to 53-P, then this leads to setting the corresponding amounts of phase shift.

The present preferred embodiment also utilizes the radio signal modulated by the modulation method that includes digital amplitude modulation as a radio signal used for adaptive control in a manner similar to that of the third preferred embodiment.

In a manner similar to that of the adaptive controller 20*a* of the first preferred embodiment, the adaptive controller 60*a* of the present preferred embodiment also can perform adaptive control of the directivity of the array antenna so that the main beam is directed in the direction of the desired wave and nulls are directed in the directions of the interference waves without requirement of any reference signal even if the transmitted radio signal is modulated by digital amplitude modulation. In this case, since no reference signal is needed, the construction of the same controller apparatus can be simplified. Moreover, since the objective function J is expressed by only the received signal y(t), the calculation processing of the adaptive controller 60*a* can be executed very simply.

In the above-mentioned preferred embodiment, the phase shift control voltage $v_p$ corresponding to the quantity of phase shift of each of the variable phase shifters 53-1 to 53-P is calculated by the steepest gradient method. However, the present invention is not limited to this, and it is acceptable to use an iterative numerical solution of the nonlinear programming method such as the sequential random method, the random method and the higher dimensional dichotomy method which are described hereinabove. Moreover, it is acceptable to use the reciprocal of the objective function J.

Implemental Example of Third Preferred Embodiment

Figure 14:
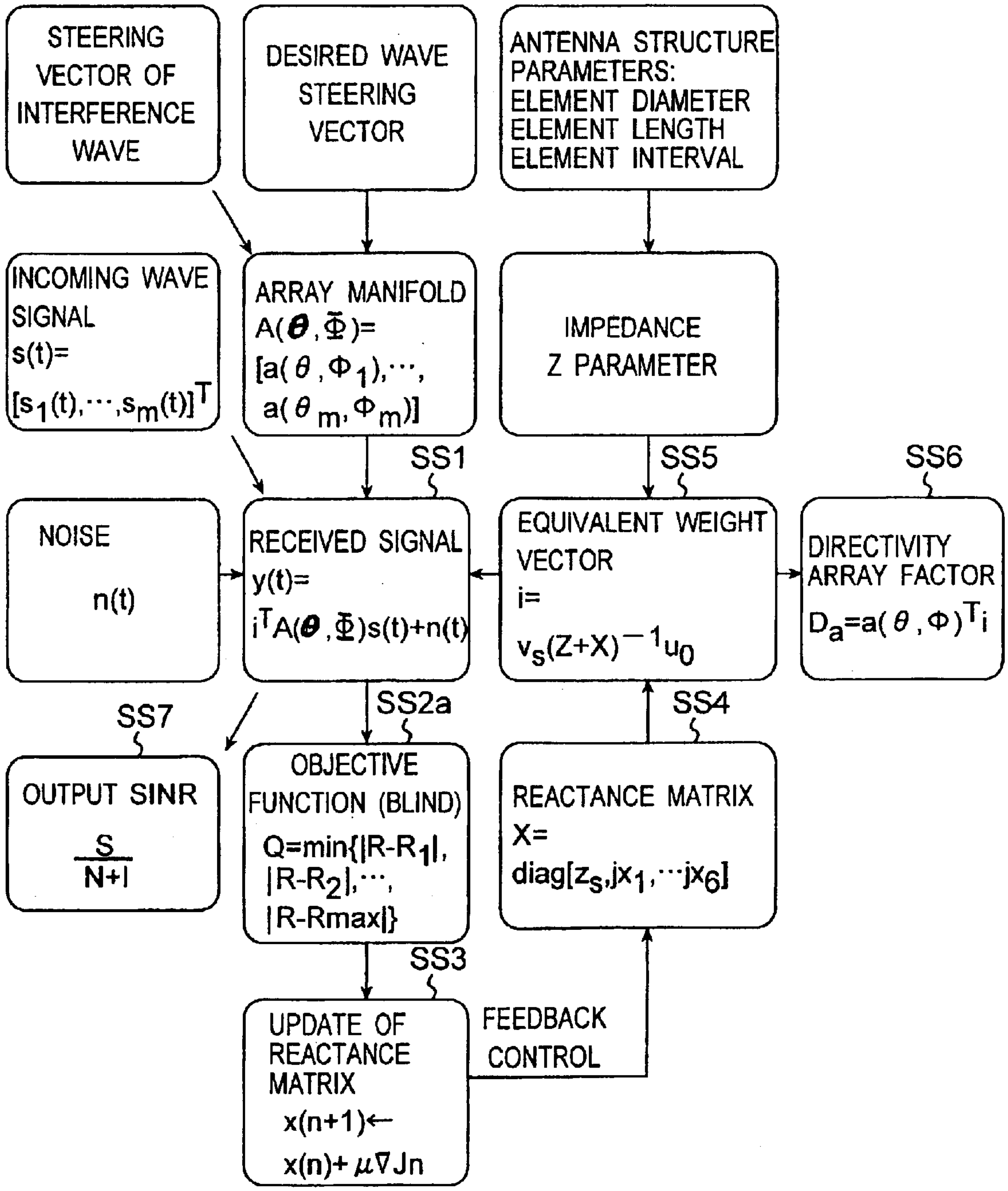
FIG. 14 is a diagram showing a simulation flow of blind adaptive beam formation executed by an ESPAR antenna apparatus 100 of FIG. 10.
Figure 15:
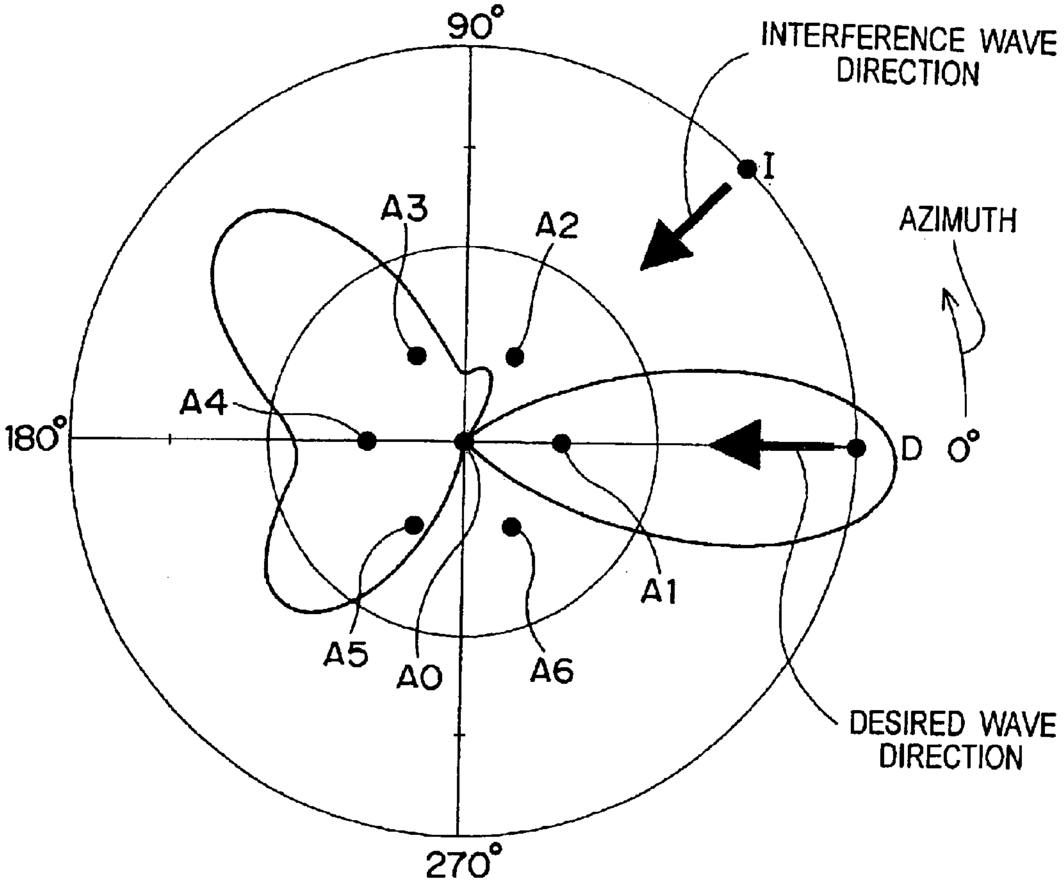
FIG. 15 is a directivity characteristic chart showing a radiation power pattern when an interference wave is directed in a direction of an angle of 45 degrees according to simulation results of FIG. 14.
Figure 16:
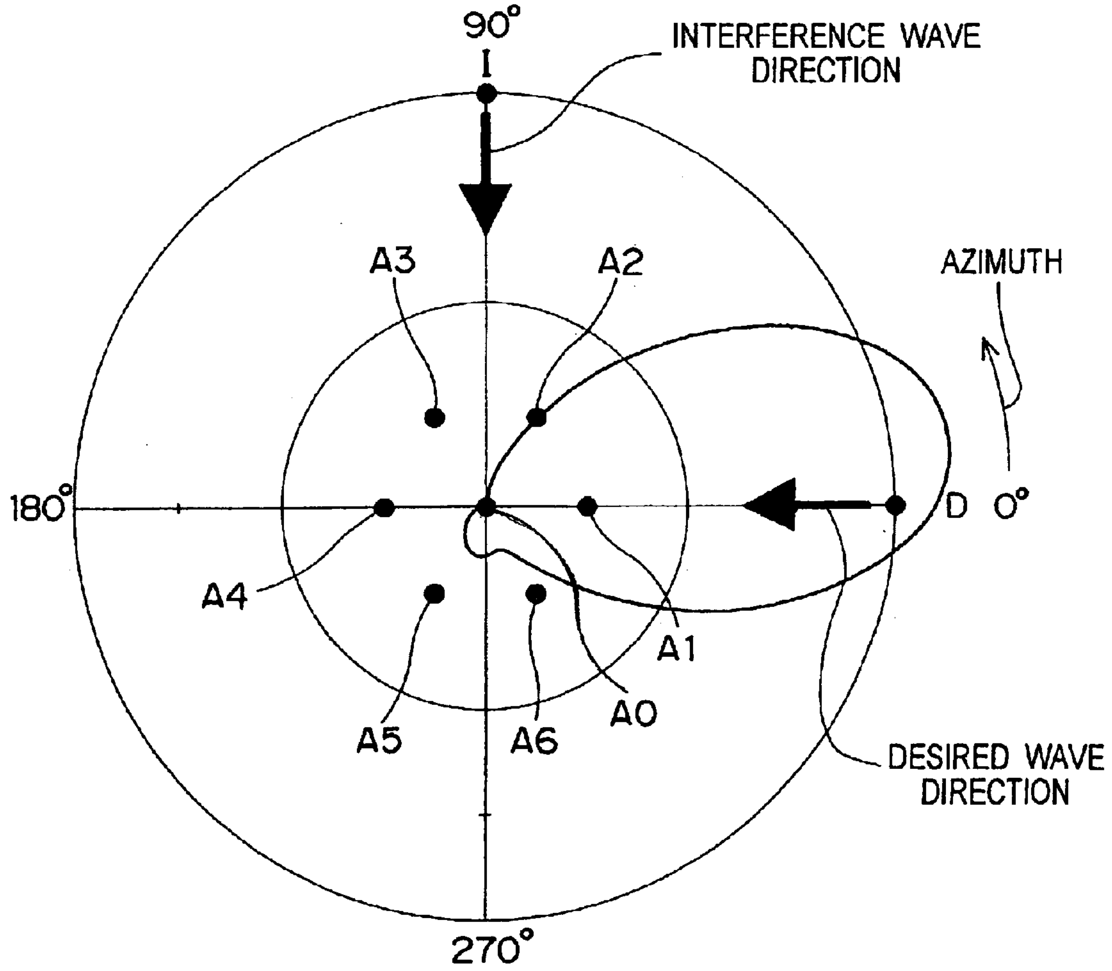
FIG. 16 is a directivity characteristic chart showing a radiation power pattern when the interference wave is directed in a direction of an angle of 90 degrees according to the simulation results of FIG. 14.
Figure 17:
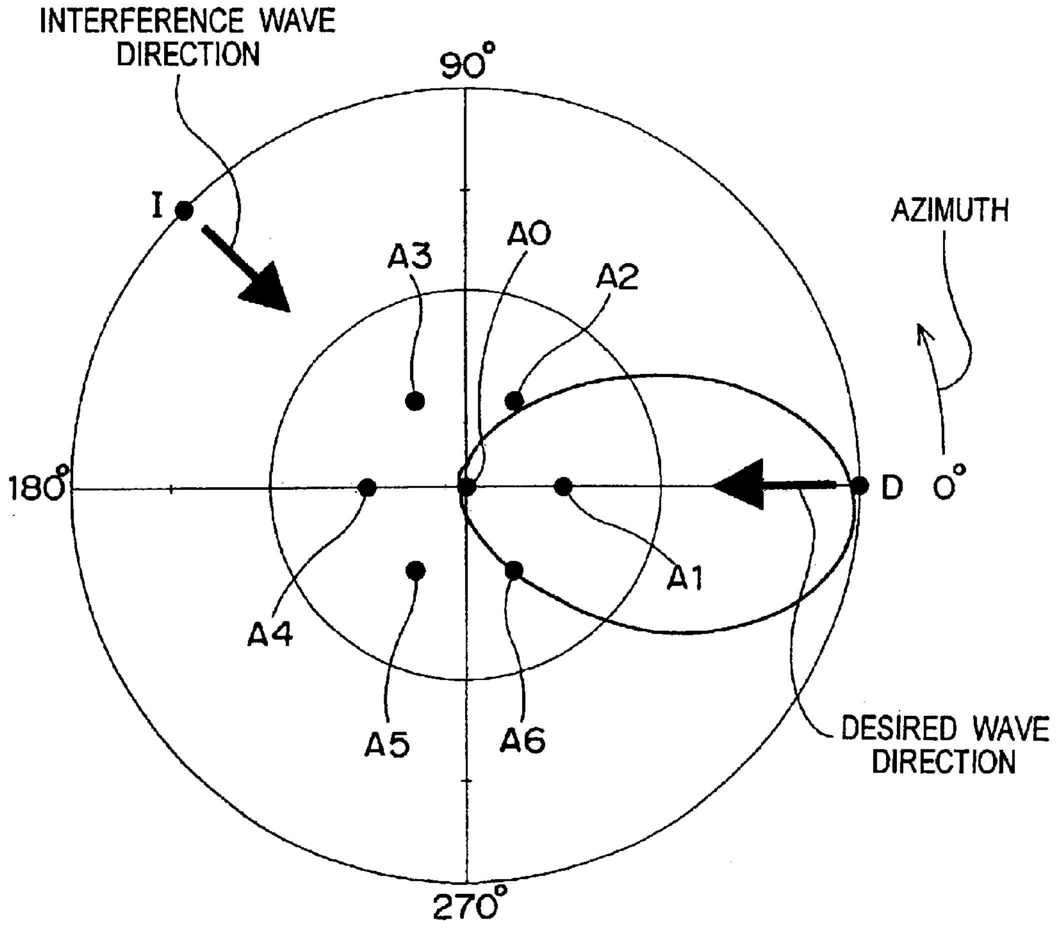
FIG. 17 is a directivity characteristic chart showing a radiation power pattern when the interference wave is directed in a direction of an angle of 135 degrees according to the simulation results of FIG. 14.
Figure 18:
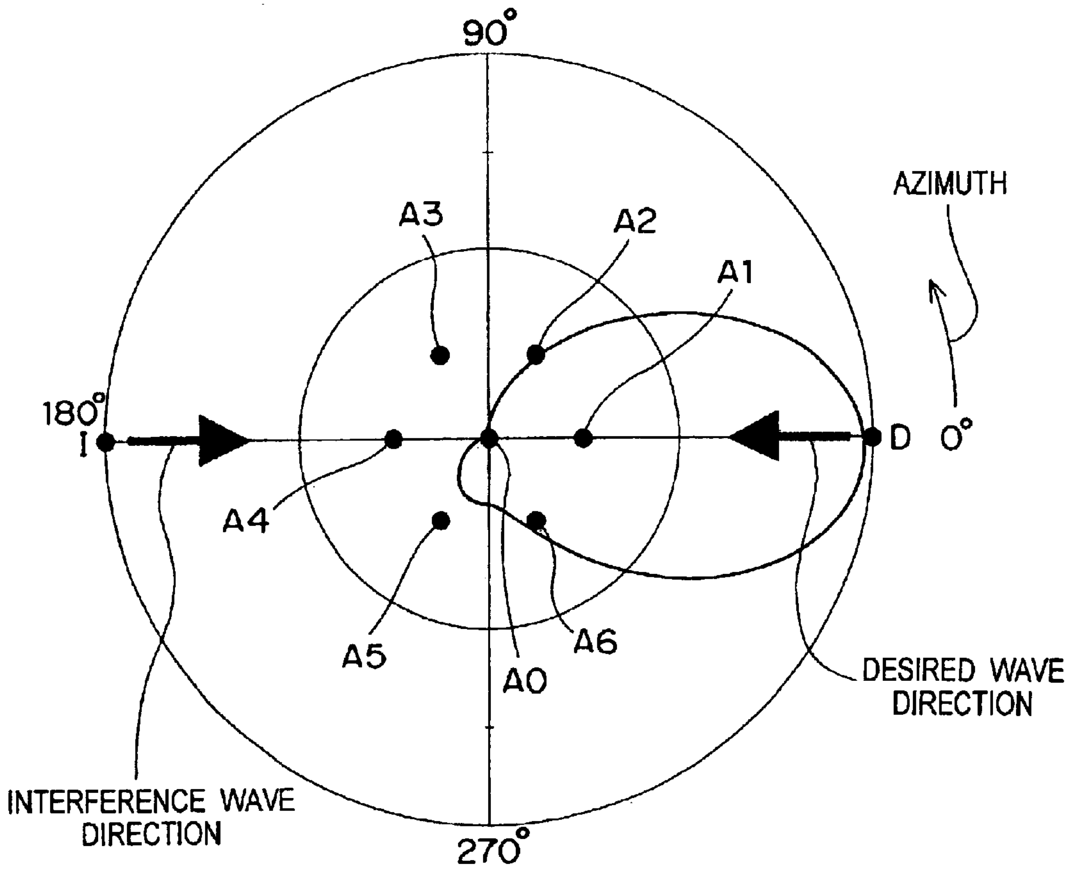
FIG. 18 is a directivity characteristic chart showing a radiation power pattern when the interference wave is directed in a direction of an angle of 180 degrees according to the simulation results of FIG. 14.

FIG. 14 is a diagram showing a simulation flow of a blind adaptive beam formation executed by using the ESPAR antenna apparatus 100 of FIG. 10. In a manner similar to that of the above-mentioned formulation model, this simulation utilizes a half-wavelength dipole antenna as the radiating element A0 and utilizes six dipole antennas arranged in a circular array as the parasitic elements A1 to A6. Moreover, it is assumed that the directions in which the desired wave and the interference wave arrive at the ESPAR antenna apparatus 100 are unknown (adaptive control) and no training signal is used (blind processing). In the present implemental example, the simulation is performed in an environment in which an interference wave comes at the same time in addition to the desired wave. It is assumed that the desired wave is a 16QAM random modulated signal, the interference wave is a constant-amplitude random-phase signal, and the noise is an additive Gaussian noise. It is assumed that all of these desired wave, interference wave and the noise have no cross correlation on each other. For the sake of simplicity, the band-limiting filter, delay diffusion or widening, angular diffusion or widening, fading, Doppler effect and synchronization errors in the transmission path are all ignored. Under these conditions, the reactance values of the six variable reactance elements 12-1 to 12-6 are adaptively controlled on the criterion expressed by the Equation (12). In this case, the input impedance of the RF receiver connected to the ESPAR antenna apparatus 100 is assumed to be $z_s$=50 Ω.

According to the simulation flow of FIG. 14, the adaptive control of the antenna beam is performed by executing the processing of steps SS1 to SS5 (where step SS2*a* is different from step SS2 of FIG. 5) on the basis of the steering vector of the interference wave, the steering vector of the desired wave, the parameters of the antenna structure, the incoming wave signal and the noise, and finally, the directivity array factor and an output SINR are calculated and outputted (in steps SS6 and SS7). The processing in these steps SS1 to SS7 calculates the objective function J on the basis of the received signal y(t), calculates a reactance matrix by updating the reactance matrix, and thereafter, calculates an equivalent weight vector. Then, the directivity array factor is calculated from the equivalent weight vector, while the output SINR is calculated from the received signal y(t) and the noise n(t).

This simulation is performed in an environment in which the interference wave also comes at the same time in addition to the desired wave. FIGS. 15 to 18 show the reactance control results and the directivity patterns (power patterns) when the arrival direction of the desired wave is fixed at an angle of zero degree and the arrival direction of the interference wave is assumed to be set to angles of 45 degrees, 90 degrees, 135 degrees and 180 degrees, respectively. In these figures, the symbols D and I on the circumference of the polar chart indicate the arrival bearings of the desired wave and the interference wave, respectively. From the four patterns of FIGS. 15 to 18, it can be understood that the main beam is formed almost in the arrival direction of the desired wave and deep null points are concurrently formed in the directions of the interference waves.

Fifth Preferred Embodiment

Figure 19:
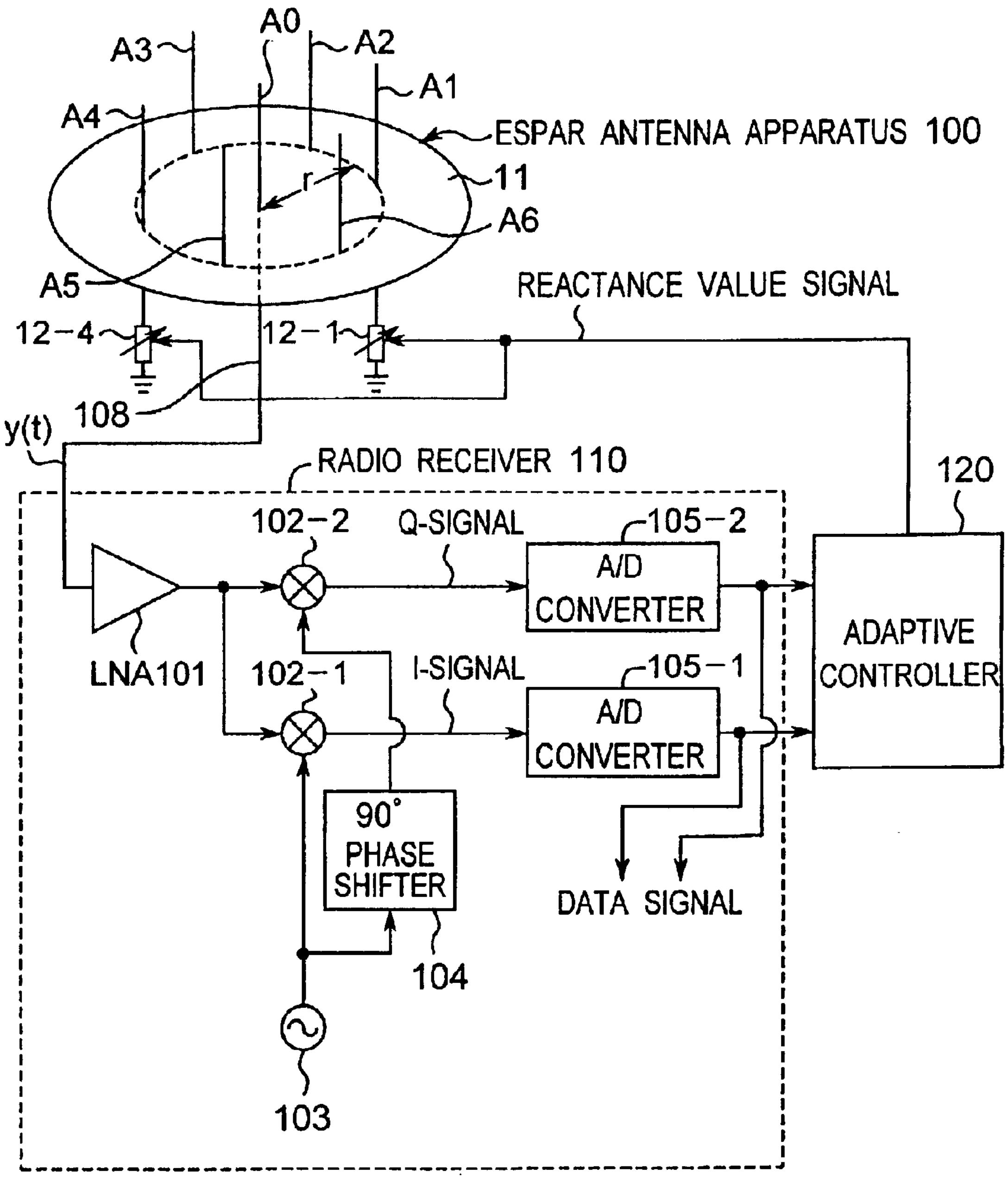
FIG. 19 is a block diagram showing a construction of an controller apparatus of an array antenna according to a fifth preferred embodiment of the present invention.

FIG. 19 is a block diagram showing a construction of a controller apparatus of an array antenna according to a fifth preferred embodiment of the present invention. As shown in FIG. 19, the controller apparatus of the array antenna of the present preferred embodiment is constructed of an ESPAR antenna apparatus 100 provided with one radiating element A0 and six parasitic elements A1 to A6, a radio receiver 110 and an adaptive controller 120.

In this case, the transmitted radio signal is subjected to m-PSK modulation (m is herein an integer equal to or larger than two). The adaptive controller 120 is constructed of a digital calculator of, for example, a computer and is characterized in that the reactance values of variable reactance elements 12-1 to 12-6 for directing the main beam of the ESPAR antenna apparatus 100 in the direction of the desired wave and for directing nulls in the directions of the interference waves are calculated and set on the basis of the received signal y(t) received by the radiating element A0 of the ESPAR antenna apparatus 100 so that the value of a criterion function (e.g., the Equation (24) described later) expressed by the m-th power of the received signal y(t) becomes the maximum by using, for example, the steepest gradient method, which is an iterative numerical solution of the nonlinear programming method.

In the array antenna controller of FIG. 19, the radiating element A0 of the ESPAR antenna apparatus 100 receives the radio signal y(t), and the received signal y(t), which is the received radio signal, is inputted to the radio receiver 110 via a coaxial cable 108. The radio receiver 110 performs BPSK demodulation processing of the received signal y(t) to obtain two digital baseband signals from mutually orthogonal received signals that have undergone the BPSK demodulation. That is, in the radio receiver 110, the received signal y(t) is first subjected to high-frequency amplification by a low-noise amplifier (LNA) 101, and thereafter, is distributed into two signals. One of the bifurcately distributed received signal y(t) is mixed with a local oscillation signal from a local oscillator 103 by a mixer 102-1. Subsequently, an I-signal obtained after direct conversion is subjected to A/D conversion by an A/D converter 105-1, obtaining a digital baseband I-signal. On the other hand, the other bifurcately distributed received signal y(t) is mixed with a local oscillation signal that has undergone 90-degree phase shift from the local oscillation signal by a 90° phase shifter 104 by a mixer 102-2. Subsequently, a Q signal obtained after direct conversion is subjected to A/D conversion by an A/D converter 106-2, then obtaining a digital baseband Q signal. These two digital baseband signals are outputted as data signals to the adaptive controller 120. Subsequently, the adaptive controller 120 calculates the reactance values $x_k$ (k=1, 2, . . . , 6) of the variable reactance elements 12-1 to 12-6 for directing the main beam of the ESPAR antenna apparatus 100 in the direction of the desired wave and directing nulls in the directions of the interference waves on the basis of the two digital baseband signals that represent the received signal y(t) received by the radiating element A0 of the ESPAR antenna apparatus 100 so that the value of the criterion function (the Equation (24)) expressed by the m-th power of the received signal y(t) of only the received signal y(t) becomes the maximum by, for example, the steepest gradient method and outputs a reactance value signal that represents the value to each of the variable reactance elements 12-1 to 12-6, then this leads to setting the reactance values $x_k$.

Figure 20:
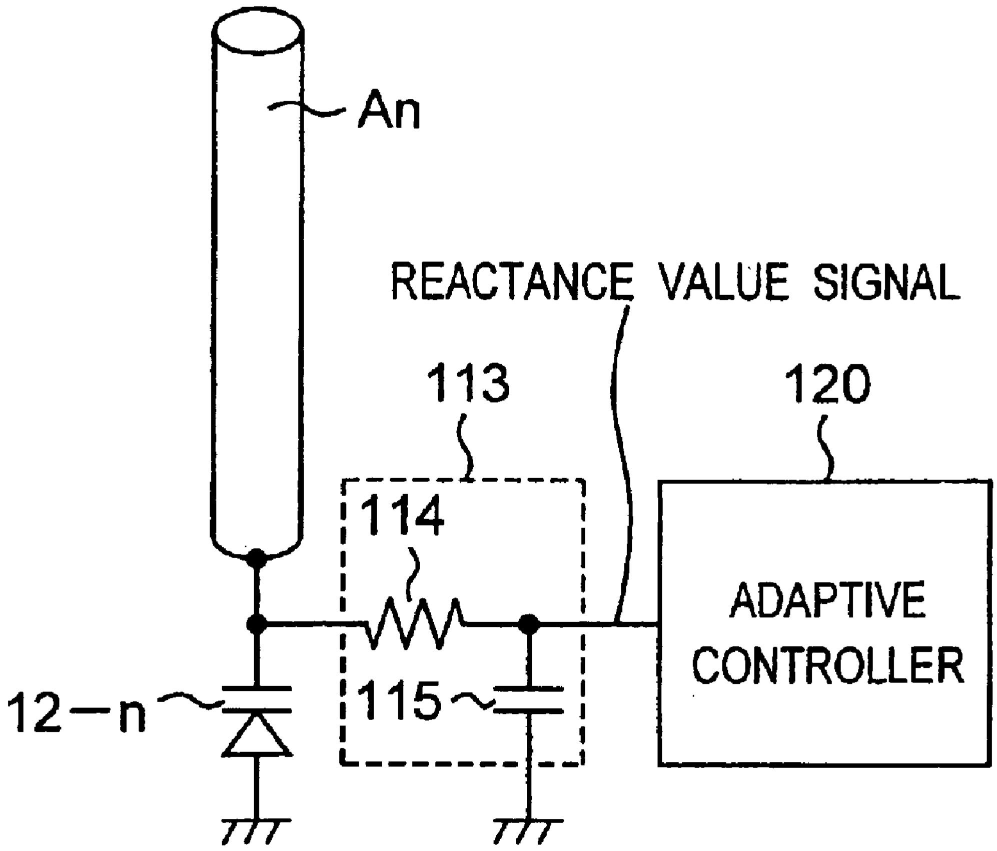
FIG. 20 is a circuit diagram showing a circuit in the vicinity of a connection point of a parasitic element An and a variable reactance element 12-n of an ESPAR antenna apparatus 100 of FIG. 19.

FIG. 20 is a circuit diagram showing a circuit at and around the connection point of the parasitic element An and the variable reactance element 12-n of the ESPAR antenna apparatus 100 of FIG. 19. Referring to FIG. 20, a DC bias voltage, which is the reactance value signal from the adaptive controller 120, is applied to the variable reactance element 12-n (n=1, 2, . . . , 6), which is constructed of, for example, a varactor diode, via an L-shaped low-pass filter 113 constructed of a resistor 114 and a capacitor 115, as a consequence of which the reactance values $x_k$ (k=1, 2, . . . , 6) of the variable reactance elements 12-1 to 12-6 are controlled. The received signal y(t) of the ESPAR antenna apparatus 100 is expressed by the following Equation (23):

$$y(t) = \sum_{k=1}^{K} D(\theta_k, \varphi_k) s_k(t) + n(t), \qquad (23)$$

where $S_k(t)$, $\theta_k$ and $\phi_k$ are the waveform for time elapse and the arrival direction, respectively, of the k-th signal.

The "blind adaptive beam formation" used in the present preferred embodiment will be described next. The purpose of the adaptive beam formation is to maximize the signal-to-interference noise power ratio SINR included in the antenna received output signal y(t) derived from the Equation (23). The blind control is to update the antenna variable parameter (in general, weight vector: the reactance values of the variable reactance elements 12-1 to 12-6 in this case) without reference to the signal information included in the desired wave.

In order to adaptively form a beam, there are normally used the processes of (1) including a reference signal in the header of the transmission packet, (2) preparatorily knowing this reference signal series on the reception side, (3) detecting the synchronization timing of the reference signal and (4) training the weight coefficient of the array. There is, for example, an algorithm of "MCCC: Maximum Cross Correlation Coefficient" for maximizing a cross correlation coefficient between the received signal and the reference signal as an adaptive beam forming method of the ESPAR antenna apparatus 100 (See, for example, a third prior art document of "KAMIYA et al., "Performance Considerations for the ESPAR Antenna-Statistical Considerations of SINR Characteristics Based on the Random Weight Search", Technical Report of The Institute of Electronics, Information and Communication Engineers in Japan, A-P 2000-175, SANE2000-156, pp.17–24, January, 2001"). In contrast to this, the blind adaptive beam formation is a function to adaptively form a beam without reference to a reference signal, and the above-mentioned processes of (1) to (3) can be omitted.

In the present preferred embodiment, paying attention to the characteristic property of the m-PSK-modulated signal, a blind criterion utilizing this is proposed. The property to which attention is paid is the phenomenon that "the m-PSK-modulated signal becomes a constant complex value when raised to the m-th power regardless of the modulation data". If it suffers from noise or interference in the communication path, then a fluctuation from this constant complex value is observed on the reception side. The smaller the fluctuation, the higher the purity of the desired signal can be achieved upon extracting the desired signal. Then, it is proposed to maximize the m-th order moment of the output signal of the reception antenna derived as described above, i.e., to adopt the following equation as a criterion function:

$$J\{y(t)^m\} = \frac{|E[y(t)^m]|^2}{E[|y(t)^m|^2]} \rightarrow \max, \tag{24}$$

where E[•] represents the ensemble mean (mean value for a predetermined time interval) of the argument •. The denominator represents the mean power of the signal raised to the m-th power. The physical interpretation of the criterion function $J\{y(t)^m\}$ will be described later in the supplemental description. The advantage of this criterion function is that the above-mentioned "constant complex value" is not included. That is, this value is not required to be preparatorily known on the reception side. This fact means that the function is influenced by neither the absolute gain nor the fixed amount of phase rotation of the antenna and the receiver circuit system, and this is an important advantage in using the function for the actual radio system. The criterion for maximizing the m-th order moment of the complex signal, as expressed by the above equation, is herein referred to as an "MMC: Maximum Moment Criterion".

The "blind adaptive beam formation" using the above-mentioned criterion function will be described next. The "adaptive beam formation" is to update the antenna variable parameter (the reactance values of the variable reactance elements 12-1 to 12-6 in the ESPAR antenna apparatus 100) so that the signal-to-interference noise power ratio SINR=S/(N+I) included in the received signal y(t) of the ESPAR antenna apparatus 100 derived by the Equation (23) is substantially maximized. By repetitively updating the reactance values on the basis of the above-mentioned criterion function, the antenna directivity becomes the optimum beam pattern that the output SINR is maximized, i.e., the beam pattern that the main beam is formed in the direction of the desired wave and nulls are formed in the directions of the interference waves.

That is, the criterion function J is constructed of only the received signal y(t) that does not include the target value C and is further expressed by using the m-th power $\{y(t)^m\}$ of the received signal. In this case, it is such a great merit that the target value can be controlled in an unknown state. By repetitively updating the reactance values on this criterion using an iterative numerical solution of the nonlinear programming of, for example, the steepest gradient method, the optimum beam is formed so that the signal-to-interference noise power ratio (SINR) of the antenna output becomes the maximum, i.e., so that the main beam of the ESPAR antenna apparatus 100 is directed in the direction of the desired wave and nulls are directed in the directions of the interference waves. It is a flowchart showing more concrete adaptive control processing executed by the adaptive controller 20 of FIG. 19 by the steepest gradient method.

As described above, according to the present preferred embodiment, the adaptive controller 120 calculates and sets the reactance values of the variable reactance elements 12-1 to 12-6 for directing the main beam of the ESPAR antenna apparatus 100 in the direction of the desired wave and directing nulls in the directions of the interference waves on the basis of the received signal y(t) received by the radiating element A0 of the ESPAR antenna apparatus 100 so that the value of the criterion function (the Equation (24)) expressed by the m-th power of the received signal y(t) of only the received signal y(t) becomes the maximum by using, for example, the steepest gradient method, which is an iterative numerical solution of the nonlinear programming method. Therefore, the directivity of the array antenna can be adaptively controlled so that the main beam is directed in the direction of the desired wave and nulls are directed in the directions of the interference waves without requirement of any reference signal. In this case, since no reference signal is needed, the construction of the same controller apparatus can be simplified. Moreover, since the criterion function J is expressed by only the received signal y(t), the calculation processing of the adaptive controller 120 can be executed very simply.

In the above-mentioned preferred embodiment, the six parasitic elements A1 to A6 are employed. However, with at least one parasitic element, the directivity characteristic of the array antenna apparatus can be electronically controlled. Instead of the above, it is acceptable to provide more than six parasitic elements. Moreover, the arrangement configuration of the parasitic elements A1 to A6 is not limited to that of the above-mentioned preferred embodiment, and the elements are only required to be located apart from the radiating element A0 by a predetermined distance. That is, the distance to the parasitic elements A1 to A6 is not required to be constant.

In the above-mentioned preferred embodiment, the reactance value of each variable reactance element 12 is calculated by the steepest gradient method. However, the present invention is not limited to this, and it is acceptable to use an iterative numerical solution of the nonlinear programming method such as the sequential random method, the random method and the higher dimensional dichotomy method which are described hereinabove.

In the above-mentioned preferred embodiment, the criterion function J is used as the criterion function for obtaining the reactance values for the adaptive control, and the optimum solution of the reactance vector is calculated so that the function becomes the maximum. However, the present invention is not limited to this, and it is acceptable to use the reciprocal of the criterion function J as the criterion function for obtaining the reactance values for the adaptive control and calculate the optimum solution of the reactance vector so that the criterion function becomes the minimum.

The above-mentioned preferred embodiment is provided with the six parasitic elements A1 to A6 and the variable reactance elements 12-1 to 12-6 corresponding to them. However, the present invention is not limited to this, and it is acceptable to provide at least one parasitic element A1 and a variable reactance element 12-1 corresponding to the same parasitic element A1. Moreover, the number of the elements may be plural.

Sixth Preferred Embodiment

Figure 21:
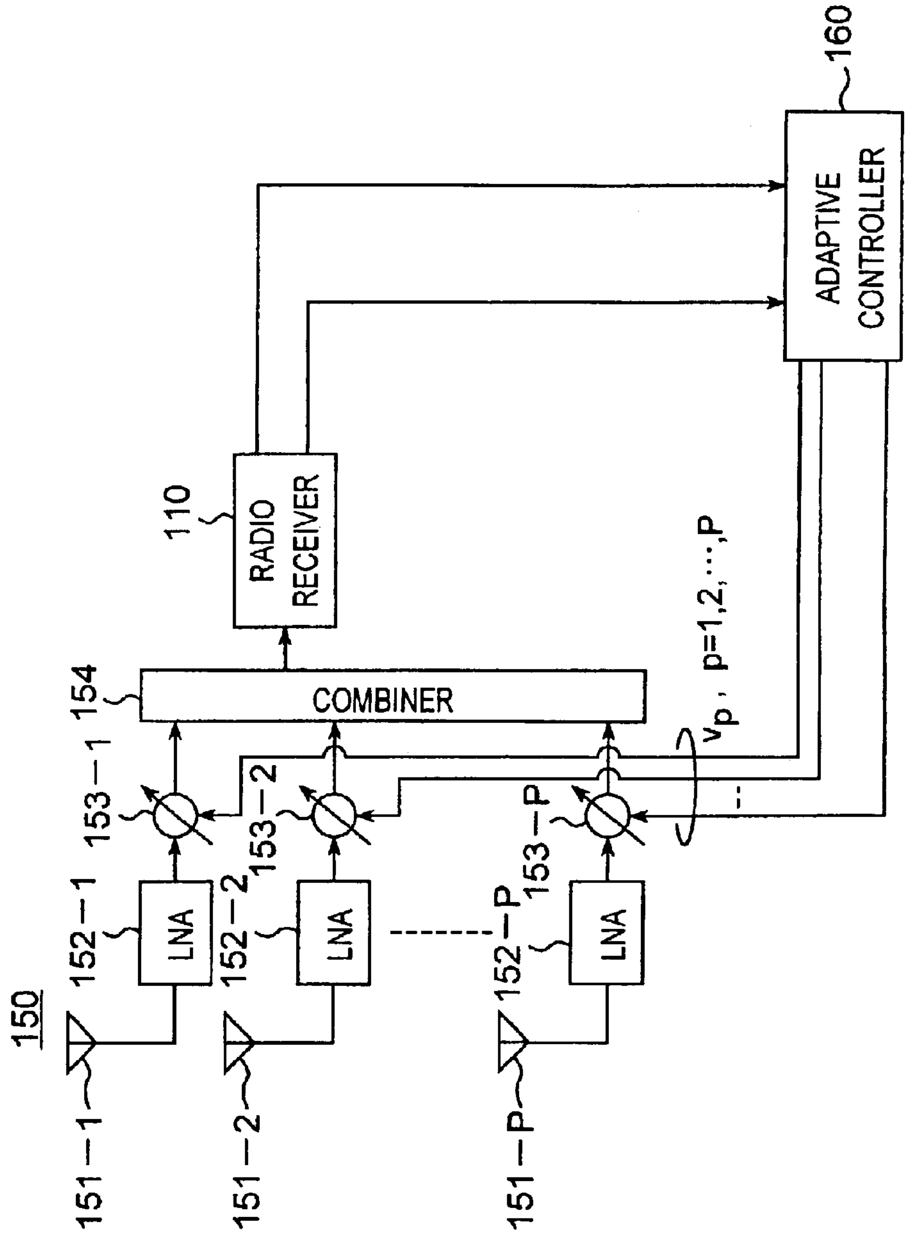
FIG. 21 is a block diagram showing a construction of a controller apparatus of an array antenna according to a sixth preferred embodiment of the present invention.

FIG. 21 is a block diagram showing a construction of a controller apparatus of an array antenna according to a sixth preferred embodiment of the present invention.

The present preferred embodiment adopts a construction for combining signals received by antenna elements 151-1 to 151-P of an array antenna 150 by an RF-band BFN (Beam Forming Network) circuit constructed of variable phase shifters 153-1 to 153-P and a combiner 154 that is an adder. The controller apparatus of this array antenna is characterized in that it is an adaptive controller apparatus for controlling the beam of the array antenna 150 where the plurality of P antenna elements 51-1 to 51-P are arranged at predetermined intervals (e.g., a linear array, which may be arranged or aligned in a two-dimensional or three-dimensional configuration) and is provided with an adaptive controller 160. In this case, the transmitted radio signal is subjected to m-PSK modulation (m is an integer not smaller than two), and the adaptive controller 160 is characterized in that a phase shift control voltage $v_p$ (p=1, 2, . . . , P) corresponding to the quantity of phase shift of the variable phase shifters 53-1 to 53-P for directing the main beam of the array antenna 150 in the direction of the desired wave and for directing nulls in the directions of the interference waves are calculated and set on the basis of the received signal after being combined so that the value of the criterion function (the Equation (24)) expressed by the m-th power of the received signal y(t) becomes the maximum by using, for example, the steepest gradient method, which is an iterative numerical solution of the nonlinear programming method.

The construction of the controller apparatus of the array antenna shown in FIG. 21 will be described below.

Referring to FIG. 21, a radio signal is received by the array antenna 150 where the plurality of P antenna elements 151-1 to 151-P are arranged at predetermined intervals in a line, and the radio signals received by the antenna elements 151-1 to 151-P are inputted to the variable phase shifters 153-1 to 153-P via low-noise amplifiers (LPAs) 152-1 to 152-P, respectively. The variable phase shifters 153-1 to 153-P shift the phase of the inputted radio signal by an quantity of phase shift corresponding to the phase shift control voltage $v_p$ (p=1, 2, . . . , P) outputted from the adaptive controller 160, and thereafter, output the resulting signals to the combiner 154. The combiner 154 combines the inputted P radio signals in power and outputs the combined radio signal as a received signal y(t) to a radio receiver 10, which has a construction similar to that of the radio receiver 110 of FIG. 19.

Subsequently, the radio receiver 110 obtains two digital baseband signals from received signals orthogonal to each other in a manner similar to that of the radio receiver 110 of FIG. 19 on the basis of the inputted combined received signal y(t), and then, outputs the signals to the adaptive controller 160. The adaptive controller 160 calculates a phase shift control voltage $v_p$ (p=1, 2, . . . , P) corresponding to the quantity of phase shift of the variable phase shifters 153-1 to 153-P for directing the main beam of the array antenna 150 in the direction of the desired wave and directing nulls in the directions of the interference waves on the basis of the inputted two digital baseband signals so that the value of the criterion function (the Equation (24)) expressed by the m-th power of the received signal y(t) of only the received signal y(t) becomes the maximum by executing processing similar to that of the adaptive control of FIG. 3 except for the criterion function by using, for example, the steepest gradient method, which is an iterative numerical solution of the nonlinear programming method, and applies the voltage to the variable phase shifters 153-1 to 153-P, then this leads to setting the corresponding amounts of phase shift.

Also, the adaptive controller 160 of the present preferred embodiment can perform adaptive control of the directivity of the array antenna so that the main beam is directed in the direction of the desired wave and nulls are directed in the directions of the interference waves without requirement of any reference signal in a manner similar to that of the adaptive controller 120 of the fifth preferred embodiment. In this case, since no reference signal is needed, the construction of the same controller apparatus can be simplified. Moreover, since the criterion function J is expressed by only the received signal y(t), the calculation processing of the adaptive controller 160 can be executed very simply.

In the above-mentioned preferred embodiment, the phase shift control voltage $v_p$ corresponding to the quantity of phase shift of the variable phase shifters 153-1 to 153-P is calculated by the steepest gradient method. However, the present invention is not limited to this, and it is acceptable to use an iterative numerical solution of the nonlinear programming method such as the sequential random method, the random method and the higher dimensional dichotomy method which are described hereinabove. Moreover, it is acceptable to use the reciprocal of the criterion function J.

Implemental Example of Fifth Preferred Embodiment

Figure 22:
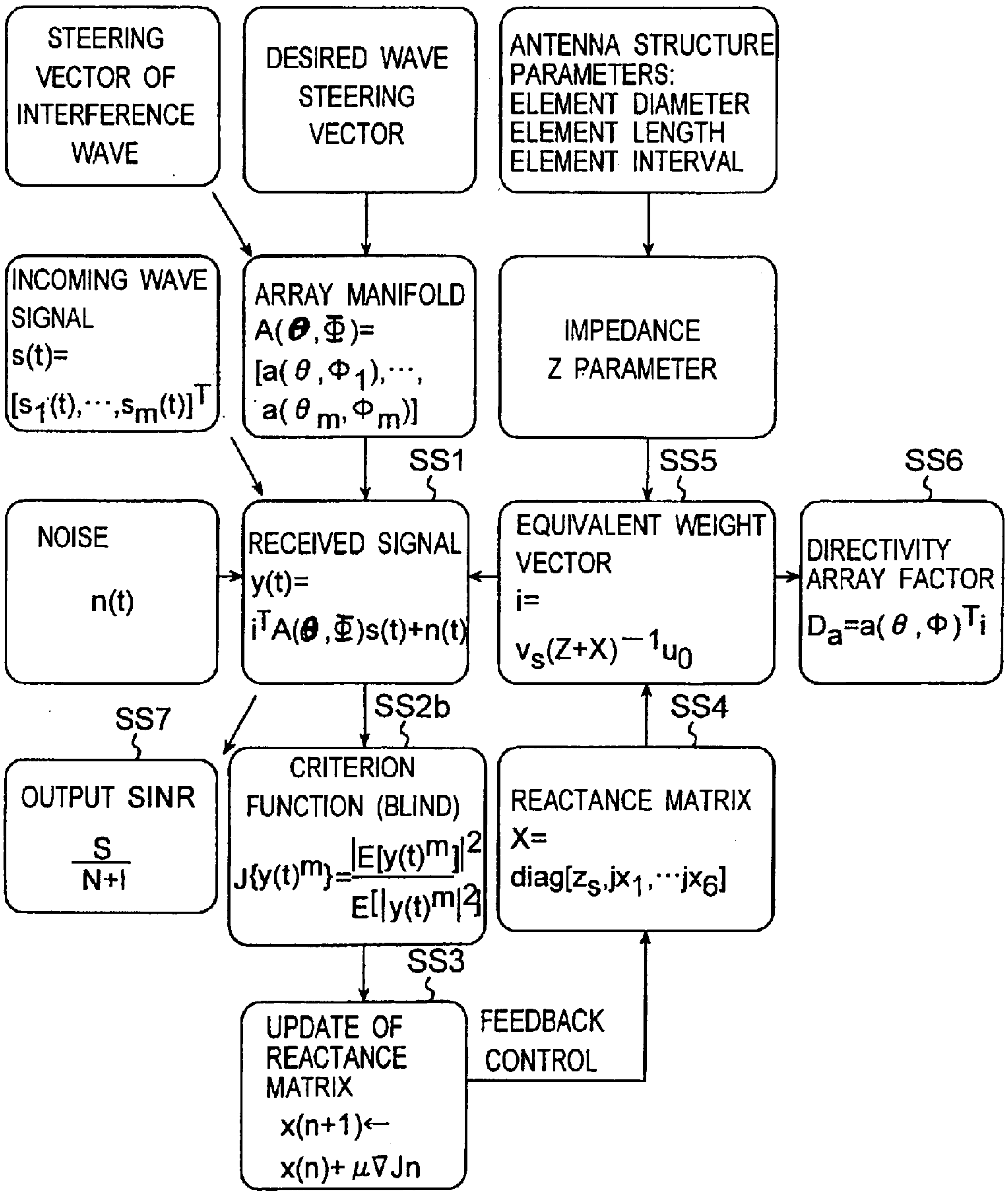
FIG. 22 is a diagram showing a simulation flow of blind adaptive beam formation executed by the ESPAR antenna apparatus 100 of FIG. 19.
Figure 23:
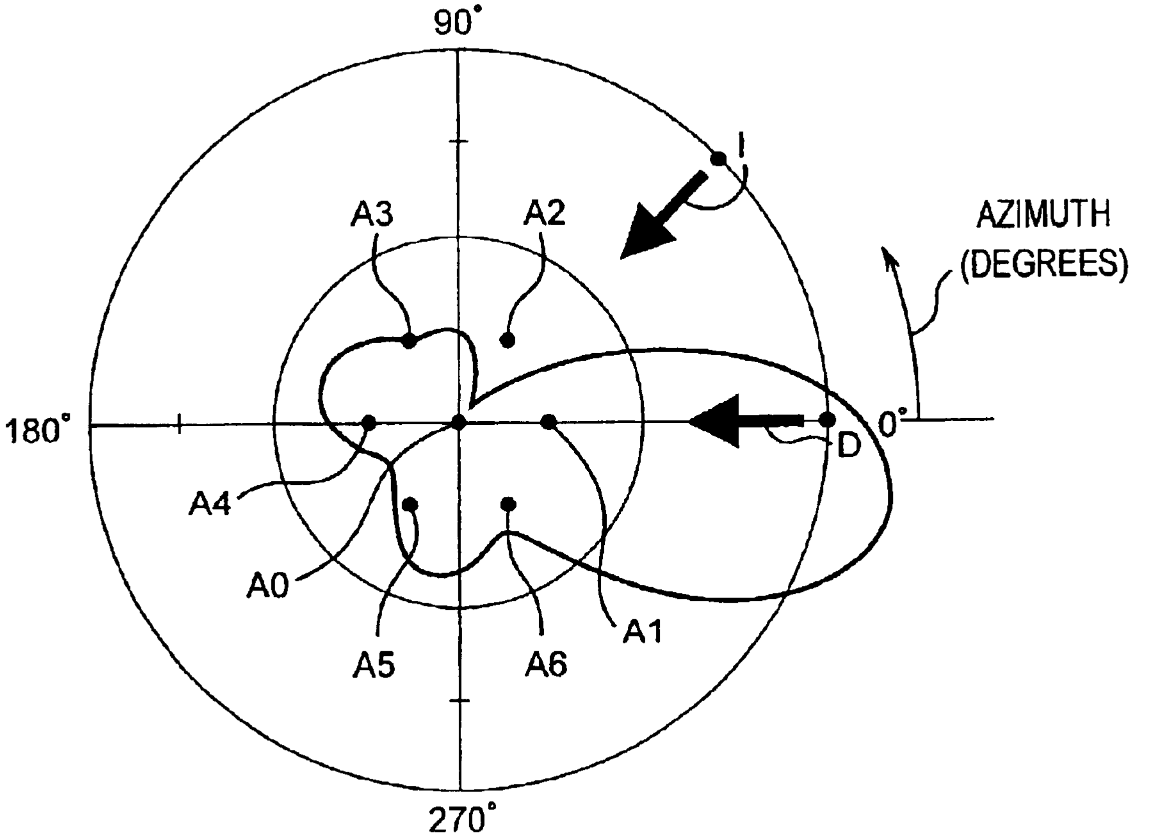
FIG. 23 is a directivity characteristic chart showing a radiation power pattern when an interference wave is directed in a direction of an angle of 45 degrees according to simulation results of FIG. 22.
Figure 24:
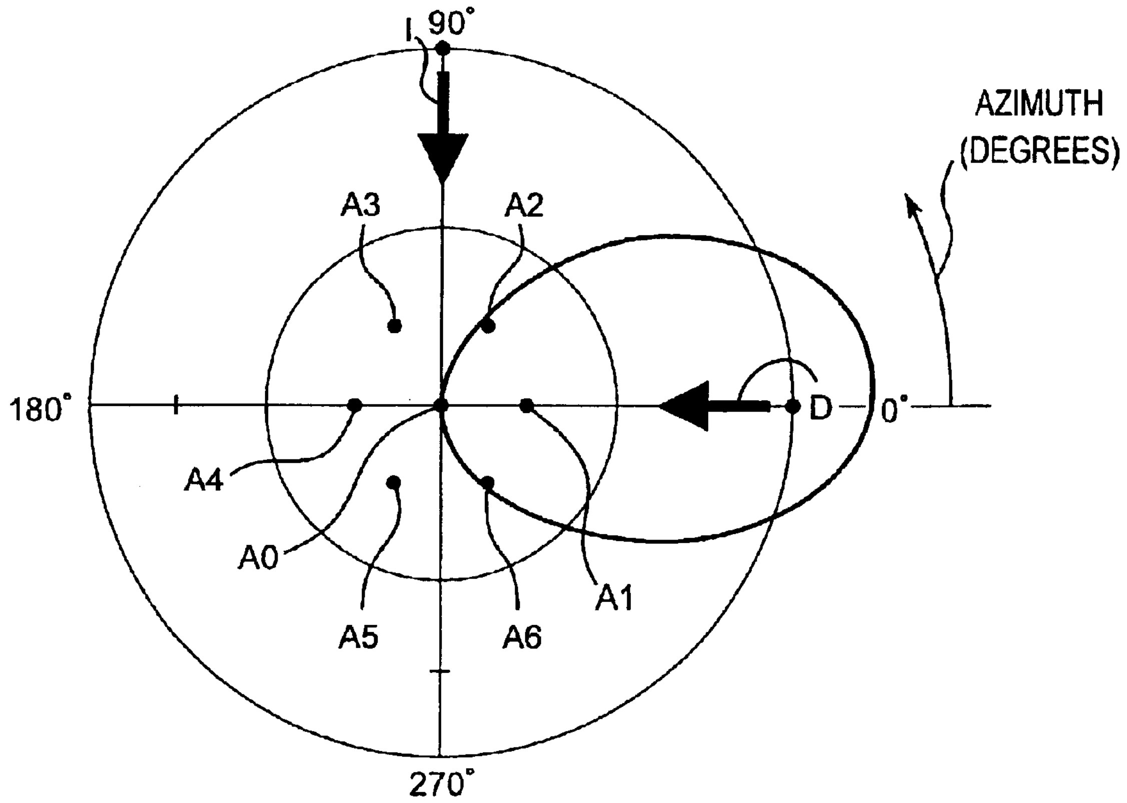
FIG. 24 is a directivity characteristic chart showing a radiation power pattern when the interference wave is directed in a direction of an angle of 90 degrees according to the simulation results of FIG. 22.
Figure 25:
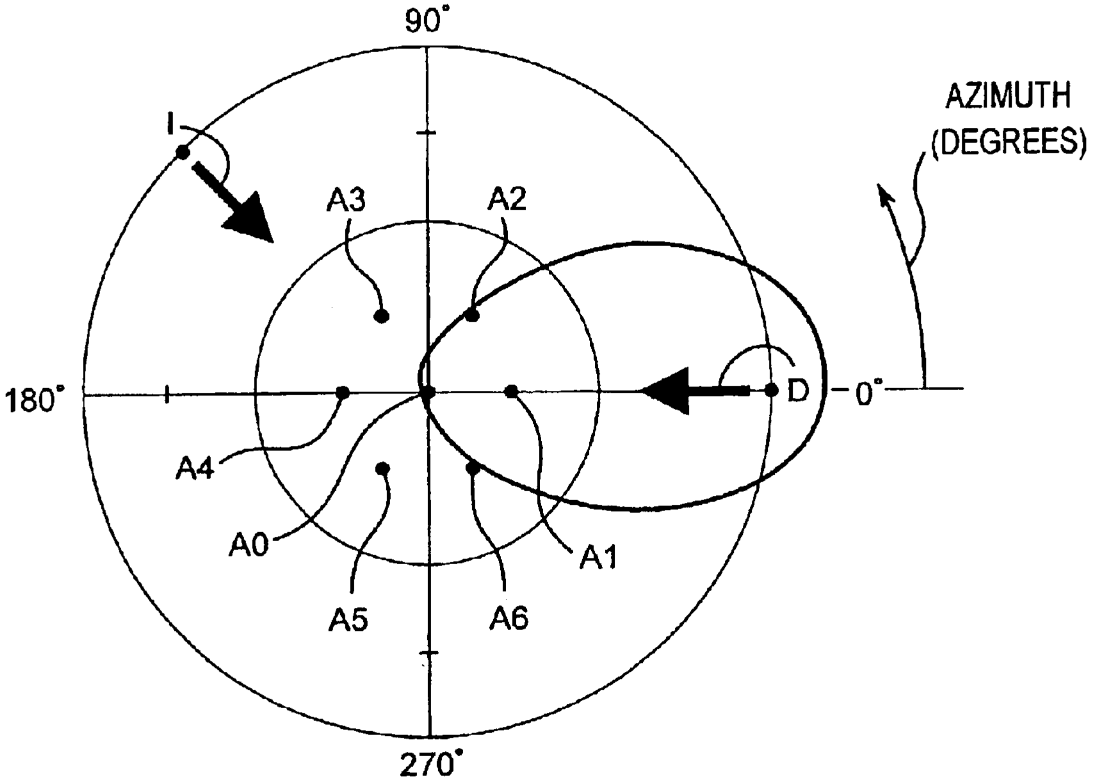
FIG. 25 is a directivity characteristic chart showing a radiation power pattern when the interference wave is directed in a direction of an angle of 135 degrees according to the simulation results of FIG. 22.
Figure 26:
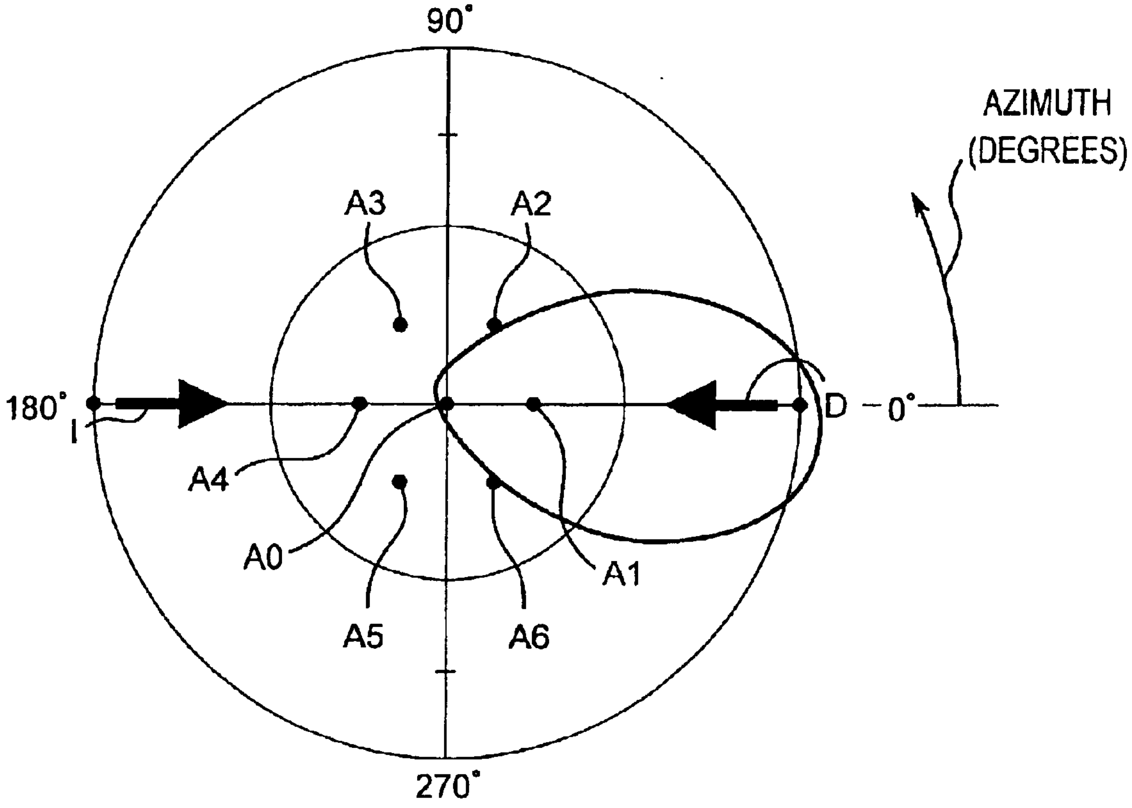
FIG. 26 is a directivity characteristic chart showing a radiation power pattern when the interference wave is directed in a direction of an angle of 180 degrees according to the simulation results of FIG. 22.

FIG. 22 is a diagram showing a simulation flow of a blind adaptive beam formation executed by using the ESPAR antenna apparatus 100 of FIG. 19. In a manner similar to that of the above-mentioned formulation model, this simulation utilizes a half-wavelength dipole antenna as the radiating element A0 and utilizes six dipole antennas arranged in a circular array as the parasitic elements A1 to A6. Moreover, it is assumed that the directions in which the desired wave and the interference wave arrive at the ESPAR antenna apparatus 100 are unknown (adaptive control) and no training signal is used (blind processing).

According to the simulation flow of FIG. 22, the adaptive control of the antenna beam is performed by executing the processing of steps SS1 to SS5 (where step SS2*b* is different from step SS2 of FIG. 5 and step SS2*a* of FIG. 7) on the basis of the steering vector of the interference wave, the steering vector of the desired wave, the parameters of the antenna structure, the incoming wave signal and the noise, and finally, the directivity array factor and an output SINR are calculated and outputted (in steps SS6 and SS7). The processing in these steps SS1 to SS7 calculates the criterion function $J\{y(t)^m\}$ on the basis of the received signal y(t), calculates a reactance matrix by updating the reactance matrix, and thereafter, calculates an equivalent weight vector. Then, the directivity array factor is calculated from the equivalent weight vector, while the output SINR is calculated from the received signal y(t) and the noise n(t).

According to this simulation, it is assumed that the directions in which the desired wave and the interference wave arrive at the ESPAR antenna apparatus 100 are unknown (adaptive control) and no training signal is used (blind processing). This simulation performs simulation in an environment in which the interference wave also comes at the same time in addition to the desired wave. It is assumed that the desired wave and the interference wave are QPSK-modulated signals, and the noise is an additive Gaussian noise. All of these desired wave, the interference wave and the noise are assumed to have no cross correlation on each other. For the sake of simplicity, the band-limiting filter, delay diffusion or widening, angular diffusion or widening, fading, Doppler effect and synchronization errors in the transmission path are all ignored. Under these conditions, the reactance values of the six variable reactance elements 12-1 to 12-6 are controlled on the basis of the above-mentioned criterion function. The antenna structure parameters used for the simulation were the controlled element count: 6, the element intervals: quarter wavelength in all, the radius of each dipole: 1/100 wavelength, and the wavelength contraction ratio in the lengthwise direction of the element: 0.926. Moreover, the internal impedance of the RF transmitter-receiver connected to the ESPAR antenna apparatus 100 is assumed to be $z_s$=50 Ω. As an optimization algorithm, there are the candidates of the pure random search method, the steepest gradient method, the higher dimensional dichotomy method, the sequential random method, the regression step method and a method according to Hamiltonian dynamics, and a calculation example using the steepest gradient method is herein described.

It is assumed that the desired wave and the interference wave have respective levels of +6 dBn and 0 dBn (dBn is a power expression based on the noise level). FIGS. 23 to 26 show control results and directivity patterns (power patterns) of the variable reactance elements when the arrival azimuth of the desired wave is fixed to 0° and the arrival azimuth of the interference wave is set to angles of 45°, 90°, 135° and 180°. The symbols D and I on the circumference of the polar chart indicate the arrival bearings of the desired wave and the interference wave, respectively. As is apparent from FIGS. 23 to 26, with regard to all of the four patterns, it can be understood that the main beam is formed almost in the arrival direction of the desired wave and deep null points are concurrently formed in the directions of the interference waves.

As described above, according to the present preferred embodiment, there has been described the fact that the ESPAR antenna apparatus 100 can achieve blind beam formation by the appropriate criterion and feedback control in the case of m-PSK wave reception regardless of the simple hardware configuration thereof.

In the above-mentioned preferred embodiment, the criterion function of the Equation (24) is used. However, the time mean E(•) in the Equation (24) may be a mean value of a plurality of data signals for a predetermined time interval of, for example, one symbol when a data signal transmitted by, for example, the frequency-division multiplex system is received at a time and subjected to parallel processing.

Supplemental Description of Fifth and Sixth Preferred Embodiments

In the present supplemental description, the physical meaning of the criterion function $J\{y(t)^m\}$ of the BPSK-modulated signal will be described below.

It is assumed that a noise n is superimposed on the transmitted signal x and the received signal y(t) is expressed by the following equation:

$$y(t)=x(t)+n(t) \quad (25).$$

In this case, it is assumed that n(t) has a waveform on which thermal noises or numbers of interference waves are superimposed with random amplitude and random phase. It is assumed that the values of these time waveform signals y(t), x(t) and n(t) at a certain sampling time are expressed as y, x and n, respectively. Moreover, it is assumed that no DC offset exists in the transmitted and received signals. It is sometimes the case where a DC offset occurs in the actual radio receiver 10. However, a mean value or average value (expected value) E[y] of the DC offset value of the received signal is an observable quantity, and therefore, the offset value can be zeroized by regarding a value obtained by subtracting this from the received signal as a renewed received signal. That is, generality is not lost even with the following equations:

$$E[y]=0 \quad (26),$$

$$E[x]=0 \quad (27), \text{ and}$$

$$E[n]=0 \quad (28).$$

If the Equation (25) is substituted into a criterion function $J(y^2)$ of the BPSK (m=2)-modulated signal, the following equation is obtained:

$$J(y^2) = \frac{|E[y^2]|^2}{E[|y^2|]} = \frac{|E[x^2]+2E[xn]+E[n^2]|^2}{E[|x^2+2xn+n^2|^2]}. \quad (29)$$

The second term in the numerator of the Equation (29) has no cross correlation between the transmitted signal x and the noise n, and therefore, the following equation holds:

$$2E[xn]=2E[x]E[n]=0 \quad (30),$$

Further, in the third term thereof, the real part (I-channel component) and the imaginary part (Q-channel component) of the noise n have equal power and no cross correlation, and therefore, the following equation is obtained:

$$\begin{aligned} E[n^2] &= E[(n_r+jn_i)^2] \\ &= E[n_r^2]-E[n_i^2]+2jE[n_rn_i] \\ &= 0. \end{aligned} \quad (31)$$

Therefore, the numerator of the Equation (29) becomes only the term of $|E[x^2]|^2$. Next, if the denominator of the Equation (29) is expanded, then the following equation results:

$$E[|y^2|^2] = E[|x|^4]+4E[|x|^2|n|^2]+E[|n|^4]+ 2\mathrm{Re}\{2E[2x^2x^*n^*]+2E[2xnn^{2*}]E[x^2n^{2*}]\}. \quad (32)$$

In the Equation (32), Re(•) represents the real part of an argument, the superscript symbol * represents a complex conjugate, and so forth. If the Equation (30) and the Equation (31) are used for this, then the following equation is obtained:

$$\begin{aligned} E[|y^2|^2] &= E[|x|^4]+4E[|x|^2]E[|n|^2]+E[|n|^4]+ \\ &\quad 2\mathrm{Re}\{4E[2x^2x^*]E[n^*]+4E[x]E[nn^{2*}]+E[x^2]E[n^{2*}]\} \\ &= E[|x|^4]+4E[|x|^2]E[|n|^2]+E[|n|^4]. \end{aligned} \quad (33)$$

The following expressions:

$$E[|x|^2]=S \quad (34), \text{ and}$$

$$E[|n|^2]=N \quad (35),$$

which appear in these equations mean the mean powers of the transmitted signal x and the noise n, respectively. The real part (I-channel component) and the imaginary part (Q-channel component) of the noise have no cross correlation and become an equal power as expressed by the following equation:

$$E[n_r^2]=E[n_i^2]=\frac{N}{2}. \quad (36)$$

The transmitted signal x is the BPSK-modulated signal, i.e., expressed by the following equation:

$$x\in\{a,-a\};\ a \text{ is complex constant} \quad (37), \text{ and}$$

therefore, the signal mean power (for a predetermined time interval) is expressed by the following equation:

$$S=E[|x|^2]=|a|^2 \quad (38).$$

Next, the numerator of the Equation (29) becomes the following equation:

$$|E[x^2]|^2=|a|^4=S^2 \quad (39).$$

If the noise n has a Gaussian distribution, then the real part and the imaginary part thereof come to have normal distributions. If the formula of the biquadratic center moment of the normal distribution is applied to them, then the following equation is obtained:

$$E[n_r^4]=3(E[n_r^2])^2=E[n_i^4]=3(E[n_i^2])^2=3\left(\frac{N}{2}\right)^2. \quad (40)$$

If this equation is used, then the last term of the Equation (33) is expressed by the following equation:

$$\begin{aligned} E[|n|^4] &= E[|n_r+jn_i|^4] \quad (41)\\ &= E\left[(n_r^2+n_i^2)^2\right]\\ &= E[n_r^4]+E[n_i^4]+2E[n_r^2n_i^2]\\ &= 3(E[n_r^2])^2+3(E[n_i^2])^2+2E[n_r^2]E[n_i^2]\\ &= 3\left(\frac{N}{2}\right)^2+3\left(\frac{N}{2}\right)^2+2\left(\frac{N}{2}\right)\left(\frac{N}{2}\right)\\ &= 2N^2. \end{aligned}$$

If the Equation (34), the Equation (35), the Equation (38) and the Equation (41) are substituted into the Equation (33), then the following equation is obtained:

$$E[|y^2|^2]=S^2+4SN+2N^2 \quad (42)$$

If the Equation (39) and the Equation (42) are substituted into the Equation (29), then the following equation is obtained:

$$J(y^2)=\frac{S^2}{S^2+4SN+2N^2}=\frac{(S/N)^2}{(S/N)^2+4(S/N)+2}. \quad (43)$$

This means a function of only the signal to noise ratio and indicates that the function monotonously increases. The demonstration is ended as above.

Seventh Preferred Embodiment

Figure 27:
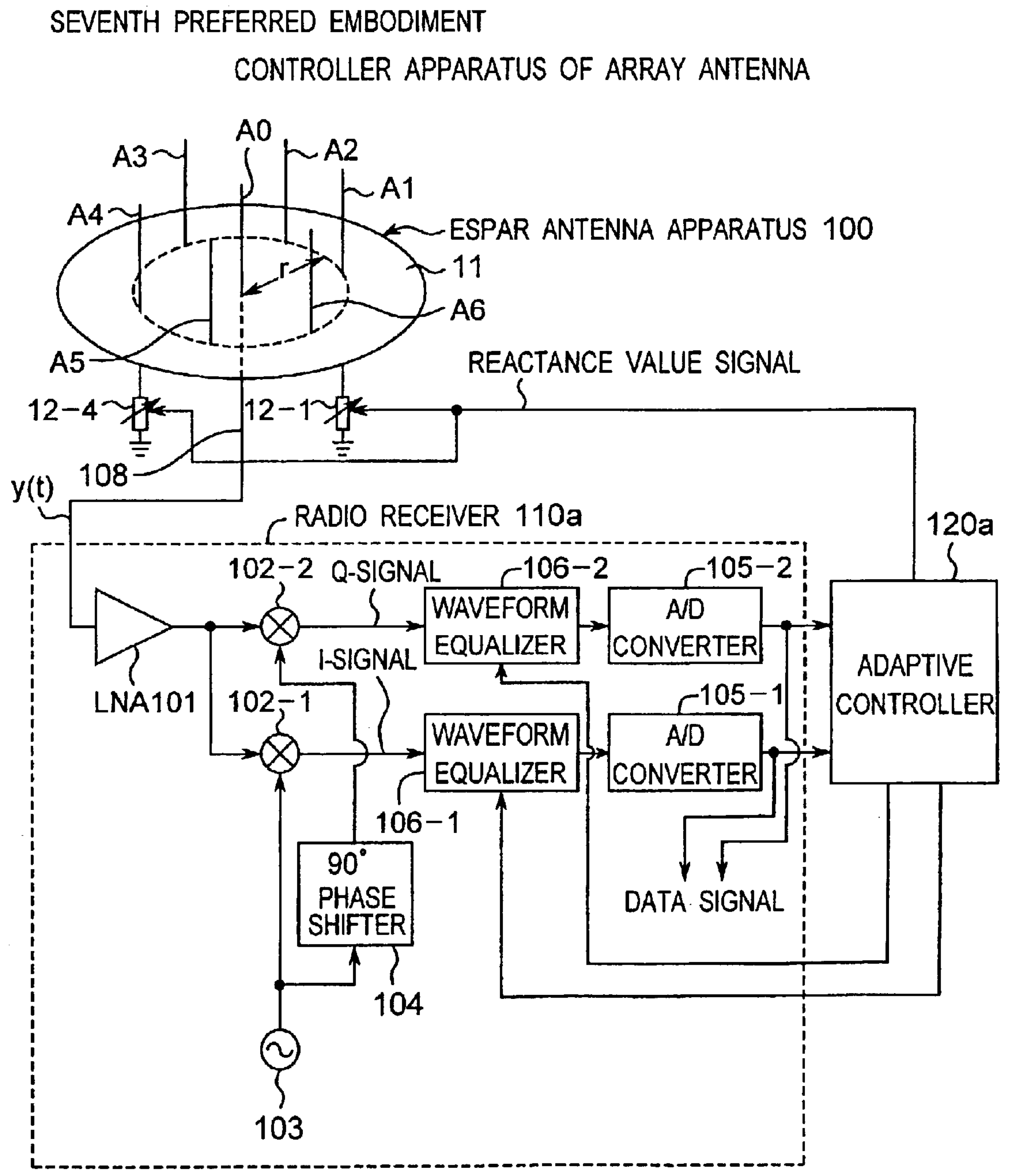
FIG. 27 is a block diagram showing a construction of a controller apparatus of an array antenna according to a seventh preferred embodiment of the present invention.

FIG. 27 is a block diagram showing a construction of a controller apparatus of an array antenna according to a seventh preferred embodiment of the present invention. The controller apparatus of the array antenna of the present preferred embodiment differs from that of the fifth preferred embodiment of FIG. 19 in the following points.

(1) In place of the radio receiver 110, there is provided a radio receiver 110*a* further provided with waveform equalizers 106-1 and 106-2 in the radio receiver 110 that receives the m-PSK signal.

(2) In place of the adaptive controller 120, there is provided an adaptive controller 120*a*, which calculates the value of the above-mentioned criterion function, calculates the signal to noise power ratio of the received signal using the equation that expresses the relationship between the criterion function and the signal to noise power ratio on the basis of the calculated criterion function and adaptively controls the waveform equalizers 106-1 and 106-2 so that the calculated signal to noise ratio becomes substantially maximized in the adaptive controller 120*a*.

Before explaining FIG. 27 in detail, the definition of a functional, which is a criterion function, and a method for calculating the signal to noise power ratio will be described below.

In order to perform adaptive feedback control of a variable signal waveform equalizer, a signal filter and a linearizer for the optimum reception in the radio receiver, estimation of the signal to noise ratio becomes effective means. In particular in the radio receiver apparatuses of FIGS. 19 and 27, which use neither a training reference signal nor a signal replica, it is required to establish a signal to noise ratio estimation technology of blind operation. Up to now, blind estimation functions using the statistical expected value and the dispersion of received data have been proposed in a fourth prior art document of "T. A. Summers et al., "SNR Mismatch and Online Estimation in Turbo Decoding", IEEE Transaction on Communications, Vol. COM-46, No. 4, pp.421–423, April, 1998", a fifth prior art document of "A. Ramesh et al., "SNR Estimation in Generalized Fading Channels and its Application to Turbo Decoding", Proceeding of. IEEE ICC 2001, Helsinki, June, 2001", and a sixth prior art document of "TAKIZAWA et al., "Efficient Estimation Scheme of Channel State Information for Parallel Combinatorial SS Systems (2)", Proceeding of General National Meeting of The Institute of Electronics, Information and Communication Engineers in Japan, A-5-6, pp. 188, March, 2002". These references are based on BPSK as a modulation system and on the assumption that synchronous detection is completely established in demodulation. Moreover, since the noise is treated as a real number in these fourth, fifth and sixth prior art documents, a phase fluctuation due to noise is not taken into consideration.

From the viewpoint of a more practicable radio system, the present preferred embodiment proposes a blind estimation method, which can be applied to multi-phase PSK and operates even in a "quasi-synchronization" state in which the complete synchronization is not established. First of all, paying attention to the characteristic property of the m-PSK modulation, a functional based on the m-th order moment of the received signal is defined. Next, the complex Gaussian noise and the moment of the multi-phase PSK signal are formulated to a higher dimension. By using them, there is analytically described the fact that the function of the present preferred embodiment becomes an estimation index of the signal to noise ratio. Further, the statistical behavior of the present functional in a system in which a signal of a finite data length and an additive Gaussian noise exist in mixture is expressed by computer simulation.

First of all, the definition of the functional will be described below. It is assumed that noise n(t) is added to an m-PSK signal x(t) and the complex number of the following equation is observed at a certain sampling time $t=t_s$:

$$s(t_s)+n(t_s)=y(t_s) \quad (44).$$

In this case, paying attention to the characteristic property of the m-PSK modulation, a functional utilizing this is proposed. The property to which attention is paid here is the fact that “the m-PSK signal becomes a constant complex value when raised to the m-th power regardless of the modulation data”. If it suffers from noise or interference in the communication path, then a fluctuation from this constant complex value is observed on the reception side. The smaller the fluctuation, the higher the signal to noise ratio is considered to be. Accordingly, it is proposed to adopt a cross correlation coefficient to a constant complex number C as a standard of the fluctuation of the value raised to the m-th power assuming the signal $y(t_s)$ to be a probability variable. In general, the similarity to two functions $f_1$ and $f_2$ is expressed by the cross correlation coefficient $\rho\{f1, f2\}$ of the following equation:

$$\rho\{f_1, f_2\} = \frac{E[f_1 f_2^*]}{\sqrt{E[|f_1|^2]E[|f_2|^2]}}, \quad (45)$$

where E[•] is an operator for calculating the ensemble mean for a predetermined time interval (mean value for a predetermined time interval) of the variable •. In this general formula, there is provided the following equation:

$$f_1=y(t_s)^m, f_2=C \quad (46), \text{ and}$$

the functional of the following equation that takes the square of its absolute value is defined:

$$J_m\{y(t)\} = |\rho\{y(t_s)^m, C\}|^2 = \frac{|E[y(t_s)^m]|^2}{E[|y(t_s)^m|^2]}. \quad (47)$$

This functional is an index showing such a fact that the similarity between a value raised to the m-th power of the received signal and an arbitrary constant C, i.e., the value raised to the m-th power of the received signal is strictly constant without fluctuation. Moreover, this functional can also be interpreted as the one obtained by normalizing the m-th order moment of the received signal by the mean power of the signal raised to the m-th power. This fact means that this functional is an invariant with respect to the change with the lapse of time of the absolute gain of the antenna and the receiver circuit system and to the fixed phase rotation and provides an important advantage in practical applications to the actual radio systems.

The high-order moment of the PSK signal will be further described. If the m-PSK signal is sampled in the quasi-synchronization state, then the complex variable s of the following equation is observed:

$$s=a_o e^{j(\delta\omega t+\phi_o+\psi)} \quad (48), \text{ and}$$

$$\psi=2\pi d/m;\ d\in\{0,1,2, \ldots, (m-1)\} \quad (49),$$

where $a_0$ is an initial amplitude, $\phi_o$ is an initial phase, d is information data and δ is a frequency deviation due to synchronization deviation. If s is regarded as a probability variable, then the k-th order moment thereof becomes expressed by the following equation:

$$E[s^k]=E[a_o{}^k e^{jk(\delta\omega t+\phi_o+\psi)}]=a_o{}^k e^{jk\delta\phi_o}E[e^{jk\delta\omega t}]E[e^{jk\psi}] \quad (50).$$

In this case, assuming that the second and subsequent terms of δω are ignored on the postulation that the quasi-synchronization, i.e., the frequency deviation is smaller than an averaging operation time T, the frequency deviation and the information data have no correlation and the information data d is uniformly distributed in a range from zero to m−1, then the following equation is obtained:

$$E[s^k] = \begin{cases} 0 & ;\text{when } k \bmod m \neq 0 \\ a_o^k e^{jk\delta\phi_o} e^{jk\delta\omega T/2} & ;\text{when } k \bmod m = 0 \end{cases}. \quad (51)$$

On the other hand, the absolute value is expressed by the following equation regardless of the value m:

$$|s|=a_o \quad (52), \text{ and}$$

the high-order moment of the absolute value simply can be expressed by the following equation:

$$E[|s|^k] = E[a_o^k] = a_o^k = \sqrt{S}^k, \quad (53)$$

where S is the mean power of the PSK signal.

The high-order moment of the Gaussian noise will be described next. A signal on which thermal noises generated in the reception system and numbers of waves are superimposed with random amplitude and random phase can be treated as a Gaussian noise. In the PSK demodulation system, it is required to treat the sample value of the Gaussian noise as a complex number constructed of the real part (I-channel component) and the imaginary part (Q-channel component) (the noise is treated as the real number in the fourth and fifth prior art documents). This is herein expressed as a complex number according to the following equation:

$$n+n_r+jn_i \quad (54),$$

where the noise n has no DC offset, and its mean power is expressed as N. The real part and the imaginary part have normal distributions of equal power and a zero DC bias. That is, the following equation is obtained:

$$E[n_r] = E[n_i] = 0;\ E[n_r^2] = E[n_i^2] = \frac{N}{2}. \quad (55)$$

Next, according to the symmetric property of the normal distribution, their odd-order moments are all zero, i.e., the following equation is obtained with regard to an arbitrary positive integer p:

$$E[n_r^{2p+1}] = E[n_i^{2p+1}] = 0. \quad (56)$$

In this case, if the recurrence formula of the even-order moment of the normal distribution is applied to the real part $n_r$ and the imaginary part $n_i$, then the following equation is obtained:

$$\begin{aligned} E[n_r^{2p}] = E[n_i^{2p}] &= (2p-1)\cdot E[n_i^2]E[n_i^{2p-2}] \\ &= 1\cdot 3\cdot 5\cdot 7\cdots(2p-1)\cdot(E[n_i^2])^p \\ &= \prod_{k=1}^{p}(2k-1)\cdot\left(\frac{N}{2}\right)^p. \end{aligned} \quad (57)$$

In this case, the real part $n_r$ and the imaginary part $n_i$ are independent of each other, and have zero bias, and therefore, the coupled moment is expressed by the following equation:

$$E[n_r n_i]=E[n_r]E[n_i]=0 \quad (58).$$

The amplitude and the phase of the Gaussian noise are mutually independent, and the phase is uniformly distributed in a range from zero to 2π. Therefore, its moment is expressed by the following equation with regard to arbitrary number of orders p:

$$E[n^p]=E[(|n|e^{j\angle n})^p]=E[|n|^p]E[e^{jp\angle n}]=0 \quad (59).$$

On the other hand, with regard to the even-order moment of the absolute value of the Gaussian noise, the following equation is obtained by utilizing the above-mentioned recurrence formula:

$$\begin{aligned} E[|n|^{2p}] &= E[|n_r + jn_i|^{2p}] = E[(n_r^2 + n_i^2)^p] \quad (60)\\ &= \sum_{k=0}^{p} \frac{p!}{k!(p-k)!} E[n_r^{2k}]E[n_i^{2p-2k}]\\ &= \sum_{k=0}^{p} \frac{p!}{k!(p-k)!} E[n_r^{2k}]\cdot(2p-2k-1)\cdot E[n_i^2]E[n_i^{2p-2k-2}]\\ &= E[n_i^2]\cdot\sum_{k=0}^{p-1} \frac{p!}{k!(p-k-1)!} E[n_r^{2k}]E[n_i^{2p-2k-2}]\\ &= p\cdot N\cdot E[|n|^{2p-2}]\\ &= p\cdot N\cdot(p-1)\cdot N\cdot E[|n|^{2p-4}] =. \end{aligned}$$

By repeating this calculation, the following equation is obtained:

$$\therefore E[|n|^{2p}]=p!\cdot N^p \quad (61)$$

Since the signal and the noise are mutually independent and the high-order moment of the noise is zero, the higher-order coupled moment of them is also expressed by the following equation:

$$E[x^p n^q]=E[x^p]E[n^q]=0;\ p,q\in\{1,2,3,\ldots\} \quad (62).$$

The behavior of the functional will be described next. The physical meaning of the functional of the following equation defined hereinabove is considered:

$$J_m\{y(t)\} = \frac{|E[y^m]|^2}{E[|y^m|^2]}. \quad (63)$$

For the sake of simplicity, the expression of the time factor ($t_s$) is omitted hereinbelow. By substituting into this equation the following equation:

$$y=s+n \quad (64),\text{ and}$$

binominal expansion is performed with the numerator and the denominator separated, then the following equation is obtained:

$$\begin{aligned} \text{Numerator} &= |E[y^m]|^2 = |E[(s+n)^m]|^2 \quad (65)\\ &= \left|\sum_{k=0}^{m} \frac{m!}{(m-k)!k!} E[s^{m-k}n^k]\right|^2\\ &= \left|E[s^m] + \sum_{k=1}^{m-1} \frac{m!}{(m-k)!k!} E[s^{m-k}n^k] + E[n^m]\right|^2 \end{aligned}$$

The first term of the absolute value of the above equation means the signal power raised to the m-th power. Moreover, the middle term of the equation is zero since it is the coupled moment of the signal and the noise. Further, the last term of the equation is also zero since it is the moment of the noise. Eventually, only the first term is left, and the following equation is obtained:

$$\begin{aligned} \text{Numerator} &= |E[y^m]|^2 \quad (66)\\ &= |E[s^m]|^2 = |a_o^m|^2 = S^m \end{aligned}$$

Next, if the denominator is subjected to binominal expansion, then the following equation results:

$$\begin{aligned} \text{Denominator} &= E[|y^m|]^2 = E[|(s+n)^m|^2] \quad (67)\\ &= E\left[\left|\sum_{k=0}^{m} \frac{m!}{(m-k)!k!} s^{m-k}n^k\right|^2\right]\\ &= \sum_{k=0}^{m}\left\{\frac{m!}{(m-k)!k!}\right\}^2 E[|s|^{2m-2k}]E[|n|^{2k}]. \end{aligned}$$

If the high-order moment of the m-PSK signal and the noise are used for this, then the following equation is obtained:

$$\begin{aligned} \text{Denominator} &= \sum_{k=0}^{m}\left\{\frac{m!}{(m-k)!k!}\right\}^2\cdot S^{m-k}\cdot k!N^k \quad (68)\\ &= \sum_{k=0}^{m} \frac{m!^2}{(m-k)!^2k!} S^{m-k}N^k. \end{aligned}$$

According to them, the functional is expressed by the following equation:

$$J_m\{y(t)\} = \frac{|E[y^m]|^2}{E[|y^m|^2]} = \frac{1}{\sum_{k=0}^{m} \frac{m!^2}{(m-k)!^2k!}\left(\frac{N}{S}\right)^k}. \quad (69)$$

This is a function of only the signal to noise ratio and monotonously increased. According to the above, it has been described that the signal to noise ratio is estimated by using this functional without separating the signal from the noise. Moreover, this functional is defined by only the received signal y, and therefore, blind operation is achieved without using a transmitted signal replica.

With regard to the functional when the modulation system of the signal is BPSK, TPSK and QPSK as concrete examples, the following equation is obtained by setting m=2, 3, 4 in the above equation.

(1) In the case of *BPSK*

$$J_2(y) = \frac{S^2}{S^2+4SN+2N^2}, \quad (70)$$

(2) In the case of *TPSK*

$$J_3(y) = \frac{S^3}{S^3+9S^2N+18SN^2+6N^3},\text{ and} \quad (71)$$

(3) In the case of *QPSK*

$$J_4(y) = \frac{S^4}{S^4+16S^3N+72S^2N^2+96SN^3+24N^4}. \quad (72)$$

Figure 28:
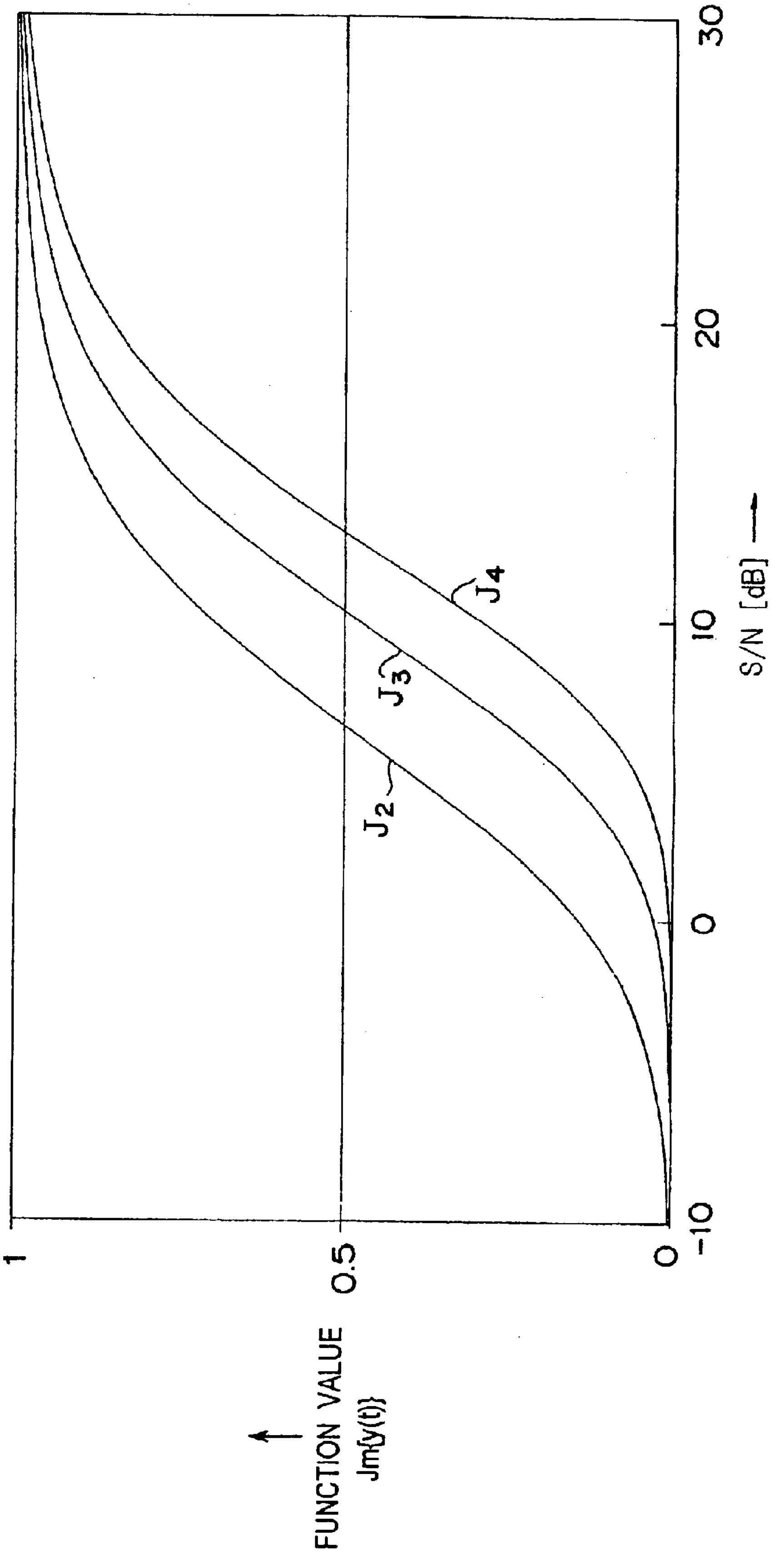
FIG. 28 is a graph showing theoretical values of functionals $J_2\{y(t)\}$, $J_3\{y(t)\}$ and $J_4\{y(t)\}$ with respect to a signal to noise power ratio used by a controller apparatus of the array antenna of FIG. 27.

These equations show the relationship between the functional and the signal to noise ratio. Upon detecting the received signal level, by calculating the value of the functional by using the Equation (69) and substituting the value of the functional into the Equation (70), the Equation (71) or the Equation (72), an equation of higher order of the signal to noise ratio results. By using the numerical solution of the equation of, for example, Newton's method, the solution of the signal to noise ratio can be calculated. If they are illustrated as a function of the signal to noise ratio, then this leads to the curves of FIG. 28. That is, FIG. 28 is a graph showing theoretical values of the functionals $J_2\{y(t)\}$, $J_3\{y(t)\}$ and $J_4\{y(t)\}$ with respect to a signal to noise power ratio used in the controller apparatus of the array antenna of FIG. 27. As is apparent from FIG. 28, it can be understood that the theoretical values of the functionals $J_2\{y(t)\}$, $J_3\{y(t)\}$ and $J_4\{y(t)\}$ monotonously increase as the signal to noise power ratio increases.

Next, the behavior of this functional with respect to the finite data length signal is simulated by a calculator. The procedure is as follows.

(1) The m-PSK signal series is generated from the random number data of the value m.

(2) This is split into the I channel and the Q channel.

(3) The real number Gaussian noise series of no cross correlation is added to each channel.

(4) They are substituted as a complex variable into the functional.

(5) The signal level is changed, and the above-mentioned procedure is repeated.

Figure 29:
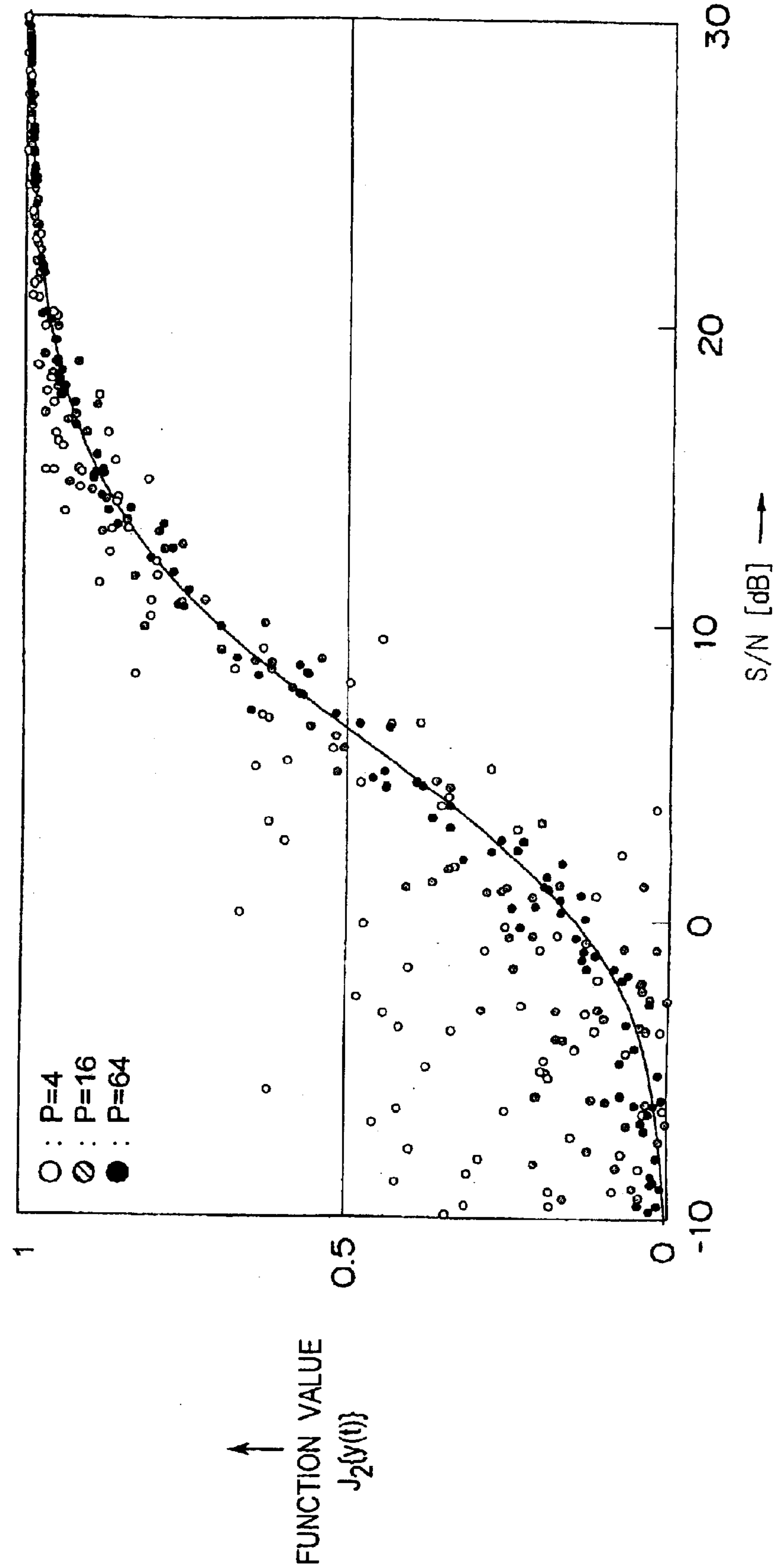
FIG. 29 is a graph showing theoretical values and simulation result values of the functional $J_2\{y(t)\}$ with respect to a signal to noise power ratio used by the controller apparatus of the array antenna of FIG. 27.
Figure 30:
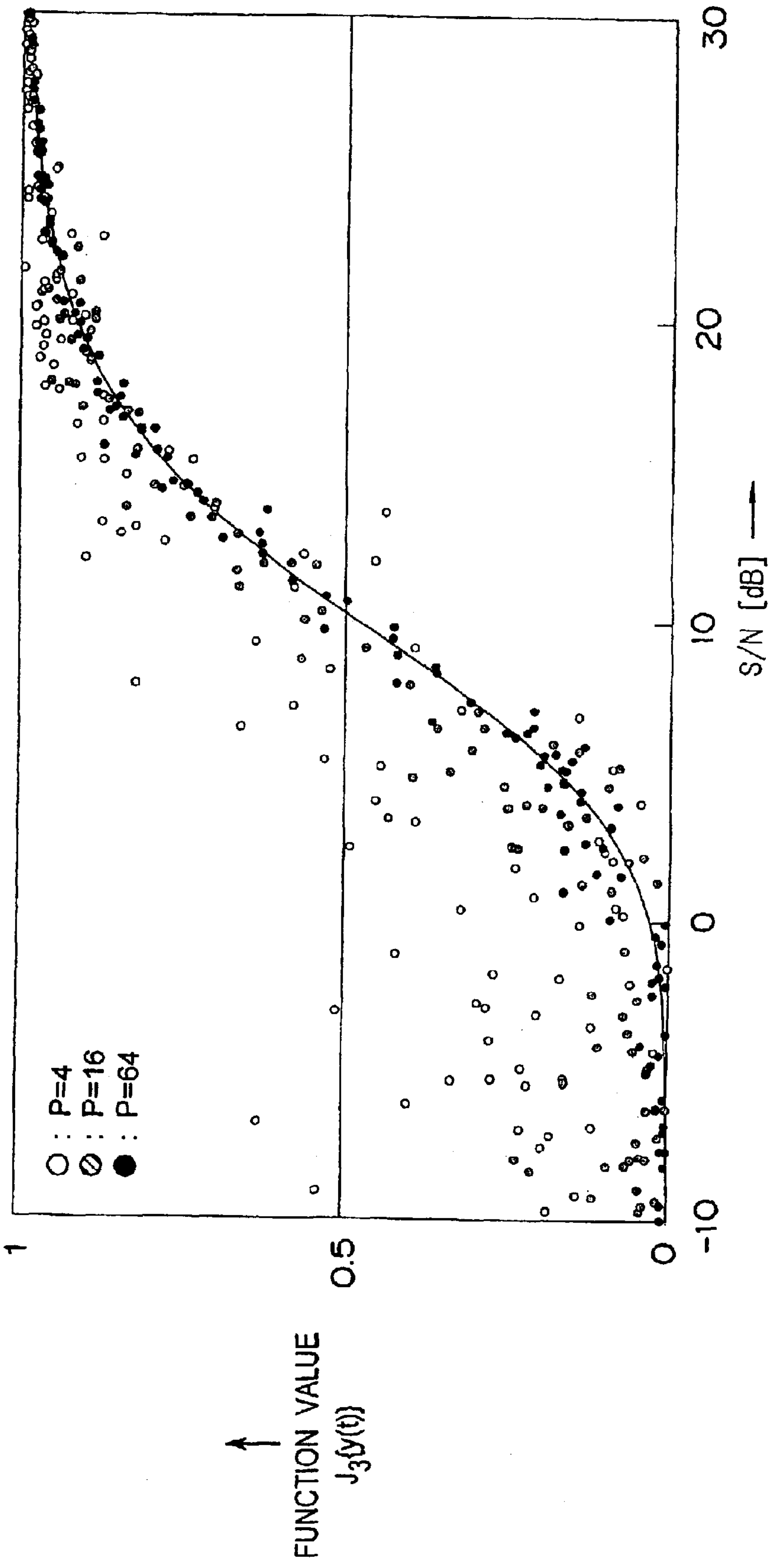
FIG. 30 is a graph showing theoretical values and simulation result values of the functional $J_3\{y(t)\}$ with respect to a signal to noise power ratio used by the controller apparatus of the array antenna of FIG. 27.
Figure 31:
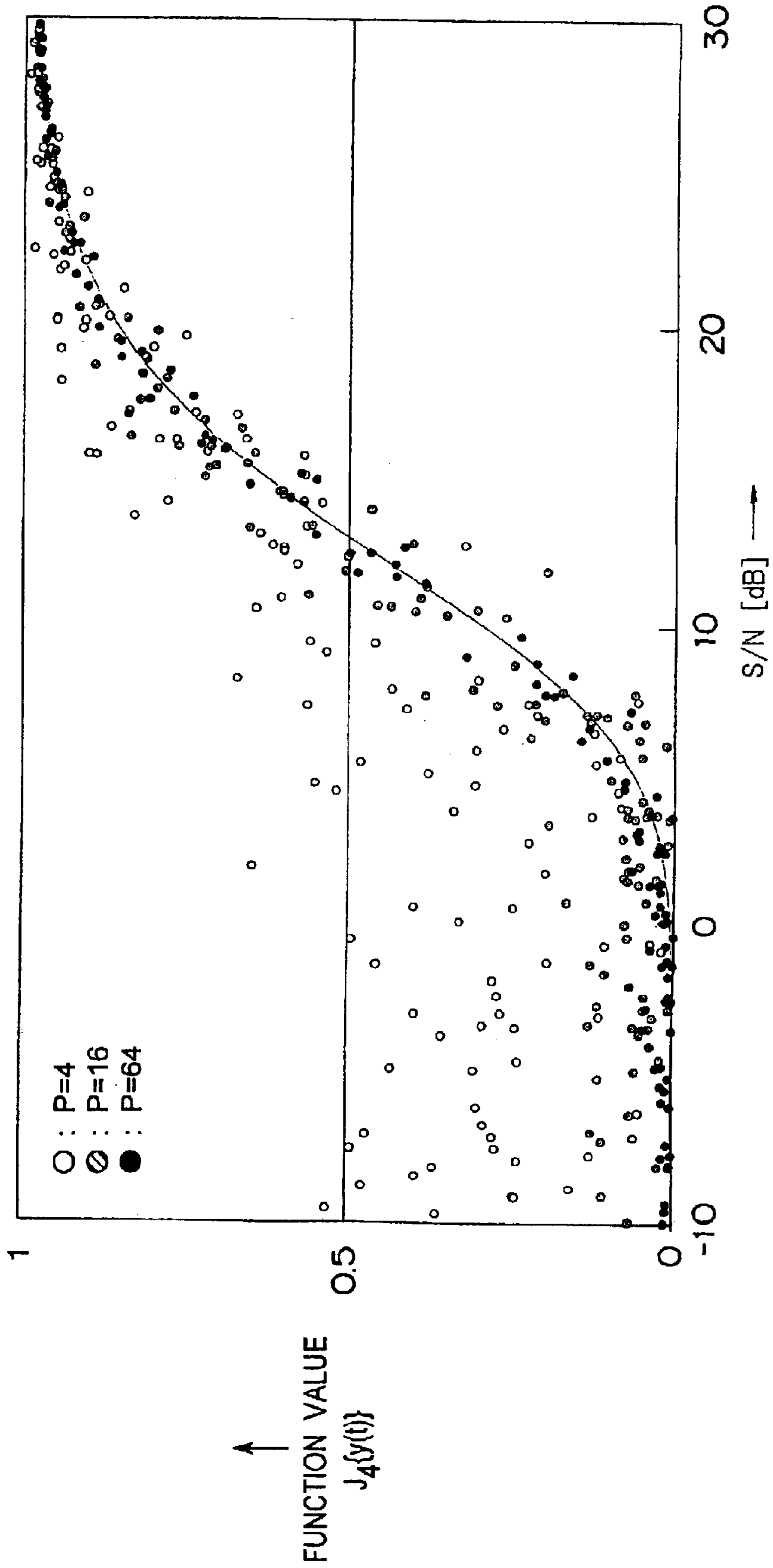
FIG. 31 is a graph showing theoretical values and simulation result values of the functional $J_4\{y(t)\}$ with respect to the signal to noise power ratio used by the controller apparatus of the array antenna of FIG. 27.

FIGS. 29 to 31 are graphs showing theoretical values and simulation results of the functionals $J_2\{y(t)\}$, $J_3\{y(t)\}$ and $J_4\{y(t)\}$, respectively, with respect to a signal to noise power ratio, for use in the controller apparatus of the array antenna of FIG. 27. As is apparent from FIGS. 29 to 31, since the random number data of finite length is used and the averaging operation E[•] has a fluctuation, there are variations in the functional calculation results. The variations are significant particularly in the region of the low signal to noise ratio. If the data length, i.e., the number of samples p for averaging is increased, then the resulting curve becomes gradually asymptotic to or approaches a monotonously increasing function. At the limit where "p" is infinite, the resulting curve coincides with the curve shown in FIG. 28.

Further, the adaptive control method using the above-mentioned functional for a radio receiver will be described with reference to FIG. 27.

In the radio receiver 110*a* of FIG. 27, a waveform equalizer 106-1 is inserted between a multiplier 102-1 and an A/D converter 105-1, and a waveform equalizer 106-2 is inserted between a multiplier 102-2 and an A/D converter 105-2. The waveform equalizers 106-1 and 106-2 are, for example, well-known transversal filters for controlling and equalizing the waveform of the PSK received signal by multiplying the received signal delayed by a plurality of varied delay quantities by a predetermined multiplication parameter. The adaptive controller 120*a* detects the received signal level on the basis of the output signals of the A/D converters 105-1 and 105-2 and calculates the value of the functional by using the Equation (69) in addition to the processing of the adaptive controller 120 of FIG. 19. By substituting the value of the functional into the Equation (70), the Equation (71) or the Equation (72), an equation of higher order of the signal to noise ratio results. This is subjected to the numerical solution of the equation of, for example, the Newton's method, by which the solution of the signal to noise ratio is calculated. Next, the adaptive controller 120*a* adaptively controls the multiplication parameters of the waveform equalizers 106-1 and 106-2 on the basis of the calculated signal to noise ratio so that the signal to noise ratio substantially becomes the maximum. With regard to the method for controlling a plurality of multiplication parameters, there can be used an iterative numerical solution of the nonlinear programming method such as the steepest gradient method, the sequential random method, the random method and the higher dimensional dichotomy method which are described hereinabove.

In the above-mentioned preferred embodiment, the analog waveform equalizers 106-1 and 106-2 are employed. However, the present invention is not limited to this, and it is acceptable to employ digital waveform equalizers. In this case, a digital waveform equalizer is inserted between the A/D converter 105-1 and the adaptive controller 120*a*, and a digital waveform equalizer is inserted between the A/D converter 105-2 and the adaptive controller 120*a* in place of the analog waveform equalizers 106-1 and 106-2.

In the above-mentioned preferred embodiment, the waveform equalizers 106-1 and 106-2 are employed as an object of the adaptive control based on the signal to noise ratio of the received signal. However, the present invention is not limited to this, and it is acceptable to employ signal processing means, such as a signal equalizer, a signal filter, a linearizer and a tuner of the radio receiver, which exerts influence on the signal to noise ratio of the received signal. In this case, for example, the signal filter is inserted in the position of the analog waveform equalizers 106-1 and 106-2 or the digital waveform equalizers and executes signal filtering processing in a predetermined band. Moreover, the linearizer is inserted in the position of the analog waveform equalizers 106-1 and 106-2 or the digital waveform equalizer and executes predetermined linear equalization processing. Further, the tuner is included in, for example, the control operation of the adaptive controller 120*a* and tunes the reception frequency of the radio receiver 110*a* to the signal frequency of the desired wave so that the frequencies become substantially equal to each other by controlling the local oscillation frequency of the local oscillator 3 on the basis of the calculated signal to noise ratio so that the signal to noise ratio becomes substantially maximized.

In the above-mentioned preferred embodiment, by formulating the moments of the complex Gaussian noise and the multi-phase PSK signal to the higher order and defining the functional paying attention to the signal constellation peculiar to the PSK modulation, there has been analytically described by the above-mentioned moment formula the fact that the functional becomes the estimation index of the signal to noise ratio. Further, the statistical behavior of the present functional in the system where the signal of the finite data length and the additive Gaussian noise exist in mixture has been described by the computer simulation. When the amount of data for the averaging is small, the dispersion is large particularly in the region of the low signal to noise ratio. If the amount of data is increased, then the resulting curve becomes gradually asymptotic to or approaches the monotonous increase curve derived analytically, and it is enabled to estimate and calculate in real time the signal to noise ratio with high accuracy. The present functional, which is easy to calculate and needs no synchronous detection, and therefore, it can be used as a blind control criterion for adaptive reception systems and so on for simple consumer uses.

The above-mentioned preferred embodiment is provided with the six parasitic elements A1 to A6 and the variable reactance elements 12-1 to 12-6 corresponding to them. However, the present invention is not limited to this, and it is acceptable to provide at least one parasitic element A1 and a variable reactance element 12-1 corresponding to the same parasitic element A1. Also, the number of the elements may be plural.

According to the radio receiver adaptive control method of the present preferred embodiment, the signal to noise ratio of the received signal is calculated by the calculation method of the signal to noise ratio of the received signal, and the signal processing means, which is the signal equalizer or the signal filter of the radio receiver, is adaptively controlled on the basis of the calculated signal to noise ratio so that the calculated signal to noise ratio substantially becomes the maximum. Therefore, the signal processing means of the radio receiver can be adaptively controlled in real time with high accuracy.

Eighth Preferred Embodiment

Figure 32:
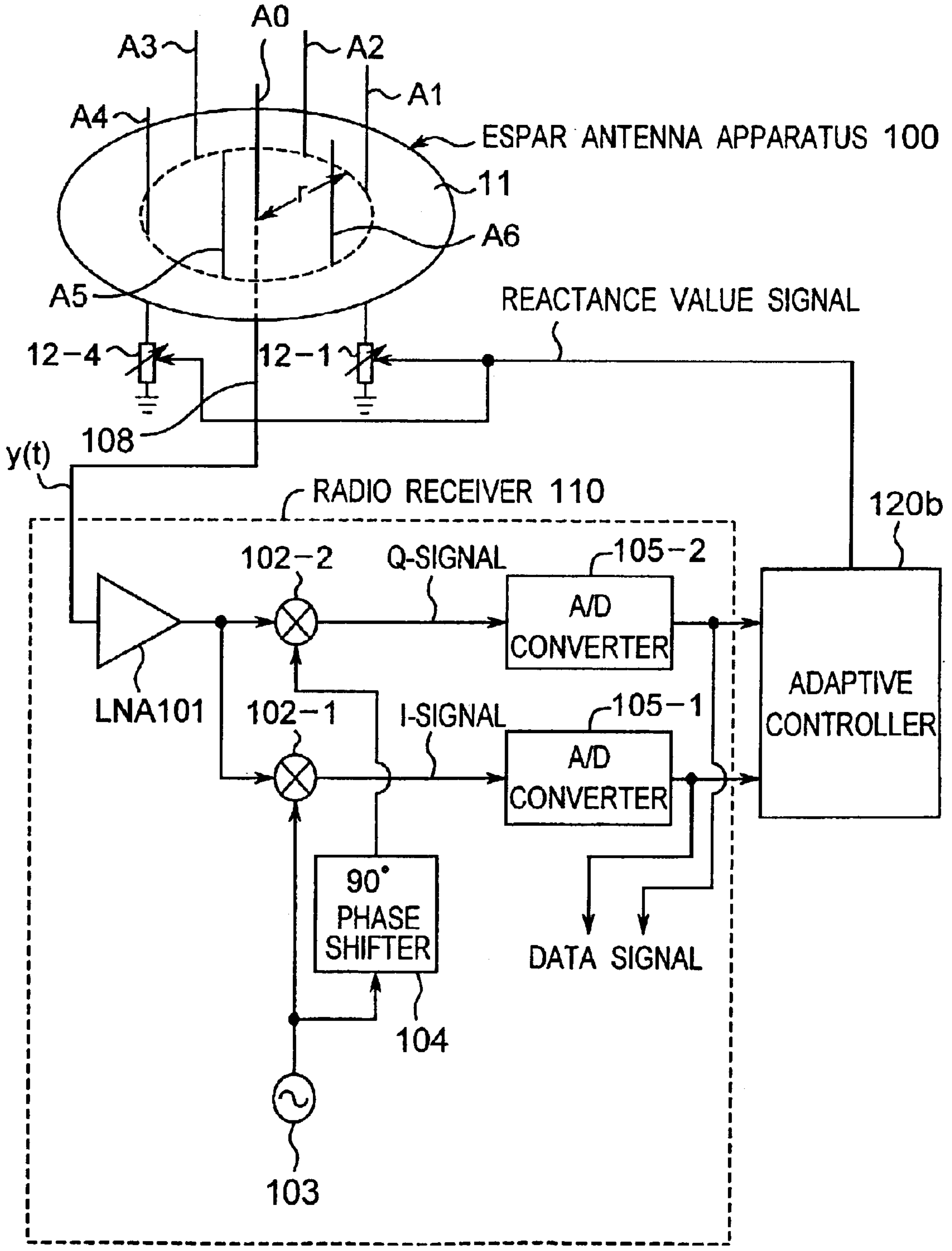
FIG. 32 is a block diagram showing a construction of a controller apparatus of an array antenna according to an eighth preferred embodiment of the present invention.

FIG. 32 is a block diagram showing a construction of a controller apparatus of an array antenna according to an eighth preferred embodiment of the present invention. As shown in FIG. 32, the controller apparatus of the array antenna of the present preferred embodiment is constructed of an ESPAR antenna apparatus 100 provided with one radiating element A0 and six parasitic elements A1 to A6, a radio receiver 110 and an adaptive controller 120*b*. In particular, this controller apparatus is characterized in that it is provided with the adaptive controller 120*b* in place of the adaptive controller 120 of FIG. 19.

In this case, the transmitted radio signal is subjected to m-PSK modulation (m is herein an integer equal to or larger than two). The adaptive controller 120*b* is constructed of a digital calculator of, for example, a computer and calculates the reactance values of variable reactance elements 12-1 to 12-6 for directing the main beam of the ESPAR antenna apparatus 100 in the direction of the desired wave and directing nulls in the directions of the interference waves on the basis of the received signal y(t) received by the radiating element A0 of the ESPAR antenna apparatus 100 so that the value of a criterion function (e.g., Equation (73) described later) expressed by the m-th power of the received signal y(t) becomes substantially maximized by using, for example, the steepest gradient method, which is an iterative numerical solution of the nonlinear programming method, and outputs a reactance value signal that represent the values to the variable reactance elements 12-1 to 12-6, then this leads to setting the reactance values $x_k$.

In the present preferred embodiment, paying attention to the characteristic property of the m-PSK-modulated signal, a blind criterion utilizing this is proposed. The property to which attention is paid is the phenomenon that "the m-PSK-modulated signal becomes a constant complex value when raised to the m-th power regardless of the modulation data". If it suffers from noise or interference in the communication path, then a fluctuation from this constant complex value is observed on the reception side. The smaller the fluctuation, the higher the purity of the desired signal can be achieved upon extracting the desired signal. Then, there is proposed the criterion function of the following equation using the m-th order moment of the output signal of the reception antenna derived as described above:

$$J_m(y(t)) = \frac{|E[y(t)^m]|^{1/m}}{E[|y(t)^2|]^{1/2}} \rightarrow \max, \tag{73}$$

where E[•] represents the ensemble mean (mean value for a predetermined time interval) of the argument •. The denominator represents the mean power of the signal raised to the m-th power. The physical interpretation of the criterion function $J_m\{y(t)\}$ will be described later. The advantage of this criterion function is that the above-mentioned "constant complex value" is not included. That is, this value is not required to be preparatorily known on the reception side. This fact means that the function is influenced by neither the absolute gain nor the fixed amount of phase rotation of the antenna and the receiver circuit system, and this is an important advantage in using the function for the actual radio system.

The adaptive beam formation using the above-mentioned criterion function will be described next. The "adaptive beam formation" is to update the antenna variable parameters (the reactance values of the variable reactance elements 12-1 to 12-6 in the ESPAR antenna apparatus 100) so that the signal-to-interference noise power ratio SINR=S/(N+I) included in the received signal y(t) of the ESPAR antenna apparatus 100 derived by the Equation (73) is substantially maximized. By repetitively updating the reactance values on the basis of the above-mentioned criterion function, the antenna directivity becomes the optimum beam pattern that the output SINR is maximized, i.e., the beam pattern that the main beam is formed in the direction of the desired wave and nulls are formed in the directions of the interference waves.

That is, the criterion function J is constructed of only the received signal y(t) that does not include the target value C and is further expressed by using the m-th power $\{(y(t))^m\}$ of the received signal. In this case, it is a great merit that the target value can be controlled in an unknown state. By repetitively updating the reactance values on this criterion using an iterative numerical solution of the nonlinear programming of, for example, the steepest gradient method, the optimum beam is formed so that the signal-to-interference noise power ratio (SINR) of the antenna output becomes the maximum, i.e., so that the main beam of the ESPAR antenna apparatus 100 is directed in the direction of the desired wave and nulls are directed in the directions of the interference waves. It is to be noted that the adaptive control processing executed by the adaptive controller 120*b* of FIG. 32 according to the steepest gradient method is executed in a manner similar to that of the processing of FIG. 3 except for the criterion function.

As described above, according to the present preferred embodiment, the adaptive controller 120*b* calculates and sets the reactance values of the variable reactance elements 12-1 to 12-6 for directing the main beam of the ESPAR antenna apparatus 100 in the direction of the desired wave and directing nulls in the directions of the interference waves on the basis of the received signal y(t) received by the radiating element A0 of the ESPAR antenna apparatus 100 so that the value of the criterion function (the Equation (73)) expressed by the m-th power of the received signal y(t) of only the received signal y(t) becomes substantially maximized by using, for example, the steepest gradient method, which is an iterative numerical solution of the nonlinear programming method. Therefore, the directivity of the array antenna can be adaptively controlled so that the main beam is directed in the direction of the desired wave and nulls are directed in the directions of the interference waves without requirement of any reference signal. In this case, since no reference signal is needed, the construction of the same controller apparatus can be simplified. Moreover, since the criterion function J is expressed by only the received signal y(t), the calculation processing of the adaptive controller 120*b* can be executed very simply.

In the above-mentioned preferred embodiment, the six parasitic elements A1 to A6 are employed. However, with at least one parasitic element, the directivity characteristic of the array antenna apparatus can be electronically controlled. Instead of the above, it is acceptable to provide more than six parasitic elements. Moreover, the arrangement configuration of the parasitic elements A1 to A6 is not limited to that of the above-mentioned preferred embodiment, and the elements are only required to be located apart from the radiating element A0 by a predetermined distance. That is, the distance to the parasitic elements A1 to A6 is not required to be constant.

In the above-mentioned preferred embodiment, the reactance value of each variable reactance element 12 is calculated by the steepest gradient method. However, the present invention is not limited to this, and it is acceptable to use an iterative numerical solution of the nonlinear programming method such as the sequential random method, the random method and the higher dimensional dichotomy method which are described hereinabove.

In the above-mentioned preferred embodiment, the criterion function J is used as the criterion function for obtaining the reactance values for the adaptive control, and the optimum solution of the reactance vector is calculated so that the function becomes substantially maximized. However, the present invention is not limited to this, and it is acceptable to use the reciprocal of the criterion function J as the criterion function for obtaining the reactance values for the adaptive control and calculate the optimum solution of the reactance vector so that the criterion function becomes substantially minimized.

The above-mentioned preferred embodiment is provided with the six parasitic elements A1 to A6 and the variable reactance elements 12-1 to 12-6 corresponding to them. However, the present invention is not limited to this, and it is acceptable to provide at least one parasitic element A1 and a variable reactance element 12-1 corresponding to the same parasitic element A1. Moreover, the number of the elements may be plural.

Ninth Preferred Embodiment

Figure 33:
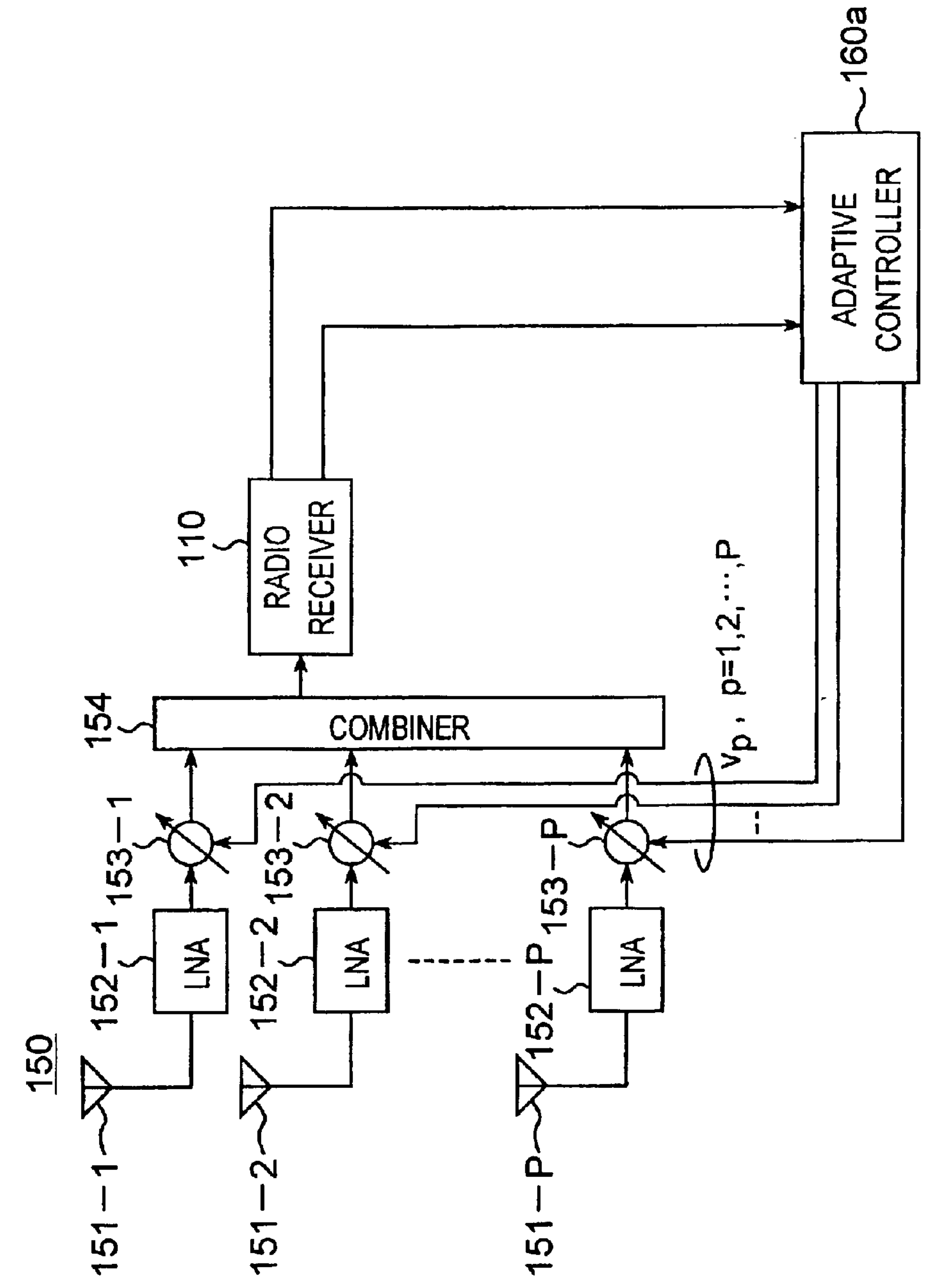
FIG. 33 is a block diagram showing a construction of a controller apparatus of an array antenna according to a ninth preferred embodiment of the present invention.

FIG. 33 is a block diagram showing a construction of a controller apparatus of an array antenna according to a ninth preferred embodiment of the present invention. The present preferred embodiment is characterized in that it is provided with an adaptive controller 160*a* in place of the adaptive controller 160 of FIG. 22.

In this case, the transmitted radio signal is subjected to m-PSK modulation (m is an integer not smaller than two), and the adaptive controller 160*a* calculates a phase shift control voltage $v_p$ (p=1, 2, . . . , P) corresponding to the quantity of phase shift of variable phase shifters 153-1 to 153-P for directing the main beam of an array antenna 150 in the direction of the desired wave and directing nulls in the directions of the interference waves on the basis of the received signal after being combined so that the value of the criterion function (the Equation (73)) expressed by the m-th power of the received signal y(t) becomes substantially maximized by using, for example, the steepest gradient method, which is an iterative numerical solution of the nonlinear programming method, and applies the voltage to the variable phase shifters 153-1 to 153-P, then this leads to setting the corresponding quantity of phase shift.

In a manner similar to that of the adaptive controller 120*b* of the eighth preferred embodiment, the adaptive controller 160*a* of the present preferred embodiment also can perform adaptive control of the directivity of the array antenna so that the main beam is directed in the direction of the desired wave and nulls are directed in the directions of the interference waves without requirement of any reference signal. In this case, since no reference signal is needed, the construction of the same controller apparatus can be simplified. Moreover, since the criterion function J is expressed by only the received signal y(t), the calculation processing of the adaptive controller 160*a* can be executed very simply.

In the above-mentioned preferred embodiment, the phase shift control voltage $v_p$ corresponding to the quantity of phase shift of each of the variable phase shifters 153-1 to 153-P is calculated by the steepest gradient method. However, the present invention is not limited to this, and it is acceptable to use an iterative numerical solution of the nonlinear programming method such as the sequential random method, the random method and the higher dimensional dichotomy method which are described hereinabove. Moreover, it is acceptable to use the reciprocal of the criterion function J.

Figure 34:
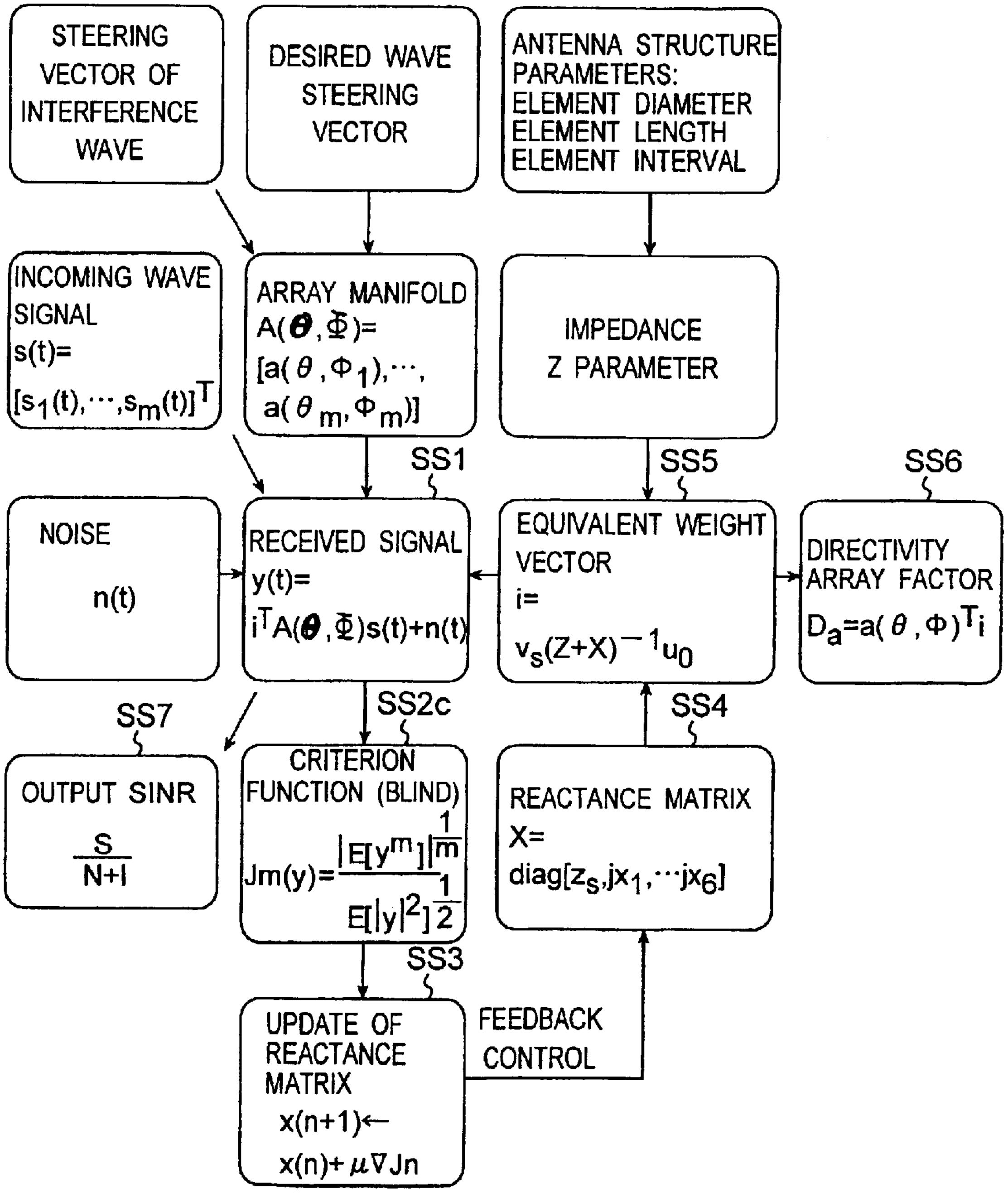
FIG. 34 is a diagram showing a simulation flow of blind adaptive beam formation executed by an ESPAR antenna apparatus 100 of FIG. 32.

FIG. 34 is a diagram showing a simulation flow of a blind adaptive beam formation executed by using the ESPAR antenna apparatus 100 of FIG. 32. In a manner similar to that of the above-mentioned formulation model, this simulation utilizes a half-wavelength dipole antenna as the radiating element A0 and utilizes six dipole antennas arranged in a circular array as the parasitic elements A1 to A6. Moreover, it is assumed that the directions in which the desired wave and the interference wave arrive at the ESPAR antenna apparatus 100 are unknown (adaptive control) and no training signal is used (blind processing).

According to the simulation flow of FIG. 34, the adaptive control of the antenna beam is performed by executing the processing of steps SS1 to SS5 (characterized in that step SS2*c* is provided in place of step SS2) on the basis of the steering vector of the interference wave, the steering vector of the desired wave, the parameters of the antenna structure, the incoming wave signal and the noise, and finally, the directivity array factor and an output SINR are calculated and outputted (in steps SS6 and SS7). The processing in these steps SS1 to SS7 receives the received signal y(t) (in step SS1), calculates the criterion function $J_m\{y(t)\}$ on the basis of the received signal y(t) (in step SS2*c*), updates the reactance matrix (in step SS3), calculates the reactance matrix (in step SS4), and thereafter, calculates an equivalent weight vector (in step SS5). Then, the directivity array factor is calculated from the equivalent weight vector (in step SS6), while the output SINR is calculated from the received signal y(t) and the noise n(t) (in step SS7).

According to this simulation, it is assumed that the directions in which the desired wave and the interference wave arrive at the ESPAR antenna apparatus 100 are unknown (adaptive control) and no training signal is used (blind processing). The simulation is performed in an environment in which the interference wave also comes at the same time in addition to the desired wave. It is assumed that the desired wave and the interference wave are QPSK-modulated signals and the noise is an additive Gaussian noise. All of these desired wave, interference wave and the noise are assumed to have no cross correlation on each other. For the sake of simplicity, the band-limiting filter, delay diffusion or widening, angular diffusion or widening, fading, Doppler effect and synchronization errors in the transmission path are all ignored. Under these conditions, the reactance values of the six variable reactance elements 12-1 to 12-6 are controlled on the basis of the above-mentioned criterion function. The antenna structure parameters used for the simulation are the controlled element count: 6, the element intervals: quarter wavelength in all, the radius of each dipole: 1/100 wavelength, and the wavelength contraction ratio in the lengthwise direction of the element: 0.926. Moreover, the internal impedance of the RF transmitter-receiver connected to the ESPAR antenna apparatus 100 is assumed to be $z_s$=50 Ω. As an optimization algorithm, there can be used the pure random search method, the steepest gradient method, the higher dimensional dichotomy method, the sequential random method, the regression step method and a method according to Hamiltonian dynamics.

As described above, according to the present preferred embodiment, there has been described the fact that the ESPAR antenna apparatus 100 can achieve blind beam formation by the appropriate criterion and feedback control in the case of m-PSK wave reception regardless of the simple hardware configuration thereof.

In the above-mentioned preferred embodiment, the criterion function of the Equation (73) is used. However, the time mean E(•) in the Equation (73) may be a mean value of a plurality of data signals for a predetermined time interval of, for example, one symbol when a data signal transmitted by, for example, the frequency-division multiplex system is received at a time and subjected to parallel processing.

Tenth Preferred Embodiment

Figure 35:
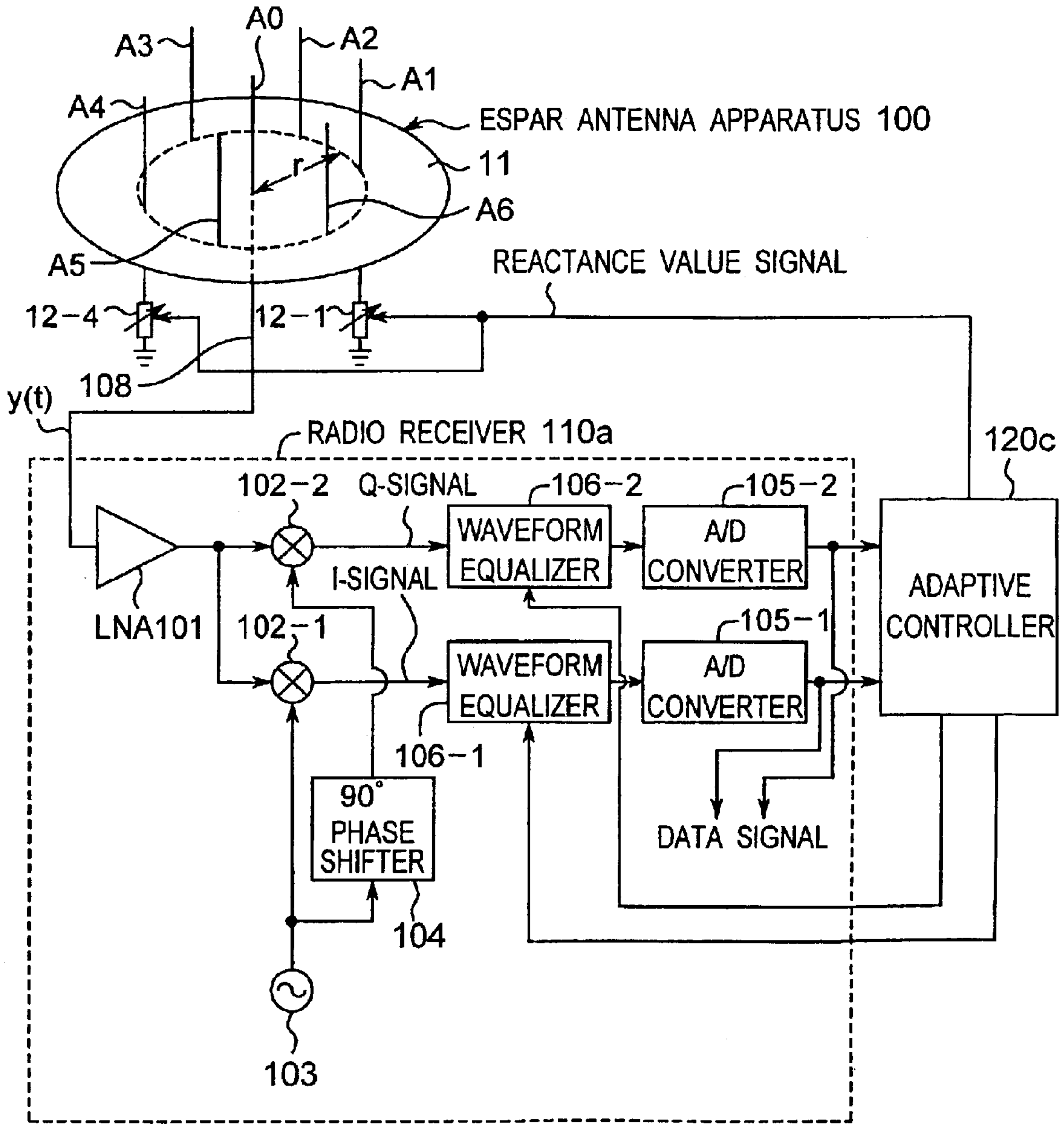
FIG. 35 is a block diagram showing a construction of a controller apparatus of an array antenna according to a tenth preferred embodiment of the present invention.

FIG. 35 is a block diagram showing a construction of a controller apparatus of an array antenna according to a tenth preferred embodiment of the present invention. The controller apparatus of the array antenna of the present preferred embodiment differs from that of the eighth preferred embodiment of FIG. 32 in the following points.

(1) In place of the radio receiver 110, there is provided a radio receiver 110*a* further provided with waveform equalizers 106-1 and 106-2 for the radio receiver 110 that receives the m-PSK signal.

(2) In place of the adaptive controller 120*b*, there is provided an adaptive controller 120*c*, which calculates the value of the above-mentioned criterion function, calculates the signal to noise power ratio of the received signal using the equation that expresses the relationship between the criterion function and the signal to noise power ratio on the basis of the calculated criterion function and adaptively controls the waveform equalizers 106-1 and 106-2 so that the calculated signal to noise ratio becomes substantially maximized in the adaptive controller 120*c*.

Before explaining FIG. 35 in detail, the definition of a functional, which is a criterion function, and a method for calculating the signal to noise power ratio will be described below.

In order to perform adaptive feedback control of a variable signal waveform equalizer, a signal filter and a linearizer for the optimum reception in the radio receiver, estimation of the signal to noise ratio becomes effective means. Particularly in the radio receiver apparatuses of FIGS. 32 and 35, which use neither a training reference signal nor a signal replica, it is required to establish a signal to noise ratio estimation technology of blind operation. From the viewpoint of a more practicable radio system, the present preferred embodiment proposes a blind estimation method, which can be applied to multi-phase PSK and operates even in a "quasi-synchronization" state in which the complete synchronization is not established. First of all, the high-order moment of the PSK signal will be described.

If the m-PSK signal is sampled in the quasi-synchronization state, then the complex variable s of the following equation is observed:

$$s=a_o e^{j(\delta\omega t+\phi_0+\psi)} \qquad (74),$$

where ψ=2πd/m; d∈{0, 1, 2, . . . , (m−1)}. Moreover, $a_0$ is an initial amplitude, $\phi_0$ is an initial phase, d is information data, and $\delta_0$ is a frequency deviation due to synchronization deviation. If the complex variable s is regarded as a probability variable, then the k-th order moment thereof is expressed by the following equation:

$$E[s^k]=E[a_o{}^k e^{jk(\delta\omega t+\phi_o+\psi)}]=a_o{}^k e^{jk\delta\phi_o}E[e^{jk\delta\omega t}]E[e^{jk\psi}] \qquad (75).$$

In this case, assuming that the second and subsequent terms of $\delta_0$ are ignored on the postulation that the quasi-synchronization, i.e., the frequency deviation is smaller than an averaging operation time T, the frequency deviation and the information data have no correlation and the information data d is uniformly distributed in a range from zero to m−1, then the following equation is obtained:

$$E[s^k]=\begin{cases}0: & \text{for } k \bmod m \neq 0 \\ a_o^k e^{jk\delta\phi_o} e^{jk\delta\omega T/2} & \text{for } k \bmod m = 0\end{cases}. \qquad (76)$$

On the other hand, the absolute value is |s|=$a_o$ regardless of the value m, and therefore, the high-order moment of the absolute value is simply expressed by the following equation:

$$E[/s/^k]=E[a_o{}^k]=a_o{}^k=\sqrt{S}^k \qquad (77),$$

where S is the mean power of the PSK signal.

The high-order moment of the Gaussian noise will be described next. The amplitude and the phase of the Gaussian noise are independent from each other, and the phase is distributed in a range from zero to 2π. Therefore, its moment is expressed by the following equation with regard to an arbitrary number of orders p:

$$E[n^p]=E[/n/e^{j\angle n})^{p]=E[/n/^p}]E[e^{jp\angle n}]=0 \qquad (78).$$

Moreover, the signal and the noise are independent of each other and the moment of the noise is zero, and therefore, the coupled moment of them is also expressed by the following equation:

$$E[s^p{}_n{}^q]=E[s^p]E[n^q]=0 \qquad (79),$$

where p, q∈{1, 2, 3, . . . }.

On the other hand, by using the recurrence formula of the following equation for the even-order moment of the absolute value of the Gaussian noise:

$$E[/n/^{2p}]=pE[/n/^2]\cdot E[/n/^{2p-2}]=pE[/n/^2]\cdot(p-1)E[/n/^2]\cdot E[/n/^{2p-4}] \qquad (80),$$ and then the following equation is obtained:

$$\therefore E[/n/^{2p}]=p!\cdot N^p \qquad (81)$$

where N is the mean power of the Gaussian noise. Further, a blind functional is defined. Paying attention to the properties of the high-order moments of the m-PSK signal and the Gaussian noise, in a system in which the received signal of the sum of them:

$$y=s+n \qquad (82),$$

is received, the functional of the following equation using the m-th order moment of the received signal y is defined:

$$J_m(y) = \frac{|E[y^m]|^{1/m}}{E[|y|^2]^{1/2}}. \quad (83)$$

This functional is defined by only the received signal y, and therefore, the signal to noise ratio can be blindly estimated without separating the signal from the noise and without using the transmitted signal replica. The physical meaning of this functional will be described below.

First of all, if the numerator of the Equation (83) is subjected to binominal expansion and the fact that the signal and the noise have no correlation is used, then the following equation is obtained:

$$|E[y^m]| = |E[(s+n)^m]| = \left| \sum_{k=0}^{m} \frac{m!}{k!(m-k)!} E[s^k]E[n^{m-k}] \right|. \quad (84)$$

If the equation of the high-order moment obtained as described hereinabove is applied to this, then the following equation is obtained:

$$|E[y^m]| = |E[s^m]| = |a_o{}^m e^{jm\delta\phi_o} e^{jm\delta\omega T/2}| = a_o{}^m = \sqrt{S}^m \quad (85).$$

Next, if the denominator of the Equation (83) is expanded, then the following equation is obtained:

$$E[|y|^2] = E[|s+n|^2] = E[|s|^2] + 2Re\{E[sn^*]\} + E[|n|^2] \quad (86),$$

where the superscript symbol * represents the complex conjugate. The first term and the third term of the Equation (86) represent the mean powers of the signal and the noise, and the second term becomes zero since it is the coupled moment of them. Therefore, the following equation is obtained:

$$E[|y|^2] = S + N \quad (87).$$

If they are substituted into the above-mentioned functional, then the following equation is obtained:

$$J_m(y) = \sqrt{\frac{S}{S+N}}. \quad (88)$$

If this is transformed, then the following equation is obtained:

$$S/N = \frac{J_m(y)^2}{1 - J_m(y)^2}. \quad (89)$$

These equations are the equations that express the relationship between the functional and the signal to noise ratio, and this becomes an equation of higher order of the signal to noise ratio by detecting the received signal level, calculating the value of the functional by using the Equation (83) and substituting the value of the functional into the Equation (88) or the Equation (89). By using the numerical solution of the equation of, for example, the Newton's method for this, the solution of the signal to noise ratio can be calculated. Furthermore, the adaptive control method of the radio receiver that utilizes the above-mentioned functional is similar to the adaptive control method of FIG. 27.

In the above-mentioned preferred embodiment, the analog waveform equalizers 106-1 and 106-2 are employed. However, the present invention is not limited to this, and it is acceptable to employ digital waveform equalizers. In this case, a digital waveform equalizer is inserted between the A/D converter 105-1 and the adaptive controller 120*c*, and a digital waveform equalizer is inserted between the A/D converter 105-2 and the adaptive controller 120*c* in place of the analog waveform equalizers 106-1 and 106-2.

In the above-mentioned preferred embodiment, the waveform equalizers 106-1 and 106-2 are employed as an object of the adaptive control based on the signal to noise ratio of the received signal. However, the present invention is not limited to this, and it is acceptable to employ signal processing means, such as a signal equalizer, a signal filter, a linearizer and a tuner of the radio receiver, which exerts influence on the signal to noise ratio of the received signal. In this case, for example, the signal filter is inserted in the position of the analog waveform equalizers 106-1 and 106-2 or the digital waveform equalizers and executes signal filtering processing in a predetermined band. Moreover, the linearizer is inserted in the position of the analog waveform equalizers 106-1 and 106-2 or the digital waveform equalizer and executes predetermined linear equalization processing. Further, the tuner is included in, for example, the control operation of the adaptive controller 120*c* and tunes the reception frequency of the radio receiver 110*a* to the signal frequency of the desired wave so that the frequencies become substantially equal to each other by controlling the local oscillation frequency of the local oscillator 3 on the basis of the calculated signal to noise ratio so that the signal to noise ratio becomes substantially maximized.

In the above-mentioned preferred embodiment, by formulating the moments of the complex Gaussian noise and the multi-phase PSK signal to the higher order and defining the functional paying attention to the signal constellation peculiar to the PSK modulation, there has been analytically described by the above-mentioned moment formula the fact that the functional becomes the estimation index of the signal to noise ratio. Further, the statistical behavior of the present functional in the system where the signal of the finite data length and the additive Gaussian noise exist in mixture has been described by the computer simulation. When the amount of data for the averaging is small, the dispersion is large particularly in the region of the low signal to noise ratio. If the amount of data is increased, then the resulting curve becomes gradually asymptotic to or approaches the monotonous increase curve derived analytically, and it is enabled to estimate and calculate the signal to noise ratio with high accuracy. The present functional, which is easy to calculate and needs no synchronous detection, and therefore, it can be used as a blind control criterion for adaptive reception systems and so on for simple consumer uses.

The above-mentioned preferred embodiment is provided with the six parasitic elements A1 to A6 and the variable reactance elements 12-1 to 12-6 corresponding to them. However, the present invention is not limited to this, and it is acceptable to provide at least one parasitic element A1 and a variable reactance element 12-1 corresponding to the same parasitic element A1. Also, the number of the elements may be plural.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for controlling an array antenna, said array antenna comprising:

a radiating element for receiving a radio signal;

at least one parasitic element provided apart from the radiating element by a predetermined distance; and a variable reactance element connected to the parasitic element, thereby changing a directivity characteristic of said array antenna by changing a reactance value of said variable reactance element for operation of said variable reactance element as either one of a director and a reflector, wherein said method includes a step of calculating and setting the reactance value of said variable reactance element for directing a main beam of said array antenna in a direction of a desired wave and directing nulls in directions of interference waves on the basis of a received signal received by said radiating element so that a value of an objective function expressed by only the received signal becomes either one of the maximum and the minimum by using an iterative numerical solution of a nonlinear programming method.

2. The method for controlling said array antenna, as claimed in claim 1, wherein the objective function is a function obtained by dividing a square value of a time mean value of an absolute value of the received signal for a predetermined time interval by a time mean value of the square value of the absolute value of the received signal.

3. A method for controlling an array antenna, said array antenna comprising:

a radiating element for receiving a transmitted radio signal as a received signal;

at least one parasitic element provided apart from the radiating element by a predetermined distance; and a variable reactance element connected to the parasitic element, thereby changing a directivity characteristic of said array antenna by changing a reactance value of said variable reactance element for operation of said variable reactance element as either one of a director and a reflector, wherein the transmitted radio signal is modulated by a modulation method including digital amplitude modulation, wherein a power ratio R is defined by a quotient obtained by dividing a larger power value of power values at two mutually different signal points of the radio signal by a smaller power value thereof, wherein the radio signal has predetermined discrete power ratios $R_1, R_2, \ldots, R_{max}$ at a plurality of signal points of the digital amplitude modulation, and wherein said method includes the following steps of:

calculating the power ratio R for the power values at respective two signal points of mutually different combinations of the received signal for a predetermined time interval on the basis of the received signal received by the radiating element;

calculating as an objective function value, a minimum value of the absolute values of the values obtained by subtracting the discrete power ratios $R_1, R_2, \ldots, R_{max}$ from respective calculated power ratios R, respectively; and calculating and setting a reactance value of said variable reactance element for directing a main beam of said array antenna in a direction of a desired wave and directing nulls in directions of interference waves so that the objective function value becomes substantially either one of the minimum and the maximum.

4. The method for controlling said array antenna, as claimed in claim 3, wherein the respective calculated power ratios R are calculated for the power values at respective two signal points of the mutually different combinations of the received signals for the predetermined time interval, and the objective function value is either one of a time mean value and an ensemble mean value of a minimum value of absolute values of the values obtained by subtracting the discrete power ratios $R_1, R_2, \ldots, R_{max}$ from respective calculated power ratios R, respectively.

5. The method for controlling said array antenna, as claimed in claim 3, wherein the digital amplitude modulation is one of multi-value QAM and ASK.

6. A method for controlling an array antenna for receiving a transmitted radio signal, said array antenna comprising a plurality of P antenna elements aligned at predetermined intervals, said array antenna shifting phases of a plurality of P received signals received by said array antenna by predetermined quantities of phase shift using respective P phase shift means, respectively, combining phase-shifted received signals, and outputting combined received signal, wherein the transmitted radio signal is modulated by a modulation method including digital amplitude modulation, wherein a power ratio R is defined by a quotient obtained by dividing a larger power value of power values at two mutually different signal points of the radio signal by a smaller power value thereof, wherein the radio signal has predetermined discrete power ratios $R_1, R_2, \ldots, R_{max}$ at a plurality of signal points of the digital amplitude modulation, and wherein said method includes the following steps of:

calculating the power ratio R for the power values at respective two signal points of mutually different combinations of the received signal for a predetermined time interval on the basis of the received signal received by the array antenna;

calculating as an objective function value, a minimum value of the absolute values of the values obtained by subtracting the discrete power ratios $R_1, R_2, \ldots, R_{max}$ from respective calculated power ratios R, respectively; and calculating and setting quantities of phase shift of said phase shift means for directing a main beam of said array antenna in a direction of a desired wave and directing nulls in directions of interference waves so that the objective function value becomes substantially either one of the minimum and the maximum.

7. The method for controlling said array antenna, as claimed in claim 6, wherein the respective calculated power ratios R are calculated for the power values at respective two signal points of the mutually different combinations of the received signals for the predetermined time interval, and the objective function value is either one of a time mean value and an ensemble mean value of a minimum value of absolute values of the values obtained by subtracting the discrete power ratios $R_1, R_2, \ldots, R_{max}$ from respective calculated power ratios R, respectively.

8. The method for controlling said array antenna, as claimed in claim 6, wherein the digital amplitude modulation is one of multi-value QAM and ASK.

9. A method for controlling an array antenna, said array antenna comprising:

a radiating element for receiving a transmitted radio signal;

at least one parasitic element provided apart from the radiating element by a predetermined distance; and a variable reactance element connected to the parasitic element, thereby changing a directivity characteristic of said array antenna by changing a reactance value of said variable reactance element for operation of said variable reactance element as either one of a director and a reflector, wherein the transmitted radio signal is modulated by an m-PSK modulation (where m is an integer equal to or larger than two); and wherein said method includes a step of calculating and setting the reactance value of said variable reactance element for directing a main beam of said array antenna in a direction of a desired wave and directing nulls in directions of interference waves on the basis of a received signal received by said radiating element so that a value of a criterion function expressed by only the received signal raised to the m-th power becomes either one of the maximum and the minimum by using an iterative numerical solution of a nonlinear programming method.

10. The method for controlling said array antenna, as claimed in claim 9, wherein the criterion function is a function obtained by dividing a square value of an absolute value of a mean value of the m-th power value of the received signal for a predetermined time interval by a mean value of the square value of the absolute value of the m-th power value of the received signal.

11. A method for controlling an array antenna comprising a plurality, of P antenna elements aligned at predetermined intervals, said array antenna shifting phases of a plurality of P received signals received by said array antenna by predetermined quantities of phase shift using respective P phase shift means, respectively, combining phase-shifted received signals, and outputting combined received signal, wherein the transmitted radio signal is modulated by an m-PSK modulation (where m is an integer equal to or larger than two); and wherein said method includes a step of calculating and setting the quantities of phase shift of said respective P phase shift means for directing a main beam of said array antenna in a direction of a desired wave and directing nulls in directions of interference waves on the basis of a received signal received by said array antenna so that a value of a criterion function expressed by only the received signal raised to the m-th power becomes either one of the maximum and the minimum by using an iterative numerical solution of a nonlinear programming method.

12. The method for controlling said array antenna, as claimed in claim 11, wherein the criterion function is a function obtained by dividing a square value of an absolute value of a mean value of the m-th power value of the received signal for a predetermined time interval by a mean value of the square value of the absolute value of the m-th power value of the received signal.

13. A method for adaptively controlling a radio receiver for receiving as a received signal, a radio signal modulated by m-PSK modulation (where m is an integer equal to or larger than two), said radio receiver comprising a signal processing means for processing the received signal, wherein said method includes the following steps of:

calculating a value of a criterion function obtained by dividing a square value of an absolute value of a mean value of the received signal raised to the m-th power value for a predetermined time interval by a mean value of the square value of the absolute value of the m-th power value of the received signal;

calculating a signal to noise ratio of the received signal by using an equation that expresses a relationship between the criterion function and the signal to noise ratio thereof on the basis of the calculated value of the criterion function; and adaptively controlling said signal processing means so that the calculated signal to noise ratio becomes substantially the maximum.

14. The method for adaptively controlling the radio receiver, as claimed in claim 13, wherein said signal processing means is a signal equalizer of the radio receiver.

15. The method for adaptively controlling the radio receiver, as claimed in claim 13, wherein said signal processing means is a signal filter of the radio receiver.

16. The method for adaptively controlling the radio receiver, as claimed in claim 13, wherein said signal processing means is a linearizer of the radio receiver.

17. The method for adaptively controlling the radio receiver, as claimed in claim 13, wherein said signal processing means is a tuner of the radio receiver.

18. A method for controlling an array antenna, said array antenna comprising:

a radiating element for receiving a transmitted radio signal as a received signal;

at least one parasitic element provided apart from the radiating element by a predetermined distance; and a variable reactance element connected to the parasitic element, thereby changing a directivity characteristic of said array antenna by changing a reactance value of said variable reactance element for operation of said variable reactance element as either one of a director and a reflector, wherein the transmitted radio signal is modulated by a m-PSK modulation (where m is an integer equal to or larger than two), wherein said method includes a step of calculating and setting a reactance value of a variable reactance element for directing a main beam of said array antenna in a direction of a desired wave and directing nulls in directions of an interference waves on the basis of a received signal received by the radiating element so that a value of a criterion function, which is a function obtained by dividing a (1/m)-th power value of an absolute value of a mean value of the received signal raised to the m-th power value for a predetermined time interval, by a (1/2)-th power value of the mean value of the absolute value of a square value of the received signal, becomes substantially the maximum, by using an iterative numerical solution of a nonlinear programming method.

19. A method for controlling an array antenna comprising a plurality of P antenna elements aligned at predetermined intervals, said array antenna shifting phases of a plurality of P received signals received by said array antenna by predetermined quantities of phase shift using respective P phase shift means, respectively, combining phase-shifted received signals, and outputting combined received signal, wherein the transmitted radio signal is modulated by an m-PSK modulation (where m is an integer equal to or larger than two); and wherein said method includes a step of calculating and setting the quantities of phase shift of the phase shift means for directing a main beam of said array antenna in a direction of a desired wave and directing nulls in directions of interference waves on the basis of the combined received signal so that a value of a criterion function, which is a function obtained by dividing a (1/m)-th power value of an absolute value of a mean value of the received signal raised to the m-th power value for a predetermined time interval by a (1/2)-th power value of the mean value of the absolute value of a square value of the received signal, becomes substantially the maximum by using an iterative numerical solution of a nonlinear programming method.

20. A method for adaptively controlling a radio receiver for receiving as a received signal, a radio signal modulated by m-PSK modulation (where m is an integer equal to or larger than two), said radio receiver comprising a signal processing means for processing the received signal, wherein said method includes the following steps of:

calculating a value of a criterion function, which is a function obtained by dividing a (1/m)-th power value of an absolute value of a mean value of the received signal raised to the m-th power value for a predetermined time interval by a (1/2)-th power value of the mean value of the absolute value of a square value of the received signal;

calculating the signal to noise ratio of the received signal by using an equation, that expresses a relationship between the criterion function and the signal to noise ratio, on the basis of the calculated value of the criterion function; and adaptively controlling said signal processing means so that the calculated signal to noise ratio becomes substantially the maximum.

21. The method for adaptively controlling the radio receiver, as claimed in claim 20, wherein said signal processing means is a signal equalizer of the radio receiver.

22. The method for adaptively controlling the radio receiver, as claimed in claim 20, wherein said signal processing means is a signal filter of the radio receiver.

23. The method for adaptively controlling the radio receiver, as claimed in claim 20, wherein said signal processing means is a linearizer of the radio receiver.

24. The method for adaptively controlling the radio receiver, as claimed in claim 20, wherein said signal processing means is a tuner of the radio receiver.

25. A radio receiver apparatus comprising:

a radio receiver for receiving a radio signal modulated by m-PSK modulation (where m is an integer equal to or greater than two); and a controller for calculating a value of a criterion function obtained by dividing a square value of an absolute value of a mean value of the received radio signal raised to the m-th power value for a predetermined time interval by a mean value of the square value of the absolute value of the m-th power value of the received radio signal, and calculating a signal to noise ratio of the received radio signal by using an equation, that expresses a relationship between the criterion function and the signal to noise ratio thereof, on the basis of the calculated value of the criterion function.

26. A radio receiver apparatus comprising:

a radio receiver for receiving a radio signal modulated by m-PSK modulation (where m is an integer equal to or larger than two); and a controller for calculating a value of a criterion function, which is a function obtained by dividing a (1/m)-th power value of an absolute value of a mean value of the received radio signal raised to the m-th power value for a predetermined time interval by a (1/2)-th power value of the mean value of the absolute value of a square value of the received radio signal, and calculating the signal to noise ratio of the received radio signal by using an equation, that expresses a relationship between the criterion function and the signal to noise ratio thereof, on the basis of the calculated value of the criterion function.

* * * * *